United States Patent
Seshimo et al.

(10) Patent No.: US 8,298,748 B2
(45) Date of Patent: Oct. 30, 2012

(54) POSITIVE RESIST COMPOSITION, METHOD OF FORMING RESIST PATTERN, AND POLYMERIC COMPOUND

(75) Inventors: Takehiro Seshimo, Kawasaki (JP);
Yoshiyuki Utsumi, Kawasaki (JP);
Yoshitaka Komuro, Kawasaki (JP);
Takeyoshi Mimura, Kawasaki (JP);
Daichi Takaki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 215 days.

(21) Appl. No.: 12/781,540

(22) Filed: May 17, 2010

(65) Prior Publication Data

US 2010/0297560 A1   Nov. 25, 2010

(30) Foreign Application Priority Data

May 20, 2009   (JP) .................................. 2009-122566

(51) Int. Cl.
*G03F 7/004* (2006.01)
*C08F 228/02* (2006.01)

(52) U.S. Cl. ..................... 430/270.1; 430/905; 430/910; 430/921; 430/922; 526/286; 526/287; 526/288

(58) Field of Classification Search ............... 430/270.1, 430/905, 910, 921, 922; 526/286, 287, 288
See application file for complete search history.

(56) References Cited

U.S. PATENT DOCUMENTS

| | | | |
|---|---|---|---|
| 5,130,392 A * | 7/1992 | Schwalm et al. ............. | 526/288 |
| 5,548,055 A | 8/1996 | Narang et al. | |
| 5,945,517 A | 8/1999 | Nitta et al. | |
| 5,998,559 A | 12/1999 | Narang et al. | |
| 6,153,733 A | 11/2000 | Yukawa et al. | |
| 6,624,328 B1 | 9/2003 | Guerra et al. | |
| 7,074,543 B2 | 7/2006 | Iwai et al. | |
| 7,396,960 B2 | 7/2008 | Iwabuchi et al. | |
| 7,514,204 B2 * | 4/2009 | Hatakeyama et al. ..... | 430/270.1 |
| 7,858,287 B2 * | 12/2010 | Watanabe et al. .......... | 430/270.1 |

(Continued)

FOREIGN PATENT DOCUMENTS

JP   H09-208554   8/1997

(Continued)

OTHER PUBLICATIONS

Kozawa, Takahiro et al., "Analysis of acid yield generated in chemically amplified electron beam resist," J. Vac. Sci Technology. B, vol. 24, No. 6, pp. 3055 to 3060 (2006).

(Continued)

Primary Examiner — John Chu

(74) Attorney, Agent, or Firm — Knobbe Martens Olson & Bear LLP

(57) ABSTRACT

A positive resist composition including a base component (A') which exhibits increased solubility in an alkali developing solution under action of acid and generates acid upon exposure, the base component (A') including a polymeric compound (A1') having a structural unit (a5-1) represented by general formula (a5-1), a structural unit (a0-1) represented by general formula (a0-1) and a structural unit (a0-2) that generates acid upon exposure, the structural unit (a0-2) containing a group represented by general formula (a0-2') (wherein $X^-$ represents an anion moiety represented by one of general formulas (1) to (5)).

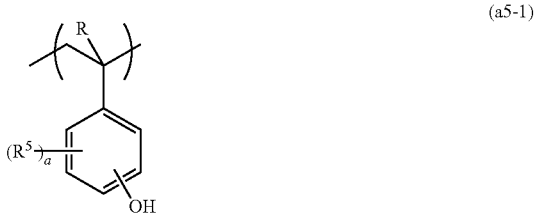

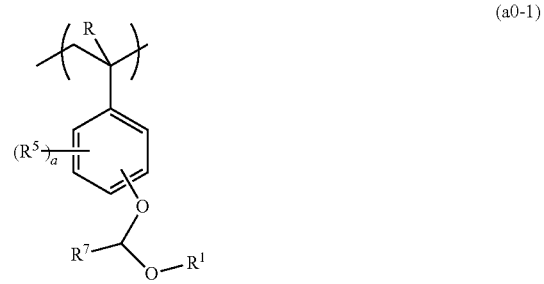

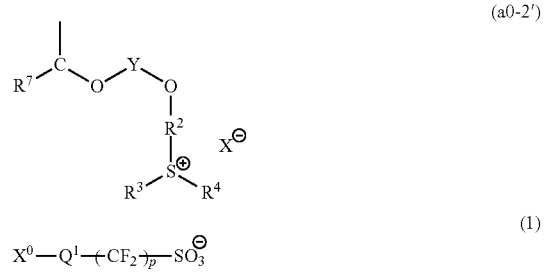

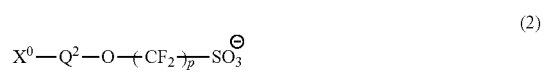

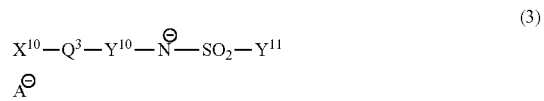

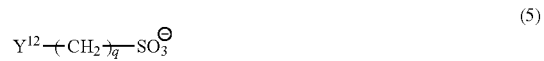

6 Claims, No Drawings

U.S. PATENT DOCUMENTS

2004/0033437 A1* 2/2004 Uenishi ............ 430/270.1
2011/0159433 A1* 6/2011 Takahashi et al. ......... 430/286.1

FOREIGN PATENT DOCUMENTS

| JP | H11-035551 | 2/1999 |
| JP | H11-035552 | 2/1999 |
| JP | H11-035573 | 2/1999 |
| JP | T-11-502543 | 3/1999 |
| JP | H11-322707 | 11/1999 |
| JP | 2003-241385 | 8/2003 |
| JP | A-2006-348382 | 12/2006 |
| JP | A-2007-277219 | 10/2007 |
| JP | A-2008-007743 | 1/2008 |
| WO | WO 2004-074242 | 9/2004 |

OTHER PUBLICATIONS

Koh, Chawon et al., "Assessment of EUV resist readiness for 32nm manufacturing, and extendibility study of EUV ADT using state-of-the-art resist," Proceedings of SPIE, vol. 7271, pp. 727124-1 to 727124-11 (2009).

* cited by examiner

US 8,298,748 B2

POSITIVE RESIST COMPOSITION, METHOD OF FORMING RESIST PATTERN, AND POLYMERIC COMPOUND

TECHNICAL FIELD

The present invention relates to a novel polymeric compound which can be used as a base component for a positive resist composition, a positive resist composition containing the polymeric compound, and a method of forming a resist pattern using the positive resist composition.

Priority is claimed on Japanese Patent Application No. 2009-122566, filed May 20, 2009, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the held of pattern miniaturization.

Typically, these miniaturization techniques involve shortening the wavelength (increasing the energy) of the exposure light source. Conventionally, ultraviolet radiation typified by g-line and radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB) and extreme ultraviolet radiation (EUV).

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified resist is used, which includes a base material component that exhibits a changed solubility in an alkali developing solution under the action of acid and an acid generator that generates acid upon exposure.

For example, a chemically amplified positive resist contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid generator, and the action of this acid causes an increase in the solubility of the resin component in an alkali developing solution, making the exposed portions soluble in the alkali developing solution.

Until recently, polyhydroxystyrene (PHS) or derivative resins thereof in which the hydroxyl groups are protected with acid-dissociable, dissolution-inhibiting groups (PHS-based resins), which exhibit high transparency to a Kg excimer laser (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm. As a result, resins that contain structural units derived from (meth)acrylate esters within the main chain (acrylic resins) are now widely used as base resins for resists that use ArF excimer laser lithography, as they exhibit excellent transparency in the vicinity of 193 nm (see for example, Patent Document 1).

Furthermore, in recent years, base resins that include a structural unit containing an acid dissociable portion so as to function as an acid generator have also been used (see for example, Patent Documents 2 and 3).

Here, the term "(rneth)acrylate ester" is a generic term that includes either or both of the acrylate ester having a hydrogen atom bonded to the $\alpha$-position and the methacrylate ester having a methyl group bonded to the $\alpha$-position. The term "(meth)acrylate" is a generic term that includes either or both of the acrylate having a hydrogen atom bonded to the $\alpha$-position and the methacrylate having a methyl group bonded to the $\alpha$-position. The term "(meth)acrylic acid" is a generic term that includes either or both of acrylic acid having a hydrogen atom bonded to the $\alpha$-position and methacrylic acid having a methyl group bonded to the $\alpha$-position.

DOCUMENTS OF RELATED ART

Patent Document

[Patent Document 1] Japanese Unexamined Patent Application, First Publication No. 2003-241385
[Patent Document 2] Japanese Unexamined Patent Application, First Publication No. 2007-277219
[Patent Document 3] Japanese Unexamined Patent Application, First Publication No. 2008-007743

Non-Patent Documents

[Non-Patent Document 1] J. Vac. Sci. Technol. B24 (2006) 3055
[Non-Patent Document 2] Proc. of SPIE Vol. 7,271 727124-1(2009)

SUMMARY OF THE INVENTION

As further progress is made in lithography techniques and miniaturization of resist patterns, further improvement in the resolution of resist materials has been demanded while maintaining excellent lithography properties.

In EB or EUV lithography, the reaction mechanism is different from that of an ordinary photolithography (Non-Patent Document 1). EB or EUV lithography is aiming the formation of a fine pattern having a size of several tens of nanometers.

Further, in EB or EUV lithography, a resist composition that exhibit a high sensitivity to the exposure source is required. However, in these lithography techniques, there is a problem in that, when deprotection of the protection groups in the resin proceeds and decomposition of the acid generator in the resist composition occurs, outgas is generated which contaminates the exposure apparatus. Therefore, a solution for the problem has been demanded.

Further, as miniaturization of resist patterns progress, the thickness of the resist film formed is also miniaturized. For example, in an BUY application, a film thickness of no more than 60 nm has been considered (see Non-Patent Document 2). In this situation, it is important to suppress thickness loss of the resist film following exposure and development of the resist film. For example, in the case of a positive type, the unexposed portions are not removed by developing, so that the unexposed portions remain. As a result of thickness loss, uneven portions are generated on the upper surface of the resist pattern, and inferior effects are likely to be caused on the resolution and the pattern shape. In addition, a satisfactory height of the resist pattern cannot be obtained, and it becomes highly possible that the resist pattern does not function as an etching mask in the formation of a semiconductor device.

The present invention takes the above circumstances into consideration, with an object of providing a novel polymeric compound which is useful as a base component for a positive resist composition, a positive resist composition containing the polymeric compound, and a method of forming a resist pattern using the positive resist composition.

For solving the above-mentioned problems, the present invention employs the following aspects.

Specifically, a first aspect of the present invention is a positive resist composition including a base component (A') which exhibits increased solubility in an alkali developing solution under action of acid and generates acid upon exposure, the base component (A') including a polymeric compound (A1') having a structural unit (a5-1) represented by general formula (a5-1) shown below, a structural unit (a0-1) represented by general formula (a0-1) shown below and a structural unit (a0-2) that generates acid upon exposure, the structural unit (a0-2) containing a group represented by general formula (a0-2') shown below.

[Chemical Formula 1]

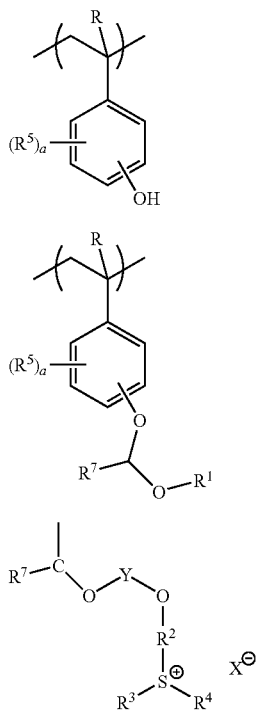

In the formulas, each R independently represents a hydrogen atom, an alkyl group of 1 to 5 carbon atoms or a halogenated alkyl group of 1 to 5 carbon atoms; $R^1$ represents a hydrocarbon group of at least 10 carbon atoms; $R^2$ represents an arylene group which may have a substituent; each of $R^3$ and $R^4$ independently represents an organic group, wherein $R^3$ and $R^4$ may be mutually bonded to form a ring with the sulfur atom; $R^5$ represents a substituent; a represents an integer of 0 to 4; each $R^7$ independently represents a hydrogen atom or an alkyl group of 1 to 5 carbon atoms; Y represents a divalent linking group; and $X^-$ represents an anion moiety represented by any one of general formulas (1) to (5) shown below.

[Chemical Formula 2]

 (1)

 (2)

 (3)

 (4)

 (5)

In the formulas, each $X^0$ independently represents a hydrocarbon group of 3 to 30 carbon atoms which may have a substituent; $Q^1$ represents a divalent linking group containing a carbonyl group; each p independently represents an integer of 1 to 3; $Q^2$ represents a single bond or an alkylene group; $X^{10}$ represents a hydrocarbon group of 1 to 30 carbon atoms which may have a substituent; $Q^3$ represents a single bond or a divalent linking group; $Y^{10}$ represents —C(=O)— or —SO$_2$—; $Y^{11}$ represents an alkyl group of 1 to 10 carbon atoms which may have a substituent or a fluorinated alkyl group of 1 to 10 carbon atoms which may have a substituent; $A^-$ represents a carboanion; $Y^{12}$ represents a cyclic alkyl group of 4 to 20 carbon atoms which may have an oxygen atom (=O) as a substituent; and q represents 0 or 1.

A second aspect of the present invention is a method of forming a resist pattern, including applying a positive resist composition according to the first aspect on a substrate to form a resist film, subjecting the resist film to exposure, and subjecting the resist film to alkali developing to form a resist pattern.

A third aspect of the present invention is a polymeric compound including a structural unit (a5-1) represented by general formula (a5-1) shown below, a structural unit (a0-1) represented by general formula (a0-1) shown below and a structural unit (a0-2) that generates acid upon exposure, the structural unit (a0-2) containing a group represented by general formula (a0-2') shown below.

[Chemical Formula 3]

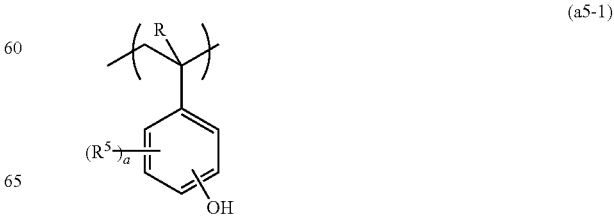 (a5-1)

-continued

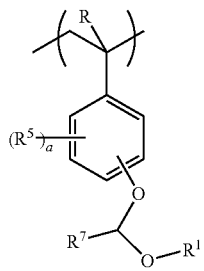
(a0-1)

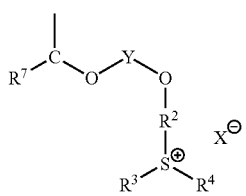
(a0-2')

In the formulas, each R independently represents a hydrogen atom, an alkyl group of 1 to 5 carbon atoms or a halogenated alkyl group of 1 to 5 carbon atoms; $R^1$ represents a hydrocarbon group of at least 10 carbon atoms; $R^2$ represents an arylene group which may have a substituent; each of $R^3$ and $R^4$ independently represents an organic group, wherein. $R^3$ and $R^4$ may be mutually bonded to form a ring with the sulfur atom; $R^5$ represents a substituent; a represents an integer of 0 to 4; each $R^7$ independently represents a hydrogen atom or an alkyl group of 1 to 5 carbon atoms; Y represents a divalent linking group; and represents an anion moiety represented by any one of general formulas (1) to (5) shown below.

[Chemical Formula 4]

$$X^0\text{-}Q^1\text{-}(CF_2)_p\text{-}SO_3^\ominus \quad (1)$$

$$X^0\text{-}Q^2\text{-}O\text{-}(CF_2)_p\text{-}SO_3^\ominus \quad (2)$$

$$X^{10}\text{-}Q^3\text{-}Y^{10}\text{---}N^\ominus\text{---}SO_2\text{---}Y^{11} \quad (3)$$

$$A^\ominus \quad (4)$$

$$Y^{12}\text{-}(CH_2)_q\text{-}SO_3^\ominus \quad (5)$$

In the formulas, each $X^0$ independently represents a hydrocarbon group of 3 to 30 carbon atoms which may have a substituent; $Q^1$ represents a divalent linking group containing a carbonyl group; each p independently represents an integer of 1 to 3; $Q^2$ represents a single bond or an alkylene group; $X^{10}$ represents a hydrocarbon group of 1 to 30 carbon atoms which may have a substituent; $Q^3$ represents a single bond or a divalent linking group; $Y^{10}$ represents —C(=O)— or —SO$_2$—; $Y^{11}$ represents an alkyl group of 1 to 10 carbon atoms which may have a substituent or a fluorinated alkyl group of 1 to 10 carbon atoms which may have a substituent; $A^-$ represents a carboanion; $Y^{12}$ represents a cyclic alkyl group of 4 to 20 carbon atoms which may have an oxygen atom (=O) as a substituent; and q represents 0 or 1.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

The term "exposure" is used as a general concept that includes irradiation with any form of radiation.

According to the present invention, there are provided a novel polymeric compound which is useful as a base component for a positive resist composition, a positive resist composition containing the polymeric compound, and a method of forming a resist pattern using the positive resist composition.

DETAILED DESCRIPTION OP THE INVENTION

<<Positive Resist Composition>>

The positive resist composition of the present invention (hereafter, frequently referred to simply as "resist composition") includes a base component (A') (hereafter, referred to as "component (A')") which exhibits increased solubility in an alkali developing solution under action of acid and generates acid upon exposure.

In the positive resist composition, when radial rays are irradiated (when exposure is conducted), acid is generated from the component (A'), and the solubility of the component (A') in an alkali developing solution is increased by the action of the generated acid. Therefore, in the formation of a resist pattern, by conducting selective exposure of a resist film formed by using the positive resist composition of the present invention, the solubility of the exposed portions in an alkali developing solution is increased, whereas the solubility of the unexposed portions in an alkali developing solution is unchanged, and hence, a resist pattern can be formed by alkali developing.

Here, the term "base component" refers to an organic compound capable of forming a film. As the base component, an organic compound having a molecular weight of 500 or more can be preferably used. When the organic compound has a molecular weight of 500 or more, the film-forming ability is improved, and a resist pattern of nano level can be easily formed.

The "organic compound having a molecular weight of 500 or more" which can be used as a base component is broadly classified into non-polymers and polymers.

In general, as a non-polymer, any of those which have a molecular weight in the range of 500 to less than 4,000 is used Hereafter, a non-polymer having a molecular weight in the range of 500 to less than 4,000 is referred to as a low molecular weight compound.

As a polymer, any of those which have a molecular weight of 1,000 or more is generally used. Hereafter, a polymer having a molecular weight of 1,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

<Component (A')>
[Component (A1')]

The polymeric compound (A1') (hereafter, referred to as "component (A1')") includes a structural unit (a5-1) represented by the aforementioned general formula (a5-1), a structural unit (a0-1) represented by the aforementioned general formula (a0-1) and a structural unit (a0-2) that generates acid upon exposure.

The component (A1') may include a structural unit (a1) derived from an acrylate ester containing an acid dissociable, dissolution inhibiting group, as well as the aforementioned structural units (a5-1), (a0-1) and (a0-2).

The component (A1') may further include a structural unit (a2) derived from an acrylate ester containing a lactone-containing cyclic group.

The component (A1') may further include a structural unit (a3) derived from an acrylate ester containing a polar group-containing aliphatic hydrocarbon group.

(Structural Unit (a5-1))

The structural unit (a5-1) is a structural unit represented by the aforementioned general formula (a5-1).

In general formula (a5-1), R represents a hydrogen atom, an alkyl group of 1 to 5 carbon atoms or a halogenated alkyl group of 1 to 5 carbon atoms.

As the alkyl group of 1 to 5 carbon atoms represented by R, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (a5-1), a represents an integer of 0 to 4, preferably 0 or 1, and most preferably 0 from an industrial viewpoint.

Further, a in general formula (a5-1) may be the same or different from a in general formula (a0-1) described later or a in general formula (a0-2') described later.

In general formula (a5-1), examples of the substituent represented by $R^5$ include a halogen atom, an alkyl group of 1 to 5 carbon atoms and a halogenated alkyl group of 1 to 5 carbon atoms.

Examples of the halogen atom for $R^5$ include a fluorine atom, a chlorine atom, a bromine atom and an iodine atom, and a fluorine atom is preferable.

Examples of the alkyl group of 1 to 5 carbon atoms represented by $R^5$ include the same alkyl group of 1 to 5 carbon atoms as those described above for R.

Examples of the halogenated alkyl group of 1 to 5 carbon atoms represented by $R^5$ include the same halogenated alkyl group of 1 to 5 carbon atoms as those described above for R, and a fluorinated alkyl group is particularly desirable.

When a represents 1, the substitution position of $R^5$ may be any of o-position, m-position or p-position.

When a represents 2, a desired combination of substitution positions can be used, and the plurality of $R^5$ may be the same or different from each other.

Further, $R^5$ in general formula (a5-1) may be the same or different from $R^5$ in general formula (a0-1) described later or $R^5$ in general formula (a0-2') described later.

As the structural unit (a5-1), one type of structural unit may be used alone, or two or more types of structural units may be used in combination.

In the component (A1') the amount of the structural unit (a5-1) based on the combined total of all structural units constituting the component (A1') is preferably 30 to 90 mol %, more preferably 50 to 90 mol %, and still more preferably 60 to 85 mol %.

By ensuring the above-mentioned range, an excellent contrast can be obtained, and lithography properties are improved.

(Structural Unit (a0-1))

The structural unit (a0-1) is a structural unit represented by the aforementioned general formula (a0-1).

In general formula (a0-1), R is the same as defined for R in general formula (a5-1).

In general formula (4-1), a and $R^5$ are respectively the same as defined for a and $R^5$ in general formula (a5-1), and may be the same or different from a and $R^5$ in the aforementioned general formula (a5-1) or a and $R^5$ in general formula (a0-2') described later.

In general formula (a0-1), $R^7$ represents a hydrogen atom or an alkyl group of 1 to 5 carbon atoms. Examples of the alkyl group of 1 to 5 carbon atoms represented by $R^7$ include the same alkyl group of 1 to 5 carbon atoms as those described above for Ritz general formula (a5-1), and a hydrogen atom or a methyl group is preferable.

Further, $R^7$ may be the same or different from $R^7$ in general formula (a0-2') described later.

In general formula (a0-1), $R^1$ represents a hydrocarbon group of at least 10 carbon atoms which may have a substituent.

A hydrocarbon "has a substituent" means that part or all of the hydrogen atoms within the hydrocarbon group is substituted with groups or atoms other than hydrogen.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

Specific examples of the aliphatic hydrocarbon group include a linear or branched aliphatic hydrocarbon group, an aliphatic hydrocarbon group containing a ring in the structure thereof, and a combination thereof.

The linear or branched aliphatic hydrocarbon group preferably has 10 to 20 carbon atoms, and more preferably 10 to 15 carbon atoms.

As the linear aliphatic hydrocarbon group, a linear alkyl group is preferable. Specific examples thereof include a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched aliphatic hydrocarbon group preferably has 10 to 20 carbon atoms, and more preferably 10 to 15 carbon atoms.

As the branched aliphatic hydrocarbon group, a branched alkyl group is preferable. Specific examples thereof include an isodecyl group and an isoundecyl group.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, a cyclic aliphatic hydrocarbon group (a group in which one hydrogen atom has been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 10 to 20 carbon atoms, and more preferably 10 to 15 carbon atoms.

The cyclic aliphatic hydrocarbon group may be either a polycyclic group or a monocyclic group.

Examples of the monocyclic group include cyclodecane and cyclododecane.

As the polycyclic group, a group in which one hydrogen atom has been removed from a polycycloalkane of 10 to 20 carbon atoms is preferable. Specific examples of the polycycloalkane include adamantane, diadamantane, dicyclohexane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the aromatic hydrocarbon group include an aryl group in which one hydrogen atom has been removed from an aromatic hydrocarbon ring, such as a biphenyl group, a fluorenyl group, a naphthyl group, an anthryl group or a phenanthryl group;

an aromatic hydrocarbon group in which part of the carbon atoms constituting the ring of the aforementioned monovalent aromatic hydrocarbon group has been substituted with a hetero atom such as an oxygen atom, a sulfur atom or a nitrogen atom; and an arylalkyl group, such as a benzyl group, a phenethyl group, a 1-naphthylmethyl group, a 2-naphthylmethyl group, a 1-naphthylethyl group or a 2-naphthylethyl group.

The alkyl chain within the arylalkyl group preferably has 1 to 4 carbon atom, more preferably 1 or 2, and most preferably 1.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In the present invention, as $R^1$, an aliphatic hydrocarbon group is preferable, and an aliphatic polycyclic group is more preferable in terms of improvement in etching resistance, suppression of thickness loss of a resist pattern, shape of the resist pattern and suppression of outgas.

Specific examples of the structural unit (a0-1) are shown below.

[Chemical Formula 5]

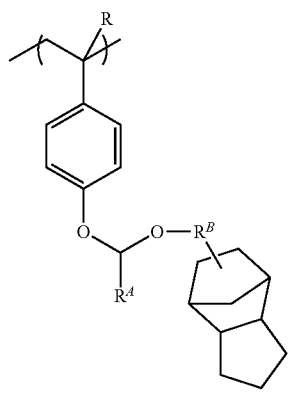

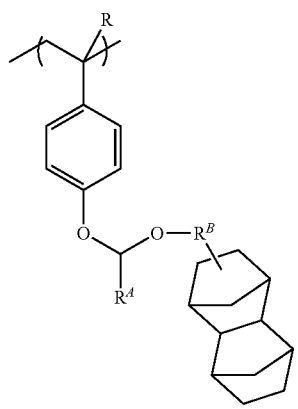

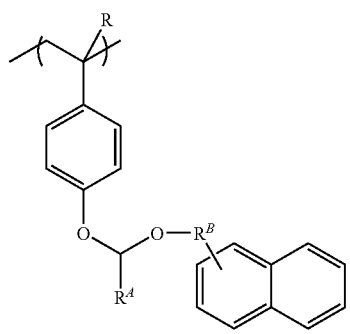

-continued

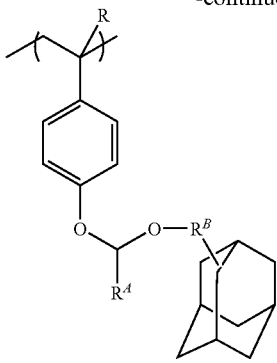

R represents a hydrogen atom, a methyl group or a trifluoromethyl group, $R^A$ represents a hydrogen atom or a methyl group, and $R^b$ represents a single bond or an alkylene group of 1 to 3 carbon atoms.

As the structural unit (a0-1), one type of structural unit may be used alone, or two or more types of structural units may be used in combination.

In the component (A1'), the amount of the structural unit (a0-1) based on the combined total of all structural units constituting the component (A1') is preferably 1 to 40 mmol %, more preferably 5 to 35 mol %, and still more preferably 5 to 30 mmol %. By ensuring the above-mentioned range, the lithography properties are improved. Further, solubility in an organic solvent can be increased.

(Structural Unit (a0-2))

The structural unit (a0-2) is a structural unit that generates acid upon exposure and contains a group represented by general formula (a0-2'). The main chain of the structural unit (a0-2) is not particularly limited. By including the structural unit (a0-2), outgas can be suppressed. Further, the acid generator can be uniformly distributed within the resist film, which results in the improvement of the lithography properties. In addition, lowering of Tg can be suppressed. As the main chain of the monomer for deriving the structural unit (a0-2), any one which can be polymerized with the monomers for deriving the structural units (a5-1) and (a0-1) can be used, e.g., a main chain having a (meth)acryloyl group or a vinyl group.

Firstly, the cation moiety excluding the anion moiety in general formula (a0-2'), i.e., the portion excluding X⁻ will be described.

<<Cation Moiety>>

In general formula (a0-2'), $R^7$ is the same as defined for $R^7$ in general formula (a0-1), and is preferably a hydrogen atom or a methyl group.

Further, $R^7$ may be the same or different from $R^7$ in general formula (a0-1).

In general formula (a0-2'), Y represents a divalent linking group.

Preferable examples of Y include a divalent hydrocarbon group which may have a substituent, and a divalent linking group containing a hetero atom.

A hydrocarbon "has a substituent" means that part or all of the hydrogen atoms within the hydrocarbon group is substituted with groups or atoms other than hydrogen.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group confining a ring in the structure thereof can be given.

The linear, or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—CH₂—], an ethylene group [—(CH₂)₂—], a trimethylene group [—(CH₂)₃—], a tetramethylene group [—(CH₂)₄—] and a pentamethylene group [—(CH₂)₅—].

As the branched aliphatic hydrocarbon group, branched alkylene groups are preferable, and specific examples include various alkylalkylene groups, including alkylmethylene groups such as —CH(CH₃)—, —CH(CH₂CH₃)—, —C(CH₃)₂—, —C(CH₃)(CH₂CH₃)—, —C(CH₃)(CH₂CH₂CH₃)—, and —C(CH₂CH₃)₂—; alkylethylene groups such as —CH(CH₃)CH₂—, —CH(CH₃)CH(CH₃)—, —C(CH₃)₂CH₂—, —CH(CH₂CH₃)CH₂—, and —C(CH₂CH₃)₂—CH₂—; alkyltrimethylene groups such as —CH(CH₃)CH₂CH₂—, and —CH₂CH(CH₃)CH₂—; and alkyltetramethylene groups such as —CH(CH₃)CH₂CH₂CH₂—, and —CH₂CH(CH₃)CH₂CH₂—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

With respect to a "divalent linking group containing a hetero atom", a hetero atom is an atom other than carbon and hydrogen, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate bond (—O—C(=O)—O—), —NH—, —NH—, —NR$^{04}$— (R$^{04}$ represents an alkyl group), —NH—C(=O)—, and =N—. Further, a combination of any one of these "divalent linking groups containing a hetero atom" with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

Y may or may not have an acid dissociable portion in the structure thereof. An "acid dissociable portion" refers to a portion within the organic group which is dissociated from the organic group by the action of acid generated upon exposure. When the R$^2$ group has an acid dissociable portion, it preferably has an acid dissociable portion having a tertiary carbon atom.

In the present invention, as the divalent linking group for Y, an alkylene group, a divalent aliphatic cyclic group or a divalent linking group containing a hetero atom is preferable. Among these, an alkylene group is particularly desirable.

When Y represents an alkylene group, it preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When Y represents a divalent aliphatic cyclic group, as the aliphatic cyclic group, the same aliphatic cyclic groups as those described above for the "aliphatic hydrocarbon group containing a ring in the structure thereof" can be used.

As the aliphatic cyclic group, a group in which two or more hydrogen atoms have been removed from cyclopentane, cyclohexane, norbornane, isobornane, adamantane, tricyclodecane or tetracyclododecane is particularly desirable.

When Y represents a divalent linking group containing a hetero atom, preferable examples of the divalent linking group containing a hetero atom include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, a group represented by the formula: -A-O—B— and a group represented by the formula -[A-C(=O)—O]$_m$—B—. Herein, each of A and B independently represents a divalent hydrocarbon group which may have a substituent, and m represents an integer of 0 to 3.

When Y represents —NH—, H may be substituted with a substituent such as an alkyl group, an acyl group or the like.

The substituent (an alkyl group, an acyl group or the like) preferably has 1 to 10 carbon atoms, more preferably 1 to 8, and most preferably 1 to 5.

In the group represented by the formula -A-O—B— or -[A-C(=O)—O]$_m$—B—, each of A and B independently represents a divalent hydrocarbon group which may have a substituent.

Examples of divalent hydrocarbon groups for A and B which may have a substituent include the same groups as those described above for the "divalent hydrocarbon group which may have a substituent" usable as R$^2$.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(=O)—O]$_m$—B—, m represents an integer of 0 to 3, preferably an integer of 0 to 2, more preferably 0 or 1, and most preferably 1.

In general formula (a0-2'), R$^2$ represents an arylene group which may have a substituent.

The arylene group for R$^2$ is not particularly limited. For example, an arylene group having 6 to 20 carbon atoms in which part or all of the hydrogen atoms of the aryl group may or may not be substituted can be used. For example, the aryl group may or may not be substituted with an alkyl group, an alkoxy group, a halogen atom, a hydroxy group or the like.

The arylene group is preferably an arylene group of 6 to 10 carbon atoms because it can be synthesized at a low cost. Specific examples thereof include a phenylene group and a naphthylene group. Of these, a phenylene group is particularly desirable.

The alkyl group, with which hydrogen atoms of the arylene group may be substituted, is preferably an alkyl group having 1 to 5 carbon atoms, more preferably a methyl group, an ethyl group, a propyl group, an n-butyl group, or a tert-butyl group, and most preferably a methyl group.

The alkoxy group, with which hydrogen atoms of the arylene group may be substituted, is preferably an alkoxy group having 1 to 5 carbon atoms, more preferably a methoxy group, an ethoxy group, an n-propoxy group, an iso-propoxy group, an n-butoxy group or a tert-butoxy group.

The halogen atom, with which hydrogen atoms of the arylene group may be substituted, is preferably a fluorine atom.

In general formula (a0-2'), each of R$^3$ and R$^4$ independently represents an organic group.

The organic group for R$^3$ and R$^4$ refers to a group containing a carbon atom, and may include atoms other than carbon (e.g., a hydrogen atom, an oxygen atom, a nitrogen atom, a sulfur atom, a halogen atom (such as a fluorine atom and a chlorine atom) and the like).

The organic group for R$^3$ and R$^4$ is preferably an aryl group or an alkyl group.

The aryl group for R$^3$ and R$^4$ is not particularly limited. For example, an aryl group having 6 to 20 carbon atoms in which part or all of the hydrogen atoms of the aryl group may or may not be substituted can be used. For example, the aryl group may or may not be substituted with an alkyl group, an alkoxy group, a halogen atom, a hydroxy group or the like.

The aryl group is preferably an aryl group having 6 to 10 carbon atoms because it can be synthesized at a low cost. Specific examples thereof include a phenyl group and a naphthyl group. Of these, a phenyl group is particularly desirable.

As examples of the alkyl group, alkoxy group and halogen atom with which the hydrogen atoms of the aryl group may be substituted, the same alkyl group, alkoxy group and halogen atom as those with which the arylene group for $R^2$ may be substituted can be given.

The alkyl group for $R^3$ and $R^4$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group and a decyl group. Among these, a methyl group is preferable because it is excellent in resolution and can be synthesized at a low cost.

In general formula (a0-2'), $R^3$ and $R^4$ may be mutually bonded to form a ring with the sulfur atom.

In such a case, the ring including the sulfur atom is preferably a 3- to 10-membered ring, and more preferably a 5- to 7-membered ring.

The ring structure formed with the sulfur atom may include a hetero atom such as a sulfur atom or an oxygen atom (—O—, =O).

Specific examples of the ring formed include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizidine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring and a phenazine ring.

In the present invention, with respect to the structural unit (a0-2), examples of the cation moiety of the group represented by general formula (a0-2') include groups represented by the formulas shown below.

[Chemical Formula 6]

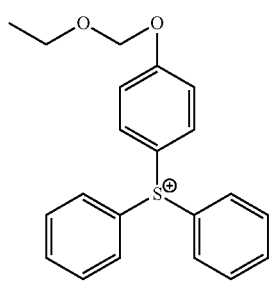

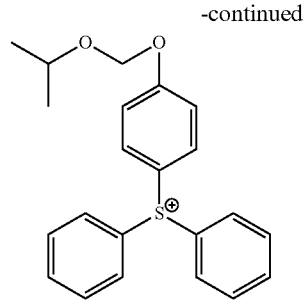

-continued

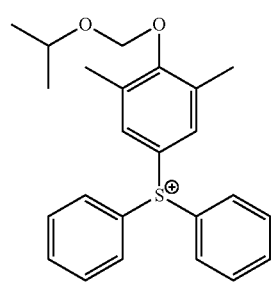

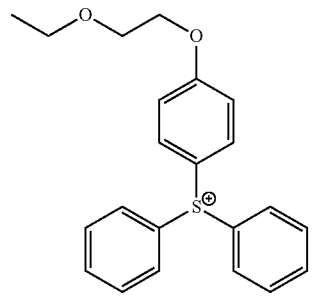

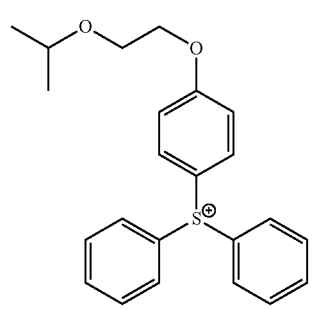

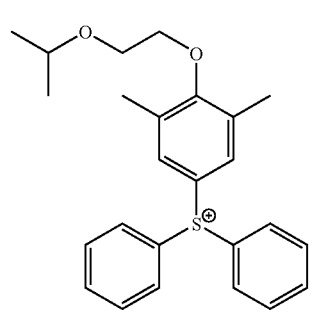

-continued

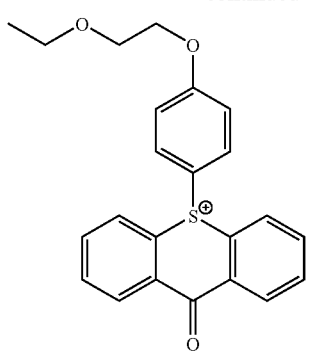

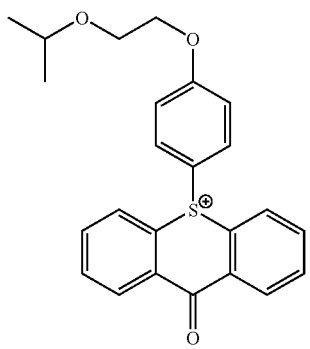

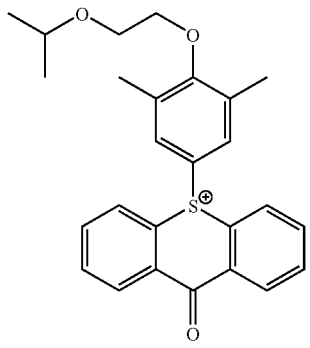

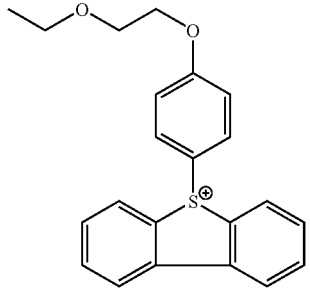

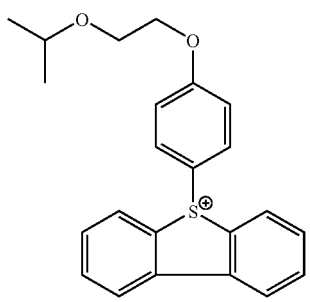

-continued

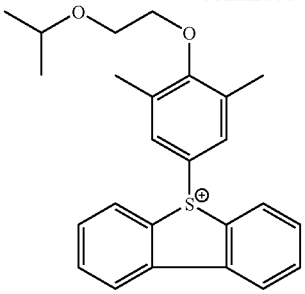

Next, the anion moiety $X^-$ in general formula (a0-2') will be described below.

In general formula (a0-2'), $X^-$ is an anion moiety represented by any one of general formulas (1) to (5) shown below. By virtue of having an anion moiety represented by any one of general formulas (1) to (5), a minute resist pattern can be formed.

The anion moieties represented by general formulas (1) to (5) will be described in this order.

[Chemical Formula 7]

$$X^0-Q^1-(CF_2)_p-SO_3^\ominus \quad (1)$$

$$X^0-Q^2-O-(CF_2)_p-SO_3^\ominus \quad (2)$$

$$X^{10}-Q^3-Y^{10}-N^\ominus-SO_2-Y^{11} \quad (3)$$

$$A^\ominus \quad (4)$$

$$Y^{12}-(CH_2)_q-SO_3^\ominus \quad (5)$$

In the formulas, each $X^0$ independently represents a hydrocarbon group of 3 to 30 carbon atoms which may have a substituent; $Q^1$ represents a divalent linking group containing a carbonyl group; each p independently represents an integer of 1 to 3; $Q^2$ represents a single bond or an alkylene group; $X^{10}$ represents a hydrocarbon group of 1 to 30 carbon atoms which may have a substituent; $Q^3$ represents a single bond or a divalent linking group; $Y^{10}$ represents —C(=O)— or —SO$_2$—; $Y^{11}$ represents an alkyl group of 1 to 10 carbon atoms which may have a substituent or a fluorinated alkyl group of 1 to 10 carbon atoms which may have a substituent; A: represents a carboanion; $Y^{12}$ represents a cyclic alkyl group of 4 to 20 carbon atoms which may have an oxygen atom (=O) as a substituent; and q represents 0 or 1.

<<Anion Moiety (1)>>

In general formula (1), $X^0$ represents a hydrocarbon group of 3 to 30 carbon atoms which may have a substituent.

The hydrocarbon group for $X^0$ may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used. In such a case, with respect to the partial structure "$X^0$-$Q^1$-" of the anion moiety in general formula (1), the atom within $X^0$ to which $Q^1$ is bonded is preferably a carbon atom.

In the latter example, as the substituent for the aromatic hydrocarbon group, an alkyl group, an alkoxy group, a halogen atom, a halogenated alkyl group, a hydroxyl group, an oxygen atom (=O), a substituent containing a nitrogen atom (nitrogen atom-containing substituent described later) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for $X^0$ may be either a saturated aliphatic hydrocarbon group, or an unsaturated aliphatic hydrocarbon group. Further, the aliphatic hydrocarbon group may be linear, branched or cyclic, or a combination thereof.

In the aliphatic hydrocarbon group for $X^0$, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $X^0$, there is no particular limitation as long as it is an atom other than carbon and hydrogen. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a substituent containing a nitrogen atom described later (e.g., a cyano group).

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable. Further, a group in which a linear or branched, saturated or unsaturated hydrocarbon group is bonded to an aliphatic cyclic group is also preferable.

The linear saturated hydrocarbon group (alkyl group) preferably has 3 to 20 carbon atoms, more preferably 3 to 15, and most preferably 3 to 10. Specific examples include a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 3 to 10 carbon atoms, more preferably 3 to 5, still more preferably 3 or 4, and most preferably 3. Examples of linear monovalent unsaturated hydrocarbon groups include a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 8]

(L1)
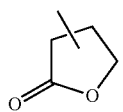

(L2)
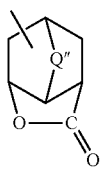

(L3)
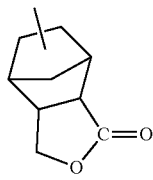

(L4)
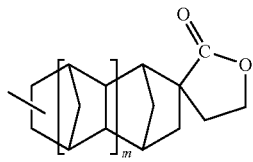

(L5)
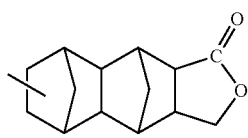

(S1)
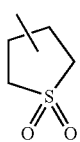

(S2)
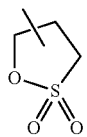

(S3)
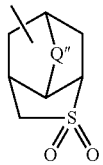

(S4)
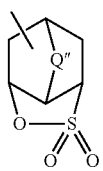

In the formulas, Q" represents an alkylene group of 1 to 5 carbon atoms, —O—, —S—, —O—$R^{98}$— or —S—$R^{99}$— (wherein each of $R^{98}$ and $R^{99}$ represents an alkylene group of 1 to 5 carbon atoms); and m represents 0 or 1.

Specific examples of the alkylene group for Q", $R^{98}$ and $R^{99}$ include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_{12}$CH$_3$)—, —C(CH$_3$)(CH$_2$CH$_2$CH$_3$)—, and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$—, and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$—, and —CH$_2$CH(CH$_3$)CH$_2$CH$_2$—; and a pentamethylene group [—CH$_2$CH$_2$CH$_2$CH$_2$CH$_2$—].

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the aforementioned substituent groups for substituting a part or all of the hydrogen atoms can be used.

As a group in which a linear or branched, saturated or unsaturated hydrocarbon group is bonded to an aliphatic cyclic group, for example, a group in which a linear or branched, saturated hydrocarbon group is bonded to a carbon atom constituting the ring structure of an aliphatic cyclic group is preferable, a group in which a linear, saturated hydrocarbon group is bonded to the carbon atom is more preferable, and a group in which a linear alkylene group is bonded to the carbon atom is particularly desirable.

Further, especially when $X^0$ represents a group containing a nitrogen atom, examples of $X^0$ include a hydrocarbon group having a substituent containing a nitrogen atom (hereafter, this group is referred to as "nitrogen-containing substituent") and a heterocyclic group containing a nitrogen atom as the hetero atom (hereafter, this group is referred to as "nitrogen-containing heterocyclic group"). These organic groups may have, apart from the nitrogen-containing substituent, a substituent other than a nitrogen-containing substituent (hereafter, referred to as "non-nitrogen-containing substituent").

As the nitrogen-containing heterocyclic group for $X^0$, a monovalent group in which one hydrogen atom has been removed from a heterocyclic group containing a nitrogen atom as the hetero atom (i.e., a nitrogen-containing heterocyclic group) can be mentioned. Examples of the nitrogen-containing heterocyclic group include unsaturated, monocyclic nitrogen-containing hetero rings, such as pyridine, pyrrole, pyrrazole, imidazole, 1,2,3-triazole, 1,2,4-triazole, tetrazole, pyrimidine, pyrazine and 1,3,5-triazine; saturated, monocyclic nitrogen-containing hetero rings, such as piperidine, piperazine and pyrrolidine; and polycyclic nitrogen-containing hetero rings, such as quinoline, isoquinoline, indole, pyrrolo[2,3-b]pyridine, indazole, benzimidazole, benzotriazole, carbazole, acridine, 1,5-diazabicyclo[4.3.0]-5-nonene, 1,8-diazabicyclo[5.4.0]-7-undecene, hexamethylenetetramine and 1,4-diazabicyclo[2.2.2]octane.

The nitrogen-containing heterocyclic group may be either a monocyclic group or a polycyclic group. The nitrogen-containing heterocyclic group has 3 to 30 carbon atoms, more preferably 5 to 30 carbon atoms, and still more preferably 5 to 20 carbon atoms.

Examples of the nitrogen-containing substituent for $X^0$ include the aforementioned nitrogen-containing heterocyclic group, as well as an amino group ($H_2N$—), an imino group (HN=), a cyano group (N≡C—) and an ammonio group ($^+NH_3$—). These nitrogen-containing substituents may have part or all of the hydrogen atoms substituted with a non-nitrogen-containing substituent.

Specific examples of the nitrogen-containing substituent for $X^0$ include nitrogen-containing heterocyclic groups, such as a 2-pyridyl group, a 3-pyridyl group, a 4-pyridyl group and a piperidino group; an amino group; an alkylamino group; a dialkylamino group; an imino group; an alkylimino group; a cyano group; and a trialkylammonio group. Among these, a nitrogen-containing heterocyclic group such as a 4-pyridyl group is preferable.

Examples of the non-nitrogen-containing substituent for $X^0$ include an alkyl group, an aryl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

Examples of aryl groups include a phenyl group, a tolyl group and a naphthyl group.

Examples of halogen atoms include a fluorine atom, a chlorine atom, an iodine atom and a bromine atom.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

When $X^0$ represents a hydrocarbon group which has a nitrogen-containing substituent, the hydrocarbon group may be either an aliphatic hydrocarbon group or an aromatic hydrocarbon group, and examples thereof include the same aliphatic hydrocarbon groups and aromatic hydrocarbon groups as those described above for the "hydrocarbon group for $X^0$".

Specific examples of the group represented by $X^0$ that contains a nitrogen atom include nitrogen-containing heterocyclic groups, such as a 2-pyridyl group, a 3-pyridyl group and a 4-pyridyl group; aminoalkyl groups, such as an aminomethyl group, a 1-aminoethyl group and a 2-aminoethyl group; alkylaminoalkyl groups, such as a methylaminomethyl group; dialkylaminoalkyl groups, such as a dimethylaminomethyl group; aminoaryl groups, such as a 2-aminophenyl group and a 4-aminophenyl group; alkylaminoaryl groups, such as a (methylamino)phenyl group; and dialkylaminoaryl groups, such as a (dimethylamino)phenyl group and a (diethylamino)phenyl group. Among these, a nitrogen-containing heterocyclic group such as a 4-pyridyl group is preferable.

In the present invention, as $X^0$, a cyclic group which may have a substituent is preferable. The cyclic group may be either an aromatic hydrocarbon group which may have a substituent, or an aliphatic cyclic group which may have a substituent.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

In general formula (1), $Q^1$ represents a divalent linking group containing a carbonyl group.

$Q^1$ may contain an atom other than carbon and oxygen. Examples of atoms other than carbon and oxygen include a hydrogen atom, a sulfur atom and a nitrogen atom.

Examples of divalent linking groups that contain a carbonyl group include non-hydrocarbon, carbonyl group-containing linking groups, such as an ester bond (—C(=O)—O—), an amide bond (—C(=O)—NH—), a carbonyl group (—C(=O)—), a carbonate bond (—O—C(=O)—O—), and groups that contain a non-hydrocarbon, carbonyl group-containing linking group.

Examples of groups that contain a non-hydrocarbon, carbonyl group-containing linking group include combinations of any of such non-hydrocarbon, carbonyl group-containing linking groups with a groups selected from an alkylene group and an oxygen atom (an ether bond: —O—).

Specific examples of such combinations include —O—$R^{91}$—O—C(=O)—, —C(=O)—O—$R^{92}$—, —C(=O)—O—$R^{93}$—O—C(=O)—, —$R^{94}$—C(=O)—O—$R^{95}$—O—C(=O)— (in the formulas, each of $R^{91}$ to $R^{95}$ independently represents an alkylene group).

The alkylene group for $R^{91}$ to $R^{95}$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —$C(CH_2CH_3)_2$—; an ethylene group [—$CH_2CH_2$—]; alkylethylene groups such as —$CH(CH_3)CH_2$—, —$CH(CH_3)CH(CH_3)$—, —$C(CH_3)_2CH_2$— and —$CH(CH_2CH_3)CH_2$—, and —$CH(CH_2CH_3)CH_2$—; a trimethylene group (n-propylene group) [—$CH_2CH_2CH_2$—]; alkyltrimethylene groups such as —$CH(CH_3)CH_2CH_2$— and —$CH_2CH(CH_3)CH_2$—; a tetramethylene group [—$CH_2CH_2CH_2CH_2$—]; alkyltetramethylene groups such as —$CH(CH_3)CH_2CH_2CH_2$— and —$CH_2CH(CH_3)CH_2CH_2$—; and a pentamethylene group [—$CH_2CH_2CH_2CH_2CH_2$—].

In general formula (1), p represents an integer of 1 to 3, preferably 1 or 2, and most preferably 1.

Specific examples of anion moieties preferable as the anion moiety (1) are shown below.

[Chemical Formula 9]

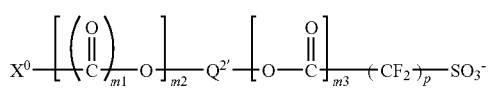

(1-1)

In formula (1-1), $X^0$ represents a hydrocarbon group of 3 to 30 carbon atoms which may have a substituent; $Q^{2\prime}$ represents a single bond or an alkylene group; p represents an integer of 1 to 3; each of m1 to m3 represents 0 or 1, provided that both of m2+m3 and m1+m3 are not equal to 0.

In formula (1-1), $X^0$ and p are respectfully the same as defined for $X^0$ and p in general formula (1).

As the alkylene group for $Q^{2\prime}$, the same alkylene groups as those described above for $R^{91}$ to $R^{95}$ in the explanation of $Q^1$ can be mentioned.

Each of m1 to m3 represents 0 or 1, provided that both of m2+m3 and m1+m3 are not equal to 0.

When m3=0, m2 represents 1, and m1 represents 1.

More specifically, preferable examples of the anion moiety (1) include an anion moiety represented by general formula (1-1-1) shown below, an anion moiety represented by general formula (1-1-2) shown below, an anion moiety represented by general formula (1-1-3) shown below, and an anion moiety represented by general formula (1-1-4) shown below.

Anion Moiety Represented by General Formula (1-1-1)

[Chemical Formula 10]

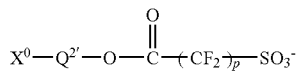

(1-1-1)

In formula (1-1-1), $X^0$, $Q^{2\prime}$ and p are the same as defined above.

In formula (1-1-1), as $X^0$, an aliphatic cyclic group which may have a substituent, a linear aliphatic hydrocarbon group which may have a substituent, or an aromatic hydrocarbon group which may have a substituent is preferable. Of these, an aliphatic cyclic group which contains a hetero atom-containing substituent in the ring structure thereof is more preferable.

As the alkylene group for $Q^2$ the same alkylene groups as those described above for $Q^1$ can be mentioned.

As $Q^{2\prime}$, a single bond or a methylene group is particularly desirable. Especially, when $X^0$ is an aliphatic cyclic group which may have a substituent, $Q^{2\prime}$ is preferably a single bond. On the other hand, when $X^0$ is an aromatic hydrocarbon group, $Q^{2\prime}$ is preferably a methylene group.

p is preferably 1 or 2, and most preferably 1.

Specific examples of preferable anions represented by general formula (1-1-1) are shown below.

[Chemical Formula 11]

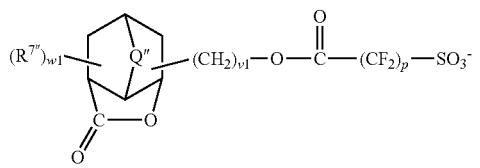

(1-1-11)

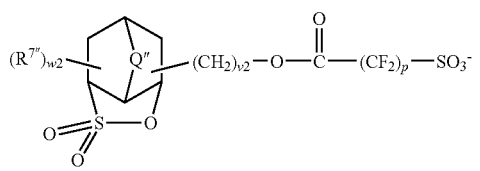

(1-1-12)

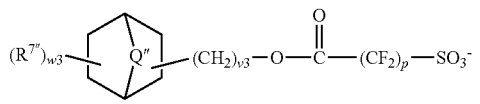

(1-1-13)

In the formulas, Q" is the same as defined above; $R^{7\prime\prime}$ represents a substituent; each of w1 to w3 independently represents an integer of 0 to 3; each of v1 to v3 independently represents an integer of 0 to 5; and p represents an integer of 1 to 3.

In the formulas, as the substituent for $R^{7\prime\prime}$, the same groups as those which the aforementioned aliphatic hydrocarbon group or aromatic hydrocarbon group for X may have as a substituent can be mentioned.

If there are two or more of the $R^{7\prime\prime}$ group, as indicated by the values w1 to w3, then the two or more of the $R^{7\prime\prime}$ groups may be the same or different from each other.

It is preferable that each of v1 to v3 independently represents an integer of 0 to 3, most preferably 0.

It is preferable that each of w1 to w3 independently represents an integer of 0 to 2, and most preferably 0.

p is preferably 1 or 2, and most preferably 1.

Anion Moiety Represented by General Formula (1-1-2)

[Chemical Formula 12]

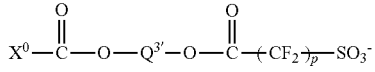

(1-1-2)

In formula (1-1-2), $X^0$ and p are the same as defined above; and $Q^{3\prime}$ represents an alkylene group.

In formula (1-1-2), as $X^0$, an aliphatic cyclic group which may have a substituent, a linear aliphatic hydrocarbon group which may have a substituent, or an aromatic hydrocarbon group which may have a substituent is preferable.

p is preferably 1 or 2, and most preferably 1.

As the alkylene group for $Q^{3'}$, the same alkylene groups as those described above for $Q^1$ can be mentioned.

Specific examples of preferable anions represented by general formula (1-1-2) are shown below.

[Chemical Formula 13]

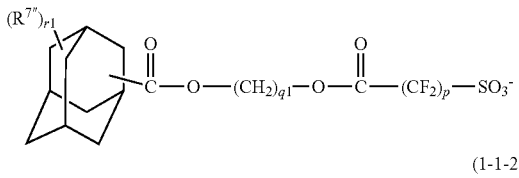

(1-1-21)

(1-1-22)

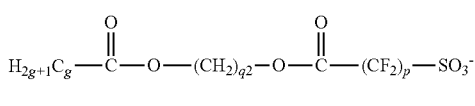

(1-1-23)

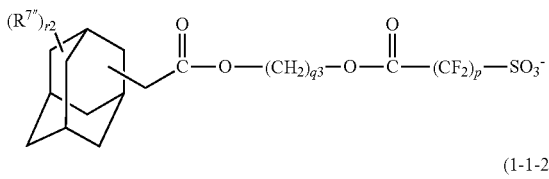

(1-1-24)

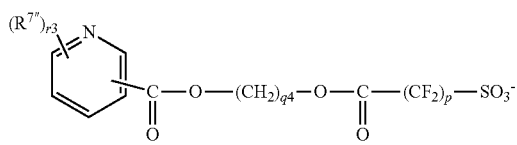

In the formulas, p is the same as defined above; $R^{7''}$ represents a substituent; each of r1 to r3 independently represents an integer of 0 to 3; each of q1 to q4 independently represents an integer of 1 to 12; and g represents an integer of 1 to 20.

In the formulas, as the substituent for $R^{7''}$, the same groups as those described above for $R^{7''}$ can be mentioned.

If there are two or more of the $R^{7''}$ group, as indicated by the values r1 to r3, then the two or more of the $R^{7''}$ groups may be the same or different from each other.

It is preferable that each of r1 to r3 independently represent an integer of 0 to 2, more preferably 0 or 1, and still more preferably 0.

It is preferable that each of q1 to q4 independently represent 1 to 8, more preferably 1 to 5, and still more preferably 1 to 3.

g is preferably 1 to 15, and more preferably 1 to 10.

p is preferably 1 or 2, and most preferably 1.

Anion Moiety Represented by General Formula (1-1-3)

[Chemical Formula 14]

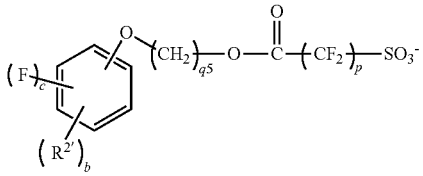

(1-1-3)

In the formula, p is the same as defined above; q5 represents an integer of 0 to 5; $R^{2'}$ represents an alkyl group, an alkoxy group, a halogen atom (excluding fluorine), a halogenated alkyl group, a hydroxy group, an oxygen atom (=O), —COOR", —OC(=O)R", a hydroxyalkyl group or a cyano group; b represents an integer of 0 to 2, and c represents an integer of 1 to 5, provided that $1 \leq b+c \leq 5$.

p is preferably 1 or 2, and most preferably 1.

q5 is preferably 1 to 4, more preferably 1 or 2, and most preferably 2.

Examples of the alkyl group, alkoxy group, halogen atom (excluding fluorine) and halogenated alkyl group for $R^{2'}$ include the same groups as those described above for the substituent which a cyclic group represented by X may have.

With respect to —COOR" and —OC(=O)R" for $R^{2'}$, R" is the same as defined for R" in the structural unit (a2) described later.

As the hydroxyalkyl group for $R^{2'}$, groups in which at least one hydrogen atom of the aforementioned alkyl groups for $R^2$ has been substituted with a hydroxy group can be mentioned.

b is most preferably 0.

c is preferably 2 to 5, and most preferably 5.

However, $1 \leq b+c \leq 5$.

Anion Moiety Represented by General Formula (1-1-4)

[Chemical Formula 15]

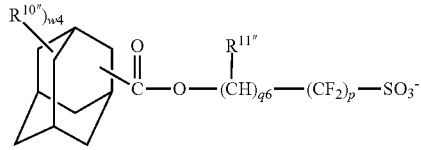

(1-1-4)

In the formula, p is the same as defined above; q6 represents an integer of 1 to 12; w4 represents an integer of 0 to 3; $R^{11''}$ represents a substituent; and $R^{11''}$ represents a hydrogen atom, an alkyl group of 1 to 5 carbon atoms or a halogenated alkyl group of 1 to 5 carbon atoms.

Examples of the substituent for $R^{10''}$ include an alkyl group, an alkoxy group, a halogen atom, a halogenated alkyl group, a hydroxyl group, an oxygen atom (=O) and a cyano group.

As the alkyl group, an alkyl group of 1 to 5 carbon atoms is preferable, and a methyl group, an ethyl group, a propyl group, an n-butyl group or a tert-butyl group is particularly desirable.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

If there are two or more of the $R^{10''}$ group, as indicated by the value w4, then the two or more of the $R^{10''}$ groups may be the same or different from each other.

p is preferably 1 or 2, and most preferably 1.

q6 is preferably 1 to 5, more preferably 1 to 3, and most preferably 1.

w4 is preferably an integer of 0 to 2, more preferably 0 or 1, and still more preferably 0.

$R^{11\prime\prime}$ represents a hydrogen atom, an alkyl group of 1 to 5 carbon atoms or a halogenated alkyl group of 1 to 5 carbon atoms. As the alkyl group and the halogenated alkyl group, the same alkyl groups and halogenated alkyl groups as those described above for $R^{10\prime\prime}$ can be mentioned.

<<Anion Moiety (2)>>

In general formula (2), $X^0$ represents a hydrocarbon group of 3 to 30 carbon atoms which may have a substituent.

The hydrocarbon group represented by $X^0$ is the same as defined for the hydrocarbon group represented by $X^0$ in general formula (1).

In general formula (2), $Q^2$ represents a single bond or an alkylene group.

The alkylene group for $Q^2$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2CH$($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2CH$($CH_3$)$CH_2CH_2$—; and a pentamethylene group [—$CH_2CH_2CH_2CH_2CH_2$—].

In general formula (2), p represents an integer of 1 to 3, preferably 1 or 2, and most preferably 2.

Specific examples of anion moieties preferable as the anion moiety (2) are shown below.

[Chemical Formula 16]

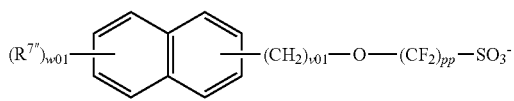
(2-1)

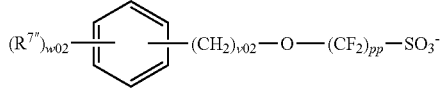
(2-2)

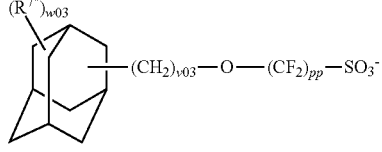
(2-3)

In the formulas, $R^{7\prime\prime}$ represents a substituent; each of w01 to w03 independently represents an integer of 0 to 3; each of v01 to v03 independently represents an integer of 0 to 5; and pp represents an integer of 1 to 3.

In the formulas above, $R^{7\prime\prime}$ is the same as defined above.

If there are two or more of the $R^{7\prime\prime}$ group, as indicated by the values w01 to w03, then the two or more of the $R^{7\prime\prime}$ groups may be the same or different from each other.

It is preferable that each of v01 to v03 independently represents an integer of 0 to 3, and preferably 0 or 1.

It is preferable that each of w01 to w03 independently represents an integer of 0 to 2, and most preferably 0.

pp is preferably 1 or 2, and most preferably 2.

<<Anion Moiety (3)>>

In general formula (3), $X^{10}$ represents a hydrocarbon group of 1 to 30 carbon atoms which may have a substituent.

The hydrocarbon group for $X^{10}$ may be either an aromatic hydrocarbon group or an aliphatic hydrocarbon group.

The aromatic hydrocarbon group for $X^{10}$ is the same as defined for the aromatic hydrocarbon group for $X^0$ in general formula (1).

The aliphatic hydrocarbon group for $X^{10}$ is the same as defined for the aliphatic hydrocarbon group for $X^0$ in general formula (1). As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable. Further, a group in which a linear or branched, saturated or unsaturated hydrocarbon group is bonded to an aliphatic cyclic group is also preferable.

The linear saturated hydrocarbon group (alkyl group) preferably has 1 to 20 carbon atoms, more preferably 1 to 15, and most preferably 3 to 12. Specific examples of the linear saturated hydrocarbon group include the same linear saturated hydrocarbon groups as those described above for $X^0$ in general formula (1).

Examples of the branched saturated hydrocarbon group (alkyl group) include the same branched saturated hydrocarbon groups as those described above for $X^0$ in general formula (1).

The unsaturated hydrocarbon group preferably has 2 to 10 carbon atoms, more preferably 2 to 5, still more preferably 2 to 4, and most preferably 3. Specific examples thereof include the same unsaturated hydrocarbon groups as those described above for $X^0$ in general formula (1).

Examples of the group in which a linear or branched, saturated or unsaturated hydrocarbon group is bonded to an aliphatic cyclic group include the same groups as those described above for $X^0$ in general formula (1).

In the present invention, as $X^{10}$, a cyclic group which may have a substituent is preferable.

The cyclic group may be either an aromatic hydrocarbon group which may have a substituent, or an aliphatic cyclic group which may have a substituent.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

In general formula (3), $Q^3$ represents a single bond or a divalent linking group.

Examples of the divalent linking group for $Q^2$ include the following:

an alkylene group or a fluorinated alkylene group;

non-hydrocarbon, oxygen-containing linking groups, such as an oxygen atom (ether bond: —O—), an ester bond (—C(=O)—O—), an amide bond (—C(=O)—NH—), a carbonyl group (—C(=O)—) and a carbonate bond (—O—C(=O)—O—); and combinations of the aforementioned non-hydrocarbon, oxygen-containing linking groups with an alkylene group or a fluorinated alkylene group.

The alkylene group or fluorinated alkylene group for $Q^3$ is preferably a linear or branched group. Further, the alkylene group or fluorinated alkylene group preferably has 1 to 12 carbon atoms, more preferably 1 to 5 carbon atoms, still more preferably 1 to 4 carbon atoms, and most preferably 1 to 3 carbon atoms.

Specific examples of alkylene groups for $Q^3$ include a methylene group [—$CH_2$—]; alkylmethylene groups such as —$CH(CH_3)$—, —$CH(CH_2CH_3)$—, —$C(CH_3)_2$—, —$C(CH_3)(CH_2CH_3)$—, —$CH(CH_2CH_2CH_3)$—, —$C(CH_3)(CH_2CH_2CH_2)$—, and —$C(CH_2CH_3)_2$—; an ethylene group [—$CH_2CH_2$—]; alkylethylene groups, such as —$CH(CH_3)CH_2$—, —$CH(CH_3)CH(CH_3)$—, —$C(CH_3)_2CH_2$—, —$CH(CH_2CH_3)CH_2$—, and —$CH(CH_2CH_3)CH_2$—; a trimethylene group (an n-propylene group) [—$CH_2CH_2CH_2$—]; alkyltrimethylene groups, such as —$CH(CH_3)CH_2CH_2$—, and —$CH_2CH(CH_3)CH_2$—; a tetramethylene group [—$CH_2CH_2CH_2CH_2$—]; alkyltetramethylene groups, such as —$CH(CH_3)CH_2CH_2CH_2$—, and —$CH_2CH(CH_3)CH_2CH_2$—; and a pentamethylene group [—$CH_2CH_2CH_2CH_2CH_2$—].

As the fluorinated alkylene group for $Q^3$, groups in which part or all of the hydrogen atoms of the aforementioned alkylene groups for $Q^3$ have been substituted with a fluorine atom can be mentioned, and specific examples include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, and —$C(CF_3)_2CH_2$—.

Examples of combinations of the aforementioned non-hydrocarbon, oxygen-containing linking groups with an alkylene group or a fluorinated alkylene group include —$R^{91}$—O—, —C(=O)—O—$R^{92}$—, —C(=O)—O—$R^{93}$—O—, and —$R^{94}$—C(=O)—O—$R^{95}$—O—. In the formulas, each of $R^{91}$ to $R^{95}$ independently represents an alkylene group or a fluorinated alkylene group, and specific examples thereof include the same alkylene groups or fluorinated alkylene groups as those described above for $Q^3$.

When $Y^{10}$ (described later) in general formula (3) represents —$SO_2$—, it is particularly desirable that a carbon atom of $Q^3$ bonded to the sulfur atom within $Y^{10}$ be fluorinated. In such a case, an acid having a strong acid strength is generated from the structural unit (a0-2) upon exposure. As a result, a resist pattern with an excellent shape can be formed, and various lithography properties such as EL margin and the like can be improved.

In general formula (3), when $Y^{10}$ (described later) represents —$SO_2$—, the acid strength of the acid generated upon exposure can be controlled by adjusting the number of fluorine atoms within $Q^3$. When the carbon atom is not fluorinated, although the acid strength becomes weak, improvement in roughness and the like can be expected.

The alkylene group or the fluorinated alkylene group for $Q^3$ may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents for the alkylene group or fluorinated alkylene group include an alkoxy group of 1 to 4 carbon atoms, and a hydroxyl group.

As $Q^3$, a single bond, an alkylene group, a fluorinated alkylene group or a divalent linking group containing an ether bond is preferable, and a single bond, an alkylene group or —$R^{91}$—O— is particularly desirable.

In general formula (3), $Y^{10}$ represents —C(=O)— or —$SO_2$—.

In general formula (3), $Y^{11}$ represents an alkyl group of 1 to 10 carbon atoms which may have a substituent or a fluorinated alkyl group of 1 to 10 carbon atoms which may have a substituent.

$Y^{11}$ has 1 to 10 carbon atoms, preferably 1 to 8 carbon atoms, and more preferably 1 to 4 carbon atoms.

$Y^{11}$ is preferably a fluorinated alkyl group which may have a substituent because the acid strength of the generated acid becomes stronger. The fluorination ratio (percentage (%) of the number of fluorine atoms, base on the total number of fluorine atoms and hydrogen atoms) is preferably 50 to 100%, more preferably 80 to 100%, and still more preferably 85 to 100%.

Further, when $Y^{11}$ is a fluorinated alkyl group, the skeleton "$Y^{11}$—$SO_2$-" exhibits excellent decomposability as compared to a perfluoroalkyl chain of 6 to 10 carbon atoms which is hardly decomposable, and bioaccumulation can be minimized to improve ease in handling. Furthermore, the fluorinated alkyl group is preferable in that the acid-generator component (B) can be uniformly distributed within a resist film.

The alkyl group or fluorinated alkyl group for $Y^{11}$ may have a substituent. Examples of substituents include an alkoxy group, a halogen atom other than fluorine, a halogenated alkyl group, a hydroxyl group and an oxygen atom (=O).

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom (other than fluorine) as the substituent include a chlorine atom, a bromine atom and an iodine atom.

Examples of the halogenated alkyl group as the substituent include groups in which part or all of the hydrogen atoms within the aforementioned alkyl groups has been substituted with the aforementioned halogen atoms.

Specific examples of anion moieties preferable as the anion moiety (3) are shown below.

[Chemical Formula 17]

(3-1)

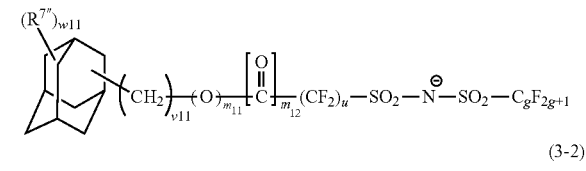

(3-2)

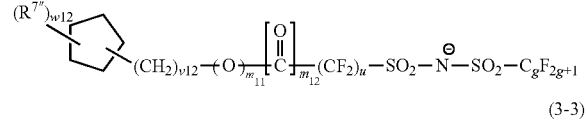

(3-3)

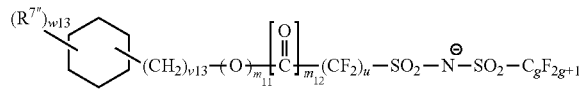

-continued (3-4)
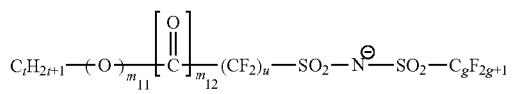

(3-5)
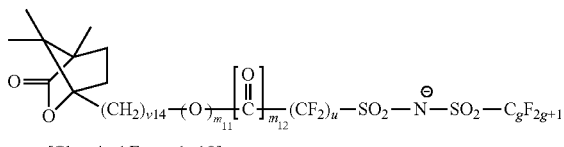

[Chemical Formula 18]

(3-6)
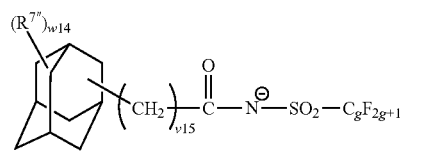

(3-7)
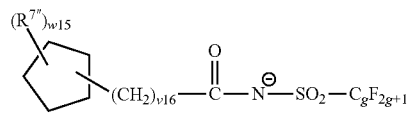

(3-8)
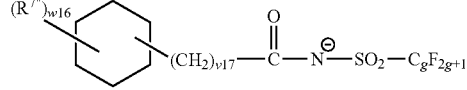

(3-9)
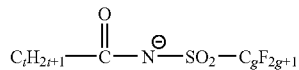

(3-10)
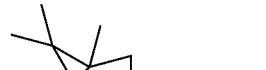

In the formulas, $R^{7''}$ represents a substituent; each of w11 to w16 independently represents an integer of 0 to 3; each of v11 to v18 independently represents an integer of 0 to 3; u represents an integer of 0 to 4; each of m11 and m12 independently represents 0 or 1; g represents an integer of 1 to 4; and t represents an integer of 3 to 20.

In the formulas above, the substituent for $R^{7''}$ is the same as defined above.

If there are two or more of the $R^{7''}$ group, as indicated by the values w11 to w16, then the two or more of the $R^{7''}$ groups may be the same or different from each other.

Each of w11 to w16 independently represents an integer of 0 to 3, preferably 0 or 1, and most preferably 0.

Each of v11 to v18 independently represents an integer of 0 to 3, and more preferably 0 or 1.

Each u independently represents an integer of 0 to 4, and preferably 0 to 2.

Each g independently represents an integer of 1 to 4, preferably 1 or 2, and most preferably 1.

t represents an integer of 3 to 20, preferably 3 to 15, and more preferably 3 to 12.

<<Anion Moiety (4)>>

In general formula (4), $A^-$ represents a carboanion. $A^-$ is not particularly limited as long as it is a carboanion, and any of those conventionally known as anion moiety for an onium salt acid generator can be appropriately selected for use. In the present invention, as $A^-$, a carboanion having a sulfonyl group is preferable. In particular, at least one group selected from groups represented by general formula (4-1) or (4-2) shown below is preferable, and a group represented by general formula (4-1) shown below is more preferable.

[Chemical Formula 19]

(4-1)
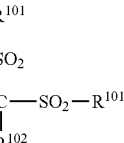

(4-2)
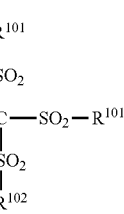

In the formulas, each $R^{101}$ independently represents an alkyl group of 1 to 10 carbon atoms which has at least one hydrogen atom substituted with a fluorine atom, wherein the two $R^{101}$ group may be mutually bonded to form a ring; and $R^{102}$ represents a hydrocarbon group which may have a substituent.

In general formula (4-1) or (4-2), $R^{101}$ represents an alkyl group of 1 to 10 carbon atoms in which at least one hydrogen atom has been substituted with a fluorine atom. The alkyl group may be any of linear, branched or cyclic. Alternatively, the $R^{101}$ groups may be mutually bonded to form a ring. In the present invention, as $R^{101}$, a linear or branched alkyl group is preferable, and a linear alkyl group is more preferable.

Examples of the linear alkyl group include a methyl group, an ethyl group, a propyl group, a butyl group, a pentyl group, a hexyl group, a heptyl group, an octyl group, a nonyl group and a decyl group in which at least one hydrogen atom has been substituted with a fluorine atom.

Specific examples of branched alkyl groups include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group in which at least one hydrogen atom has been substituted with a fluorine atom.

Examples of the cyclic alkyl group include groups in which at least one hydrogen atom has been removed from a monocycloalkane such as cyclopentane or cyclohexane and substituted with a fluorine atom; and groups in which at least one hydrogen atom has been removed from a polycycloalkane such as adamantane, norbornane, isobornane or tricyclodecane and substituted with a fluorine atom.

When the $R^{101}$ group is mutually bonded to form a ring, the total number of carbon atoms within the $R^{101}$ group is preferably 2 to 6, and more preferably 2 or 3.

As $R^{101}$, any alkyl group of 1 to 10 carbon atoms in which at least one hydrogen atom has been substituted with a fluorine atom can be used. For example, an alkyl group having one hydrogen atom substituted with a fluorine atom, an alkyl group having two or more hydrogen atoms substituted with fluorine atoms, or an alkyl group having all hydrogen atoms substituted with fluorine atoms (perfluoro group) can be used.

In the present invention, as $R^{101}$, a perfluoro group is preferable in terms of ease in synthesis and improvement in lithography properties.

In formula (4-1) or (4-2), $R^{102}$ represents a hydrocarbon group which may have a substituent. A "hydrocarbon group which may have a substituent" means that part or all of the hydrogen atoms within the hydrocarbon group may be substituted with a substituent.

The hydrocarbon group for $R^{102}$ may be either an aliphatic hydrocarbon group or an aromatic hydrocarbon group.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 5 carbon atoms, more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

The aromatic hydrocarbon group is not particularly limited, although an aryl group of 6 to 20 carbon atoms is preferable, and an aryl group of 6 to 10 carbon atoms is more preferable. Specific examples thereof include a phenyl group and a naphthyl group.

Specific examples of the substituent for the hydrocarbon group include an alkoxy group, a halogen atom, a halogenated alkyl group, a halogenated aryl group, a hydroxy group and an oxygen atom (=O).

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

Examples of the halogenated aryl group include groups in which part or all of the hydrogen atoms within an aryl group of 6 to 10 carbon atoms such as a phenyl group or a naphthyl group has been substituted with a halogen atom.

In the present invention, as the substituent for the $R^{102}$ group, a fluorine atom is particularly desirable. Further examples of the substituent include a substituent containing nitrogen, such as a nitrogen atom, a cyano group (—CN), an amino group (—NH$_2$) and an amido group (—NH—C(=O)—).

In the present invention, in the case where the hydrocarbon group for $R^{102}$ has a three-dimensionally bulky functional group, it is expected that diffusion of acid generated upon exposure can be suppressed when the component (A) is used as an acid generator for a resist composition, as compared to the case where the hydrocarbon group has a relatively small functional group. Therefore, in the present invention, the hydrocarbon group for $R^{102}$ is preferably a substituted or unsubstituted, aliphatic cyclic group or aromatic hydrocarbon group, and more preferably a substituted or unsubstituted aromatic hydrocarbon group. Among these, an aryl group substituted with a fluorine atom is preferable, a perfluoroaryl group is more preferable, and a perfluorophenyl group is still more preferable. Alternatively, an alkyl group which has a three-dimensionally bulky substituent such as a halogenated aryl group can be used.

Examples of the anion moiety (4) represented by formula (4-1) include anion moieties represented by general formulas (4-1-1) to (4-1-56) shown below. In the present invention, as the anion moiety (4), an anion moiety represented by any one of general formulas (4-1-1) to (4-1-14) and (4-1-29) to (4-1-42) shown below is preferable, and an anion moiety represented by any one of general formulas (4-1-1) to (4-1-14) is more preferable.

[Chemical Formula 20]

(4-1-1)

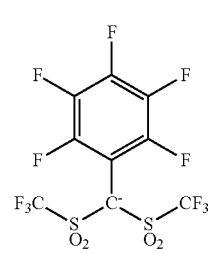

(4-1-2) 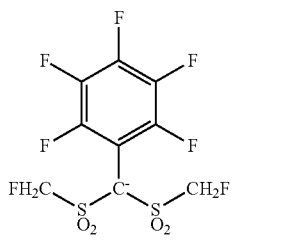
(4-1-3) 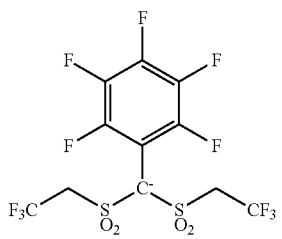
(4-1-4) 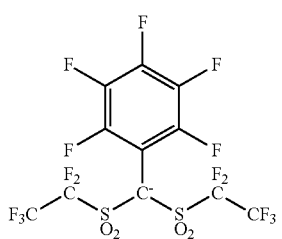
(4-1-5) 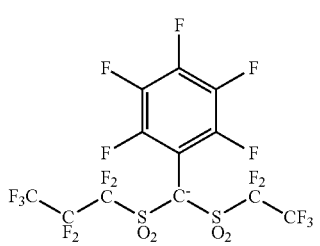
(4-1-6) 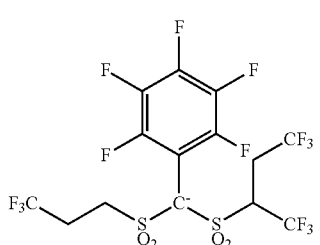
(4-1-7) 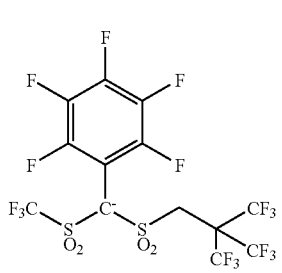
(4-1-8) 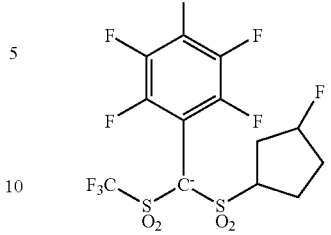
(4-1-9) 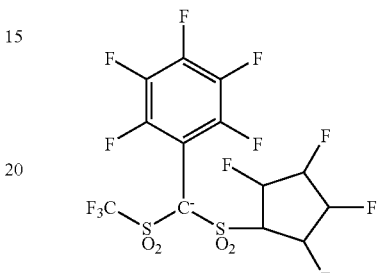
(4-1-10) 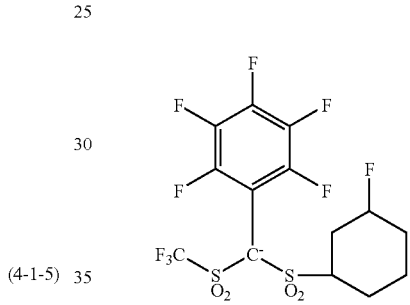
(4-1-11) 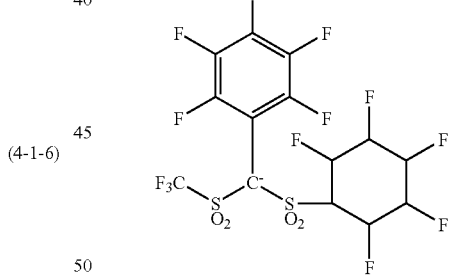
(4-1-12) 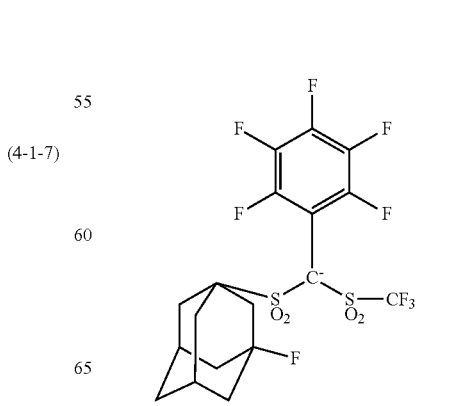

-continued (4-1-13)

(4-1-14)

[Chemical Formula 21]

(4-1-15)

(4-1-16)

(4-1-17)

(4-1-18)

-continued (4-1-19)

(4-1-20)

(4-1-21)

(4-1-22)

(4-1-23)

(4-1-24)

(4-1-25)

(4-1-26) 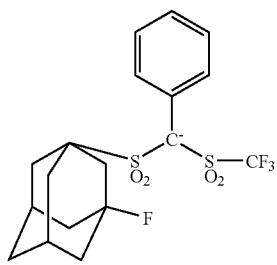
(4-1-27) 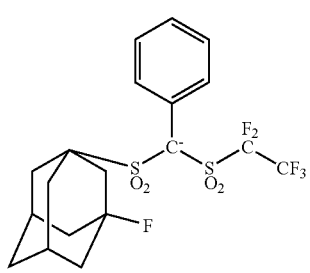
(4-1-28) 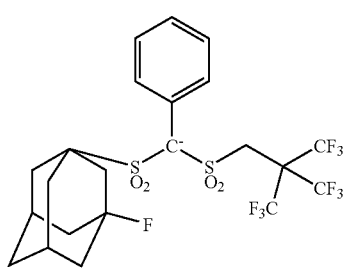
[Chemical Formula 22]
(4-1-29) 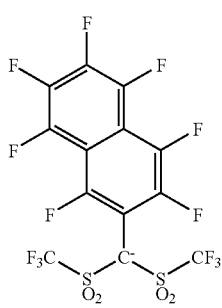
(4-1-30) 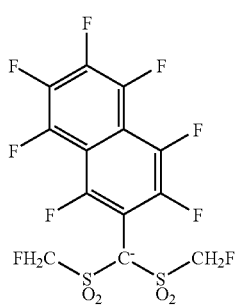
(4-1-31) 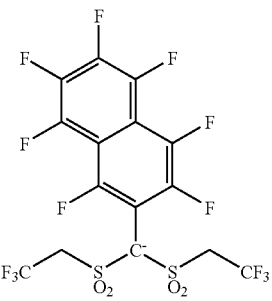
(4-1-32) 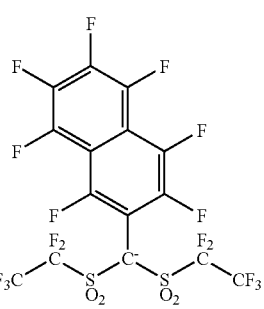
(4-1-33) 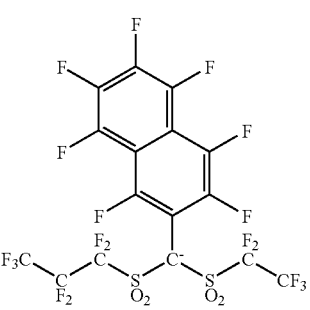
(4-1-34) 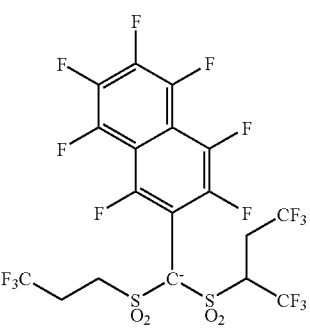
(4-1-35) 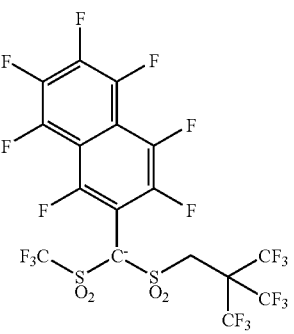

(4-1-36)
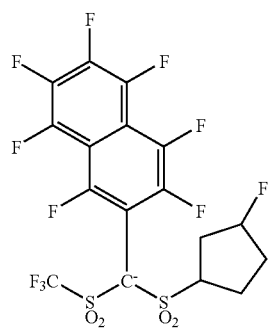
(4-1-37)
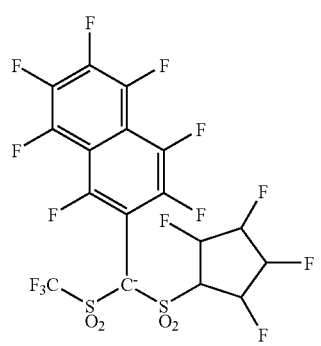
(4-1-38)
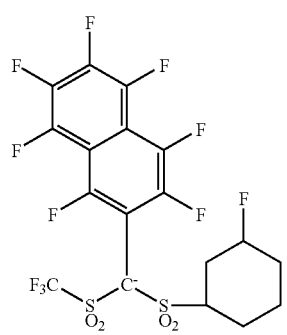
(4-1-39)
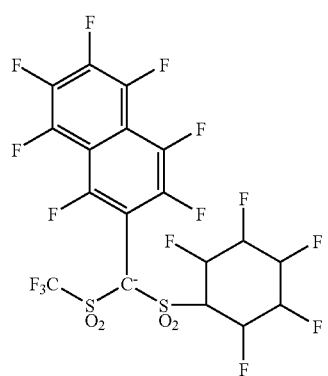
(4-1-40)
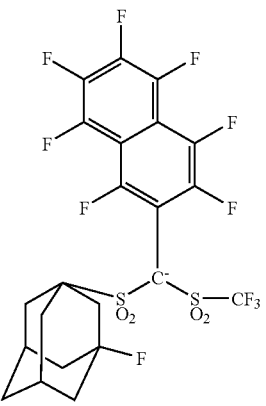
(4-1-41)
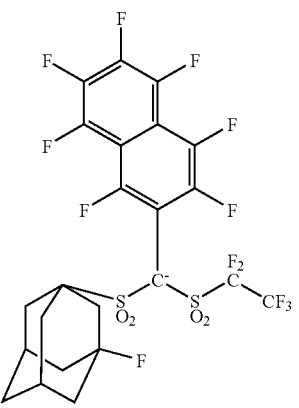
(4-1-42)
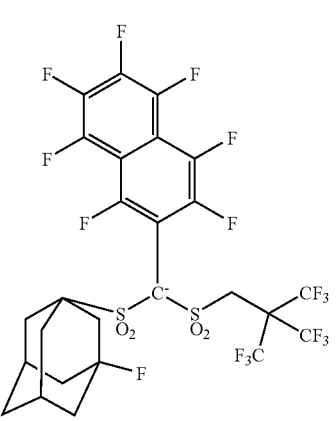
[Chemical Formula 23]
(4-1-43)
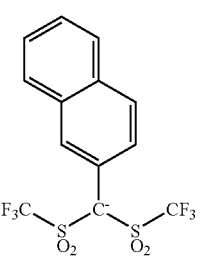

(4-1-44)
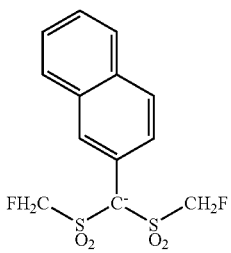
(4-1-45)
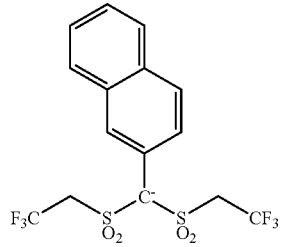
(4-1-46)
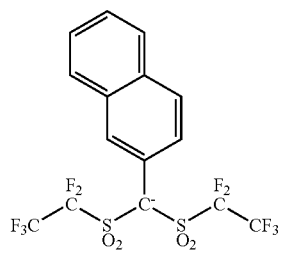
(4-1-47)
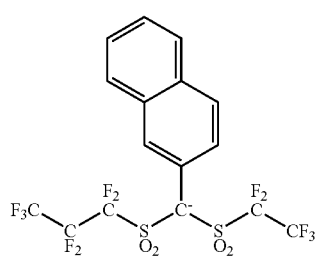
(4-1-48)
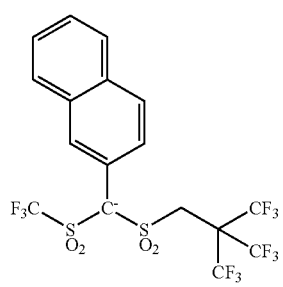
(4-1-49)
(4-1-50)
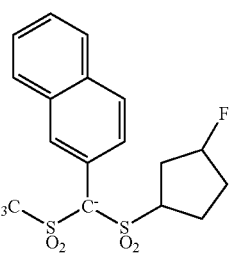
(4-1-51)
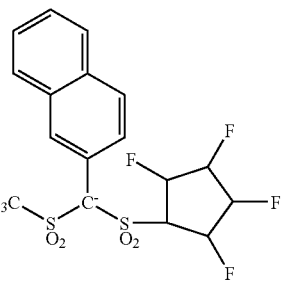
(4-1-52)
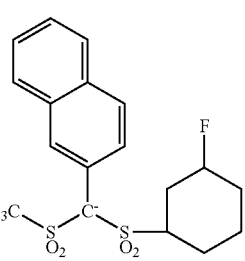
(4-1-53)
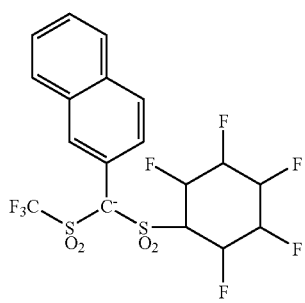
(4-1-54)
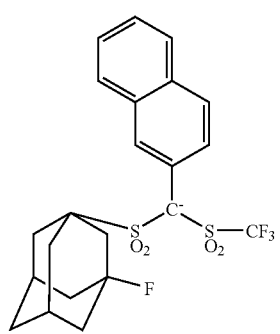

-continued
(4-1-55)
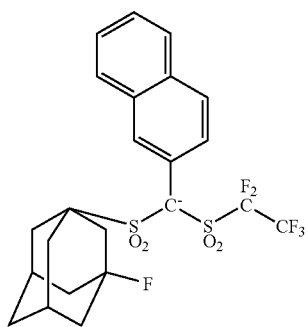
(4-1-56)
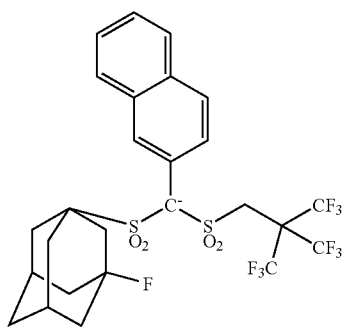
Examples of the anion moiety (4) represented by formula (4-2) include anion moieties represented by general formulas (4-2-1) to (4-2-32) shown below. In the present invention, as the anion moiety (4), an anion moiety represented by any one of general formulas (4-2-1) to (4-2-14) shown below is preferable.
[Chemical Formula 24]
(4-2-1)
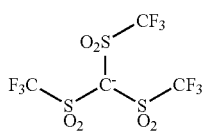
(4-2-2)
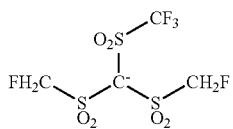
(4-2-3)
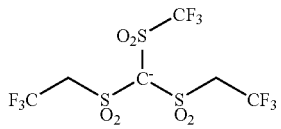
(4-2-4)
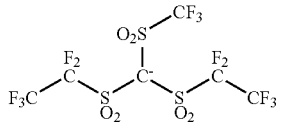
(4-2-5)
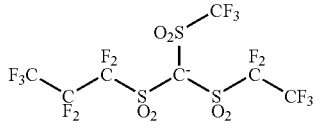
-continued
(4-2-6)
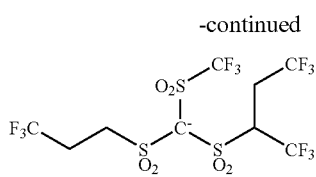
(4-2-7)
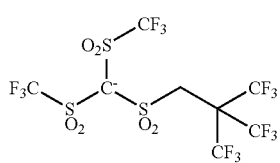
(4-2-8)
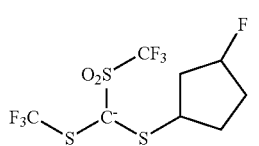
(4-2-9)
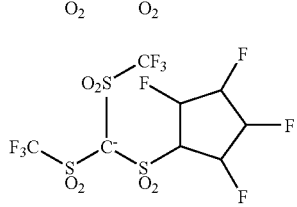
(4-2-10)
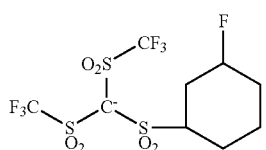
(4-2-11)
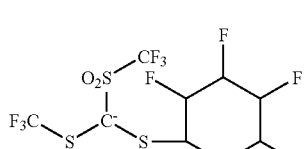
(4-2-12)
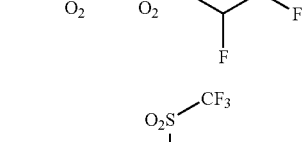
(4-2-13)
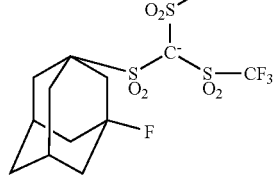
(4-2-14)
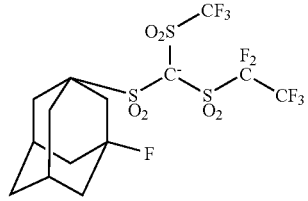

[Chemical Formula 25]
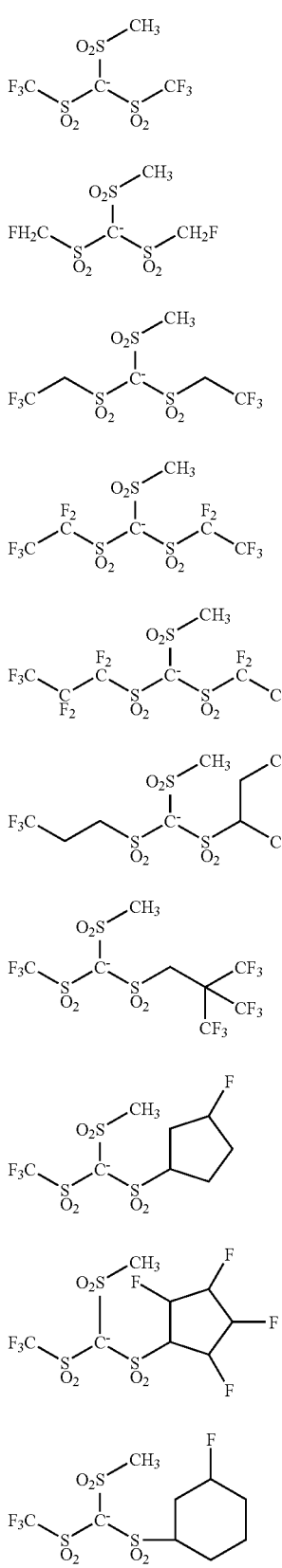
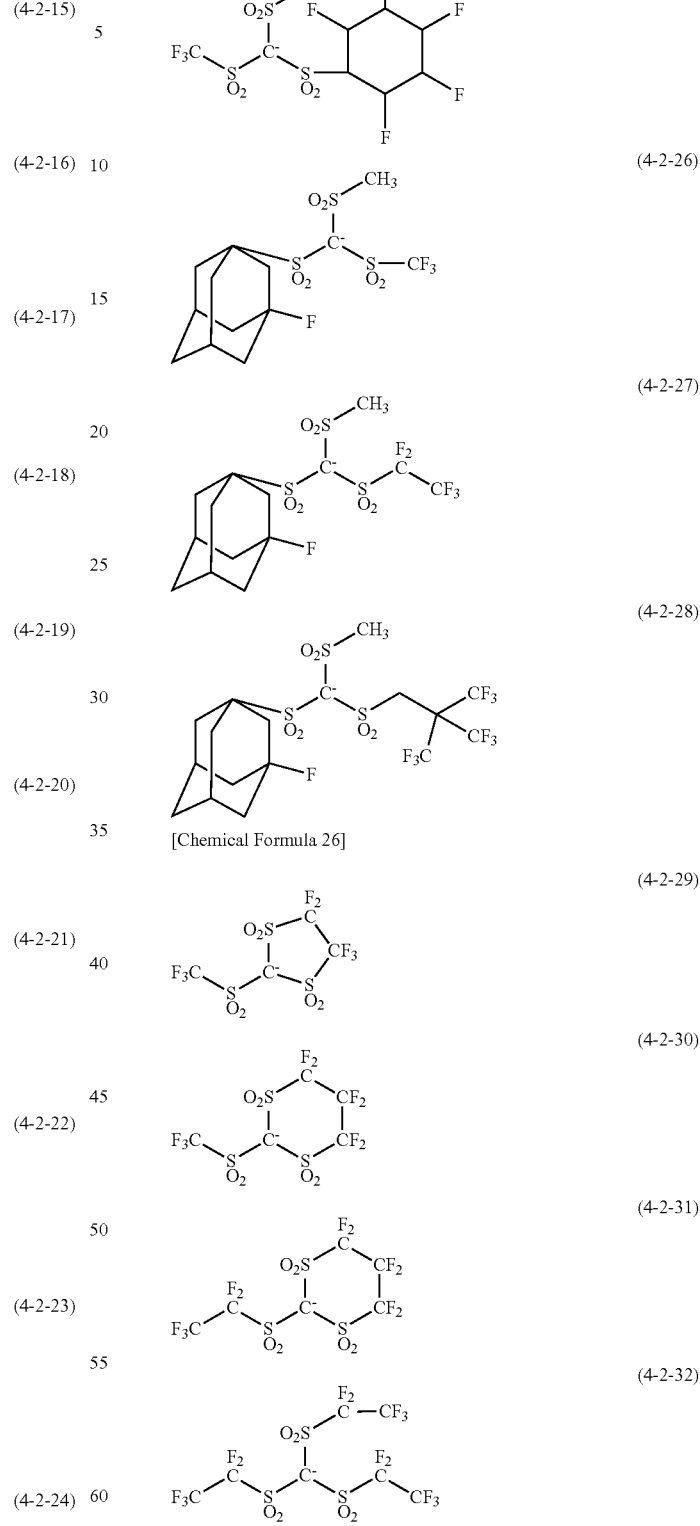
[Chemical Formula 26]
<<Anion Moiety (5)>>
In general formula (5), $Y^{12}$ represents a cyclic alkyl group of 4 to 12 carbon atoms which may have an oxygen atom (=O) as a substituent.

The expression "may have an oxygen atom (=O) as a substituent" means that two hydrogen atoms bonded to a carbon atom constituting the cyclic alkyl group of 4 to 20 carbon atoms may be substituted with an oxygen atom (=O).

The cyclic alkyl group represented by $Y^{12}$ is not particularly limited as long as it has 4 to 20 carbon atoms, and may be either polycyclic or monocyclic. Examples thereof include a group in which one hydrogen atom has been removed from a monocycloalkane or a polycycloalkane such as a bicycloalkane, tricycloalkane or tetracycloalkane. As the monocyclic group, a group in which one hydrogen atom has been removed from a monocycloalkane of 3 to 8 carbon atoms is preferable, and specific examples thereof include a cyclopentyl group, a cyclohexyl group, a cycloheptyl group and a cyclooctyl group. The polycyclic group preferably has 7 to 12 carbon atoms, and specific examples thereof include an adamantyl group, a norbornyl group, an isobornyl group, a tricyclodecyl group and a tetracyclododecyl group. From an industrial viewpoint, an adamantyl group, a norbornyl group or a tetracyclododecyl group is particularly desirable.

When the $Y^{12}$ group has an oxygen atom (=O) as a substituent, it preferably has 1 or 2 substituents, and most preferably 1 substituent.

When $Y^{12}$ has an oxygen atom (=O) as a substituent, the substituent is preferably bonded to a carbon atom adjacent to the carbon atom on the terminal of the group "—$(CH_2)_q$—$SO_3^-$".

$Y^{12}$ may have a substituent other than oxygen. As an example of such a substituent, a lower alkyl group of 1 to 5 carbon atoms can be given. The lower alkyl group is preferably linear or branched, and preferably has 1 to 3 carbon atoms. As the lower alkyl group, a methyl group is particularly desirable.

When $Y^{12}$ has a substituent other than an oxygen atom (=O), it preferably has 1 to 3 substituents, and more preferably 1 or 2 substituents.

When $Y^{12}$ has a substituent other than an oxygen atom (=O), the bonding position of the substituent is the same as in the case of the oxygen atom (=O).

As $Y^{12}$, a cyclic group of 4 to 12 carbon atoms which has an oxygen atom (=O) as a substituent is preferable, a polycyclic alkyl group of 4 to 20 carbon atoms which has an oxygen atom (=O) as a substituent is more preferable, an adamantyl group, a norbornyl group or a tetracyclododecyl group which has an oxygen atom (=O) as a substituent is still more preferable, and a norbornyl group which has an oxygen atom (=O) as a substituent is particularly desirable.

In general formula (5), q represents 0 or 1, and preferably 1.

In terms of the effects of the present invention, the anion moiety (5) is preferably a camphorsulfonate ion, and it is particularly desirable that the camphorsulfonate ion is represented by the formula (5-1) shown below (a group in which the sultanate ion (—$SO_3^-$) is bonded to the carbon atom of the methyl group bonded to the first position of the norbornane ring).

Further, an ion represented by the formula (5-2) shown below can also be given as a preferable example.

[Chemical Formula 27]

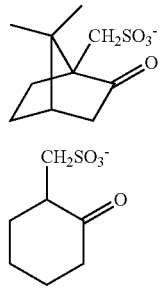

(5-1)

(5-2)

In the present invention, as the structural unit (a0-2), a structural unit represented by general formula (a0-2) shown below is particularly desirable.

[Chemical Formula 28]

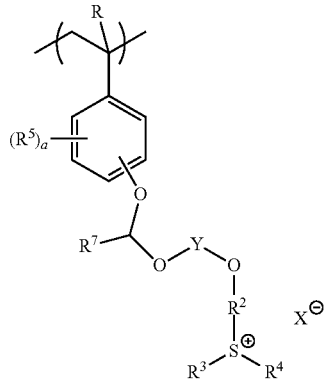

(a0-2)

In the formula, R represents a hydrogen atom, an alkyl group of 1 to 5 carbon atoms or a halogenated alkyl group of 1 to 5 carbon atoms; $R^2$ represents an arylene group which may have a substituent; each of $R^3$ and $R^4$ independently represents an organic group, wherein $R^3$ and $R^4$ may be mutually bonded to form a ring with the sulfur atom; $R^5$ represents a substituent; a represents an integer of 0 to 4; each $R^7$ independently represents a hydrogen atom or an alkyl group of 1 to 5 carbon atoms; Y represents a divalent linking group; and $X^-$ represents an anion moiety represented by any one of the aforementioned general formulas (1) to (5).

In general formula (a0-2), Y, $R^2$, $R^3$, $R^4$ and $X^-$ are the same as defined above.

In general formula (a0-2), R is the same as defined for R in general formula (a5-1), and is preferably a hydrogen atom or a methyl group.

In general formula (a0-2), a and $R^5$ are respectively the same as defined for a and $R^5$ in general formula (a5-1), and may be the same or different from a and $R^5$ in the aforementioned general formula (a5-1) or a and $R^5$ in the aforementioned general formula (a0-1).

In general formula (a0-2), $R^7$ represents a hydrogen atom or an alkyl group of 1 to 5 carbon atoms. Examples of the alkyl group of 1 to 5 carbon atoms represented by $R^7$ include the same alkyl group of 1 to 5 carbon atoms as those described above for R in general formula (a5-1), and a hydrogen atom or a methyl group is preferable.

Further, R⁷ may be the same or different from R⁷ in general formula (a0-1).

As the structural unit (a0-2), one type of structural unit may be used alone, or two or more types of structural units may be used in combination.

In the component (A1'), the amount of the structural unit (a0-2) based on the combined total of all structural units constituting the component (A1') is preferably 1 to 40 mol %, more preferably 3 to 30 mol %, and still more preferably 3 to 20 mol %. By ensuring the above-mentioned range, the lithography properties are improved.

(Structural Unit (a1))

The component (A1') may also have a structural unit (a1) derived from an acrylate ester having an acid dissociable, dissolution inhibiting group, other than the structural units (a0-1) and (a0-2), as long as the effects of the present invention are not impaired.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1') insoluble in an alkali developing solution prior to dissociation, and then following dissociation by action of acid, increases the solubility of the entire component (A1') in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). Tex this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

As an example of the aliphatic branched, acid dissociable, dissolution inhibiting group, for example, a group represented by the formula —C(R⁷¹)(R⁷²)(R⁷³) can be given (in the formula, each of R⁷¹ to R⁷³ independently represents a linear alkyl group of 1 to 5 carbon atoms). The group represented by the formula —C(R⁷¹)(R⁷²)(R⁷³) preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Further, these groups in which one or more hydrogen atoms have been removed from a monocycloalkane and groups in which one or more hydrogen atoms have been removed from a polycycloalkane may have part of the carbon atoms constituting the ring replaced with an ethereal oxygen atom (—O—).

Examples of aliphatic cyclic group-containing acid dissociable, dissolution inhibiting groups include (i) a group which has a tertiary carbon atom on the ring structure of a monovalent aliphatic cyclic group; and (ii) a group which has a branched alkylene group containing a tertiary carbon atom, and a monovalent aliphatic cyclic group to which the tertiary carbon atom is bonded.

Specific examples of (i) a group which has a tertiary carbon atom on the ring structure of a monovalent aliphatic cyclic group include groups represented by general formulas (1-1) to (1-9) shown below Specific examples of (ii) a group which has a branched alkylene group containing a tertiary carbon atom, and a monovalent aliphatic cyclic group to which the tertiary carbon atom is bonded include groups represented by general formulas (2-1) to (2-6) shown below.

[Chemical Formula 29]

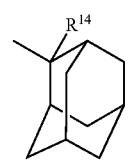

(1-1)

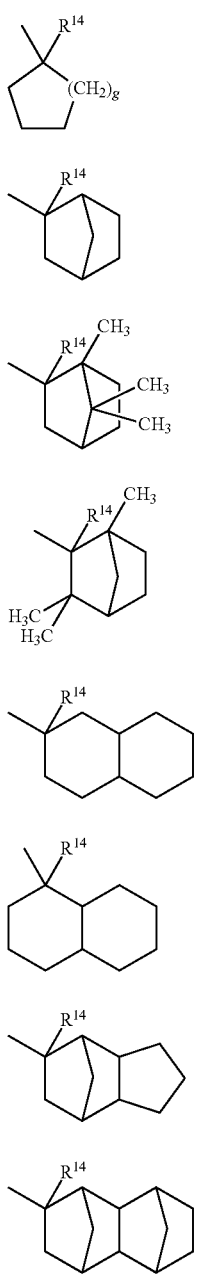

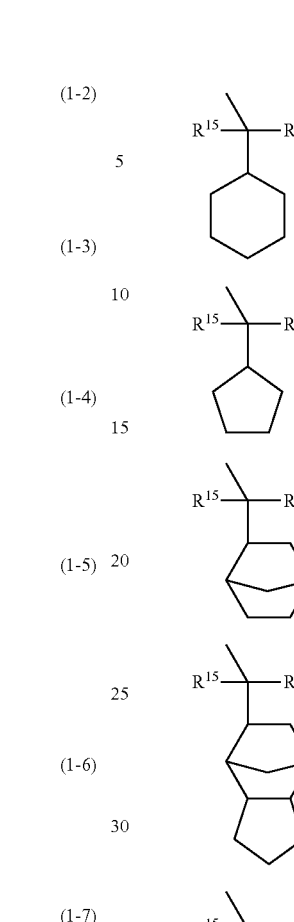

In the formulas above, R$^{14}$ represents an alkyl group; and g represents an integer of 0 to 8.

[Chemical Formula 30]

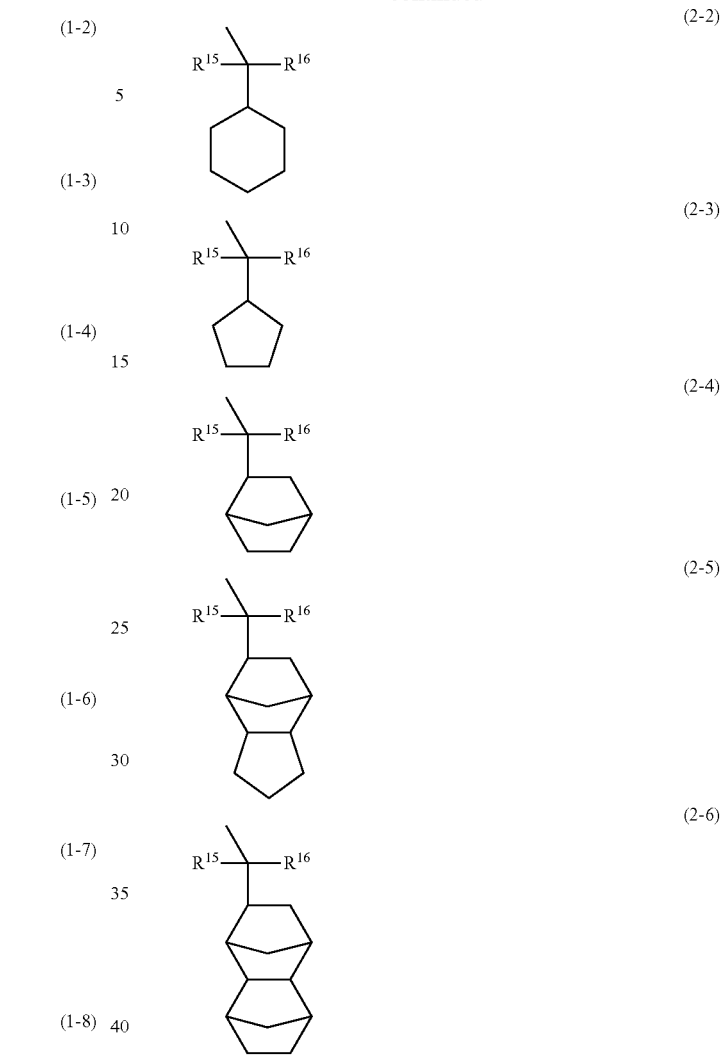

In the formulas, each of R$^{15}$ and R$^{16}$ independently represents an alkyl group (which may be linear or branched, and preferably has 1 to 5 carbon atoms).

As the alkyl group for R$^{14}$, a linear or branched alkyl group is preferable.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tent-butyl group, an isopentyl group and a neopentyl group, and an isopropyl group is particularly desirable.

g is preferably an integer of 0 to 3, more preferably 1 to 3, and still more preferably 1 or 2.

As the alkyl group for R$^{15}$ and R$'^{6}$, the same alkyl groups as those for R$^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 31]

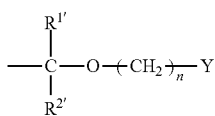

(p1)

In the formula, $R^{1\prime}$ and $R^{2\prime}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1) above, n is preferably an integer of 0 to 2, more preferably 0 or 1, and most preferably 0.

As the alkyl group of 1 to 5 carbon atoms for $R^{1\prime}$ and $R^{2\prime}$, the same alkyl groups of 1 to 5 carbon atoms as those described above for R in general formula (a5-1) can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below

[Chemical Formula 32]

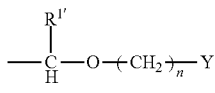

(p1-1)

In the formula, $R^{1\prime}$, n and Y are the same as defined above.

As the alkyl group of 1 to 5 carbon atoms for Y, the same alkyl groups of 1 to 5 carbon atoms as those for R in general formula (a5-1) can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 33]

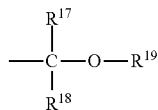

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these examples, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Specific examples of acetal-type acid dissociable, dissolution inhibiting groups include groups represented by formulas (p3-1) to (p3-12) shown below.

[Chemical Formula 34]

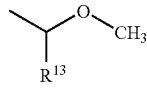

(p3-1)

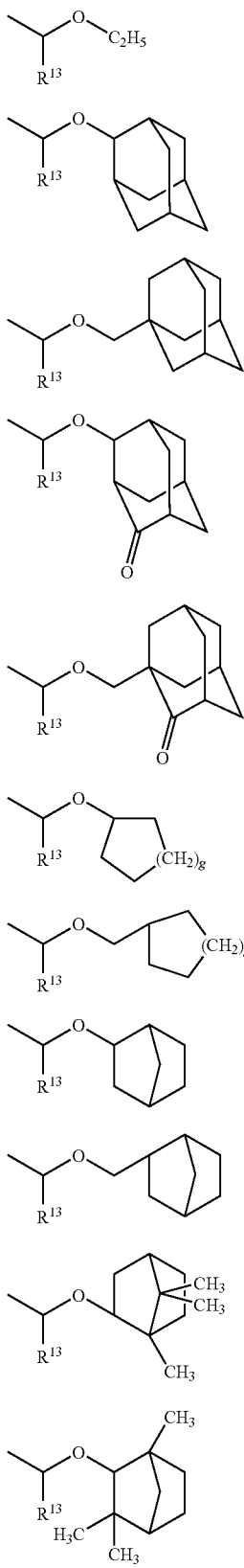

In the formulas above, R[13] represents a hydrogen atom or a methyl group; and g is the same as defined above.

As the structural unit (a1), it is preferable to use at least one member selected from the group consisting of structural units represented by formula (a1-0-1) shown below and structural units represented by formula (a1-0-2) shown below.

[Chemical Formula 35]

(a1-0-1)

In the formula, R represents a hydrogen atom, an alkyl group of 1 to 5 carbon atoms or a halogenated alkyl group of 1 to 5 carbon atoms; and $X^1$ represents an acid dissociable, dissolution inhibiting group.

[Chemical Formula 36]

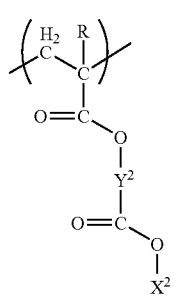
(a1-0-2)

In the formula, R represents a hydrogen atom, an alkyl group of 1 to 5 carbon atoms or a halogenated alkyl group of 1 to 5 carbon atoms; $X^2$ represents an acid dissociable, dissolution inhibiting group; and $Y^2$ represents a divalent linking group.

In general formula (a1-0-1), R is the same as defined for R in general formula (a5-1).

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above.

$X^2$ is the same as defined for $X^1$ in general formula (a1-0-1).

As examples of the divalent linking group for $Y^2$, the same groups as those described above for Y in general formula (a0-2) can be given.

As $Y^2$, the aforementioned alkylene group, a divalent aliphatic cyclic group or a divalent linking group containing a hetero atom is preferable. Among these, a divalent linking group containing a hetero atom is preferable, and a linear group containing an oxygen atom as a heteroatom, e.g., a group containing an ester bond is particularly desirable.

More specifically, a group represented by the aforementioned formula -A-O—B— or -A-C(=O)—O—B— is preferable, and a group represented by the formula —(CH$_2$)$_x$—C(=O)—O—(CH$_2$)$_y$— is particularly desirable.

x represents an integer of 1 to 5, preferably 1 or 2, and most preferably 1.

y represents an integer of 1 to 5, preferably 1 or 2, and most preferably 1.

Specific examples of the structural unit (a1) include structural units represented by general formulas (a1-1) to (a1-4) shown below.

[Chemical Formula 37]

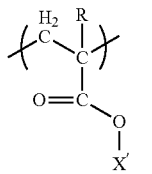
(a1-1)

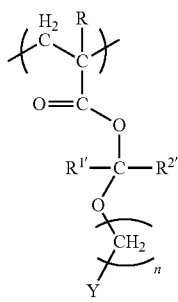
(a1-2)

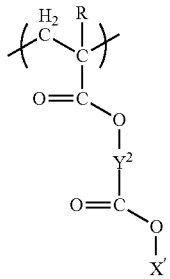
(a1-3)

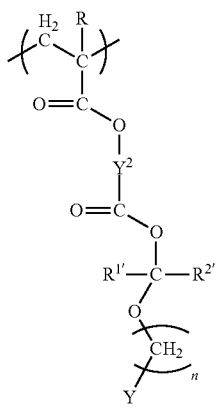
(a1-4)

In the formulas, X' represents a tertiary alkyl ester-type acid dissociable, dissolution inhibiting group; Y represents an alkyl group of 1 to 5 carbon atoms or an aliphatic cyclic group; n represents an integer of 0 to 3; $Y^2$ represents a divalent linking group; R is the same as defined above; and each of $R^{1'}$ and $R^{2'}$ independently represents a hydrogen atom or an alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for $X^1$.

As $R^{1'}$, $R^{2'}$, n and Y are respectively the same as defined for $R^{1'}$, $R^{2'}$, n and Y in general formula (p1) described above in connection with the "acetal-type acid dissociable, dissolution inhibiting group".

As examples of $Y^2$, the same groups as those described above for $Y^2$ in general formula (a1-0-2) can be given.

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 38]

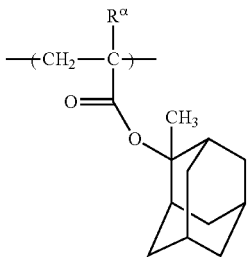
(a1-1-1)

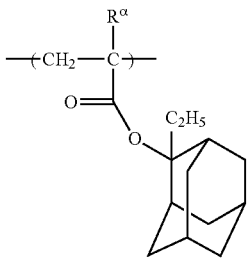
(a1-1-2)

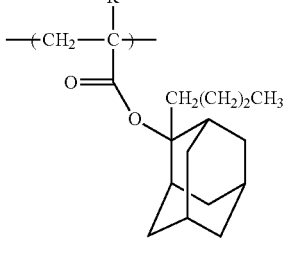
(a1-1-3)

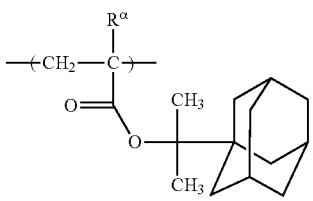
(a1-1-4)

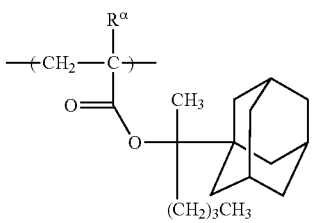
(a1-1-5)

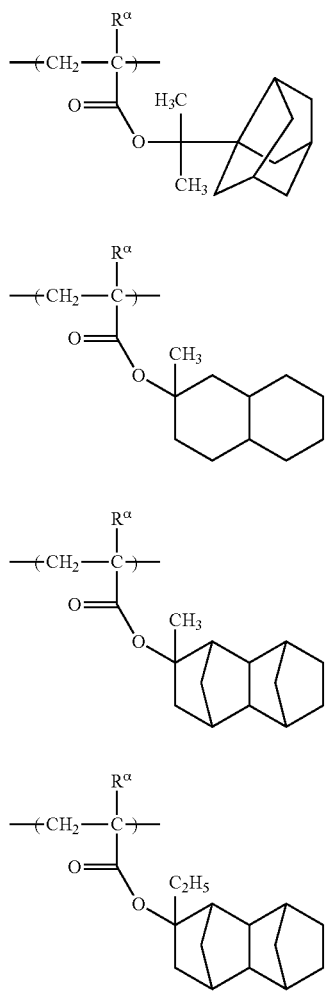
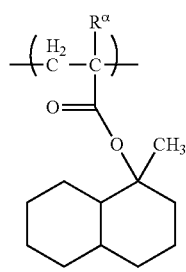
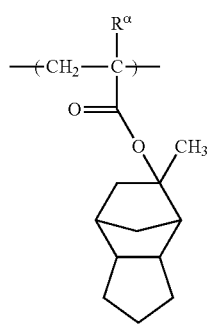
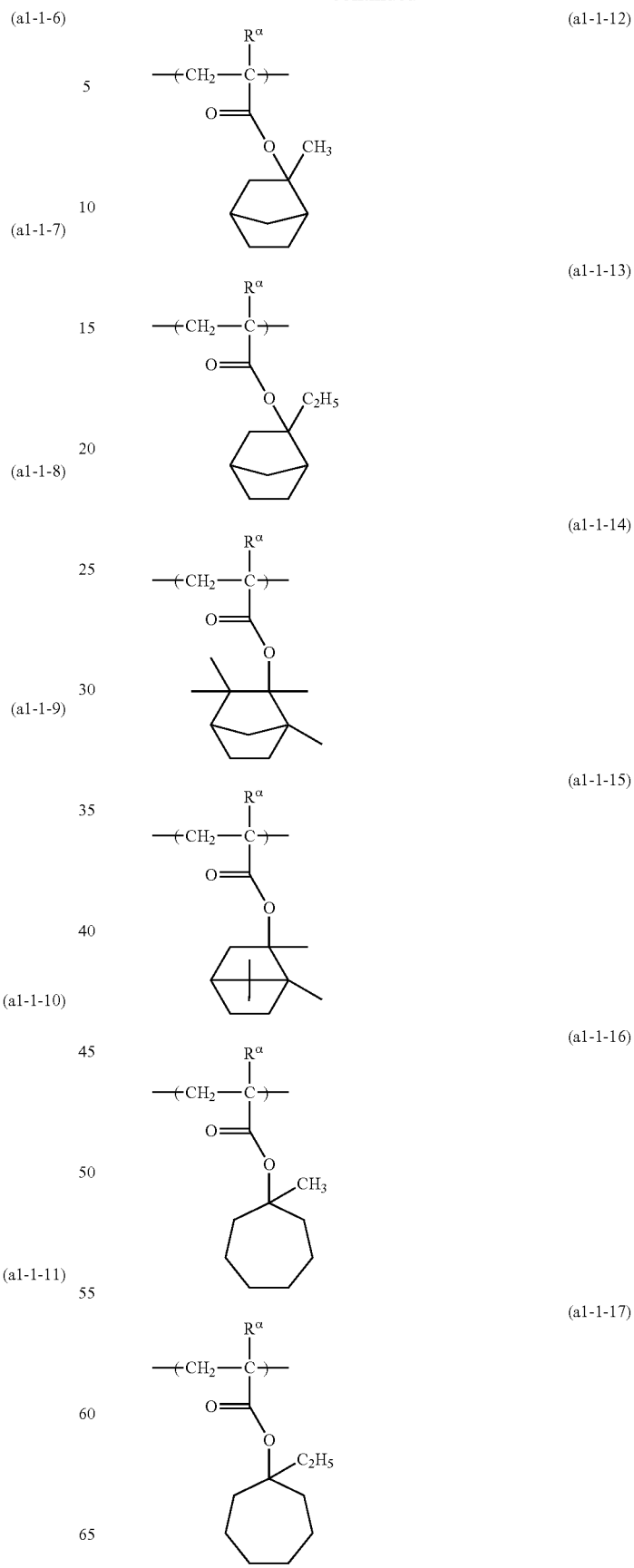

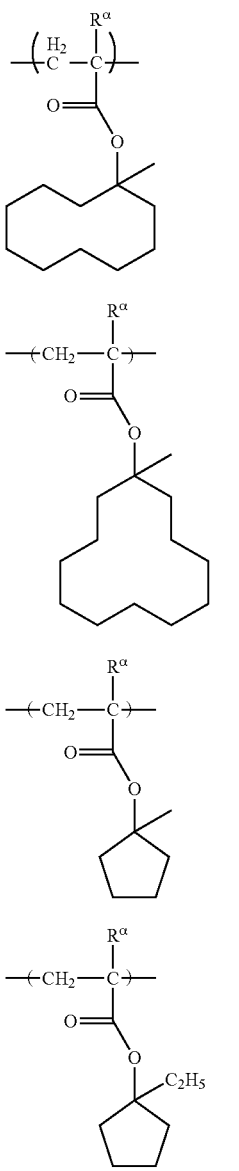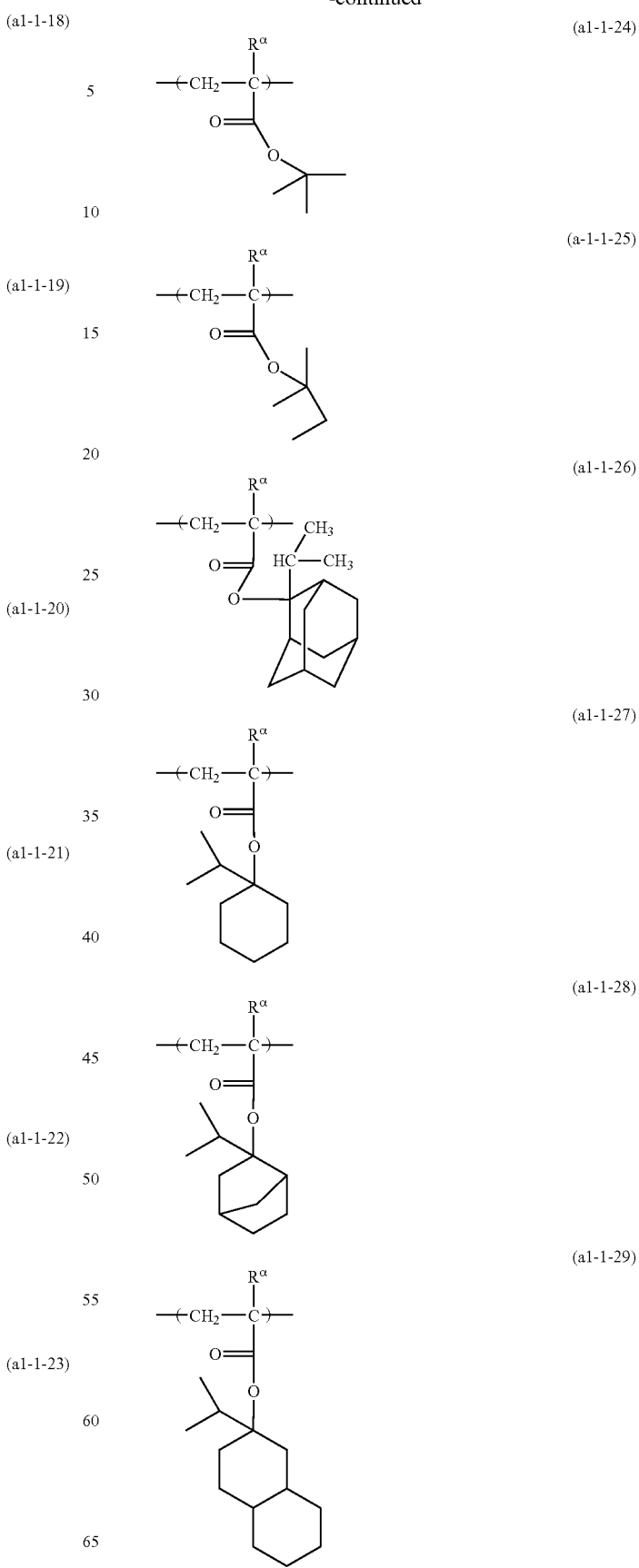

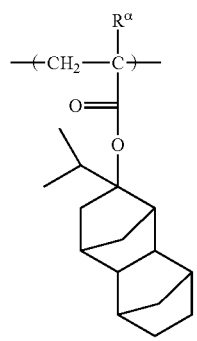
(a1-1-30)
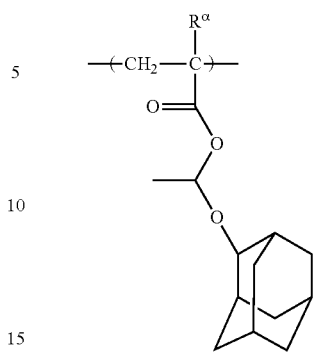
(a1-2-3)
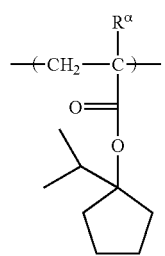
(a1-1-31)
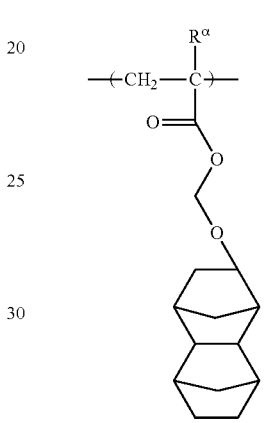
(a1-2-4)
[Chemical Formula 41]
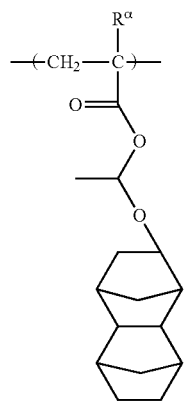
(a1-2-1)
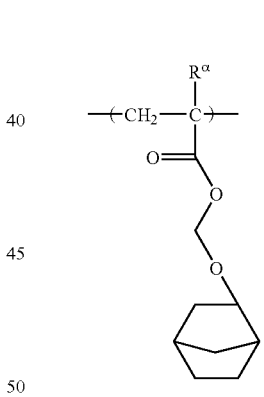
(a1-2-5)
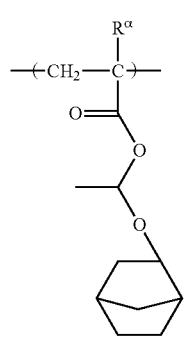
(a1-2-2)
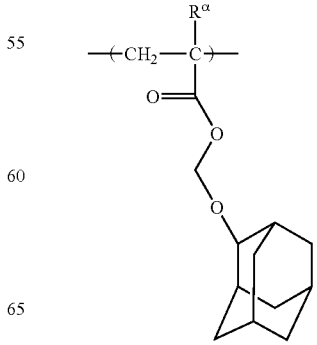
(a1-2-6)

-continued
(a1-2-7)
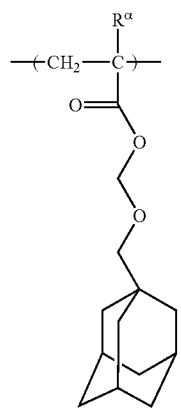
(a1-1-8)
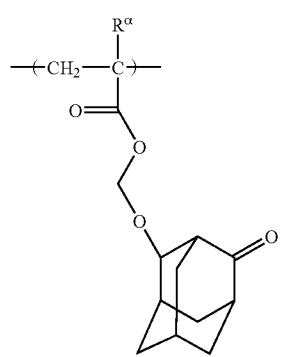
(a1-2-9)
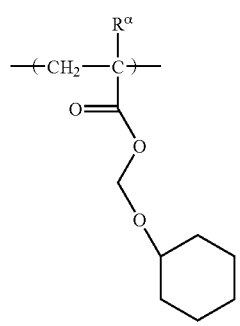
(a1-2-10)
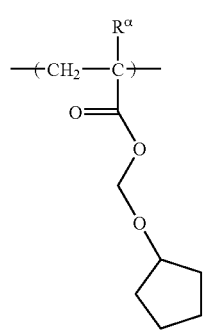
(a1-2-11)
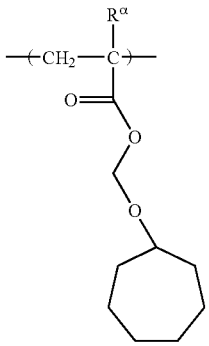
(a1-2-12)
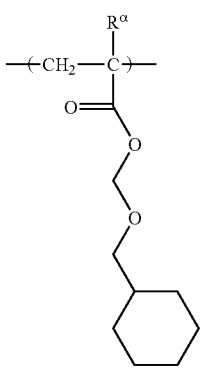
(a1-2-13)
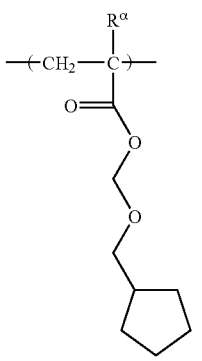
(a1-2-14)
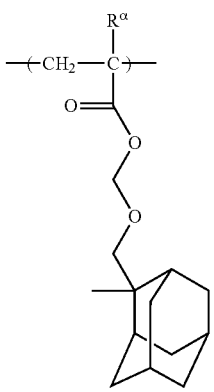

(a1-2-15) 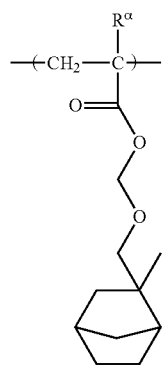
(a1-2-16) 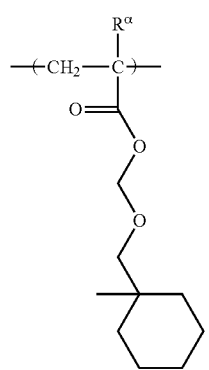
(a1-2-17) 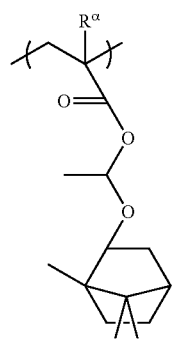
(a1-2-18) 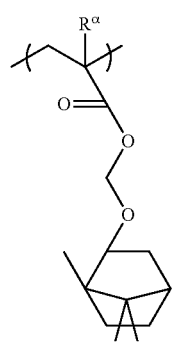
(a1-2-19) 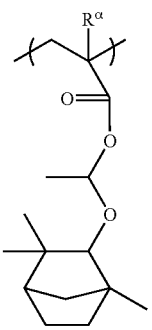
(a1-2-20) 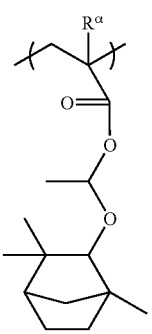
(a1-2-21) 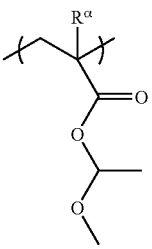
(a1-2-22) 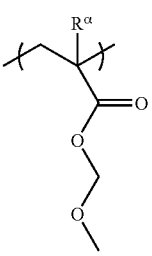
(a1-2-23)

-continued
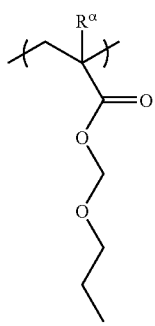
(a1-2-24)
[Chemical Formula 42]
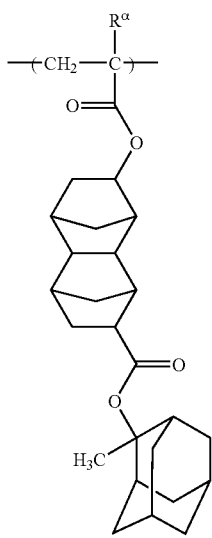
(a1-3-1)
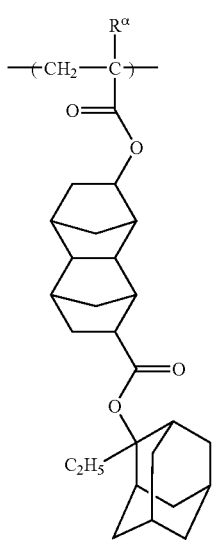
(a1-3-2)
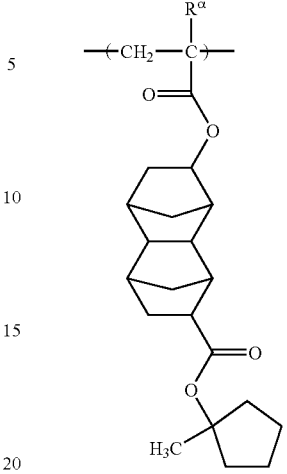
(a1-3-3)
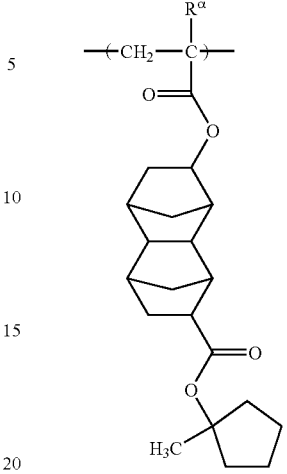
(a1-3-4)
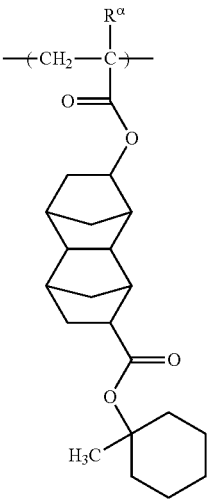
(a1-3-5)

(a1-3-6)
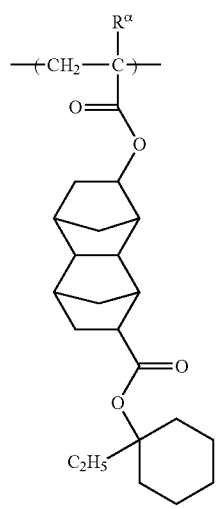
(a1-3-7)
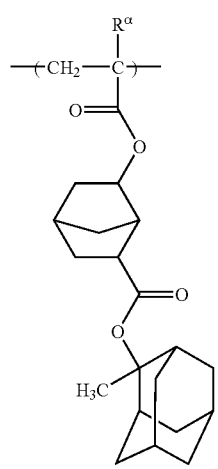
(a1-3-8)
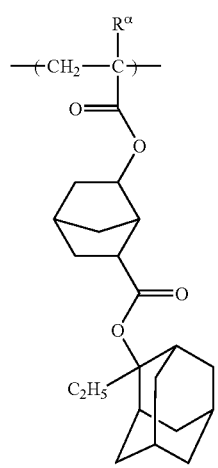
(a1-3-9)
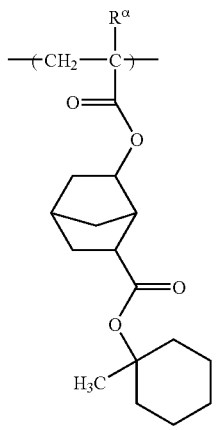
(a1-3-10)
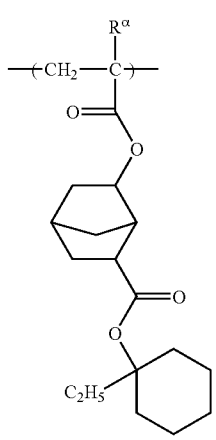
(a1-3-11)
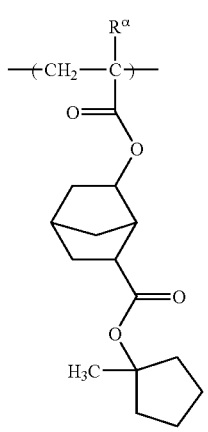

-continued
(a1-3-12) 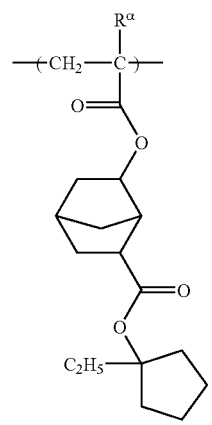
(a1-3-13) 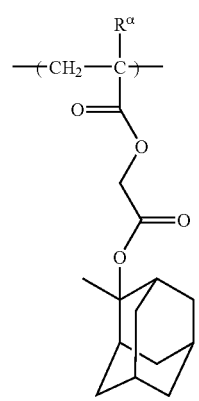
(a1-3-14) 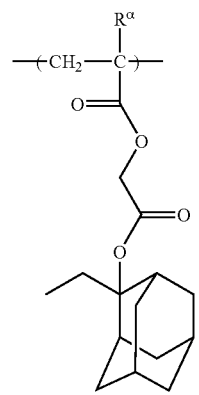
(a1-3-15) 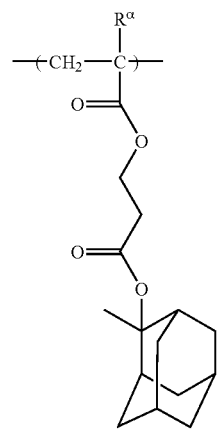
-continued
(a1-3-16) 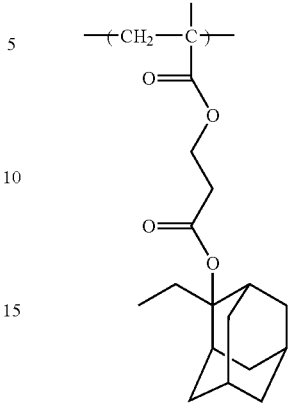
(a1-3-17) 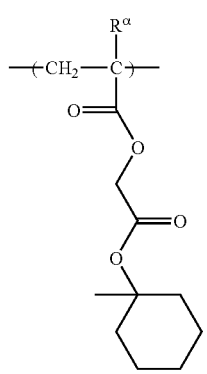
(a1-3-18) 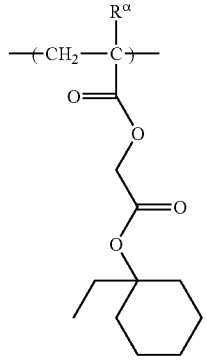
[Chemical Formula 43]
(a1-3-19) 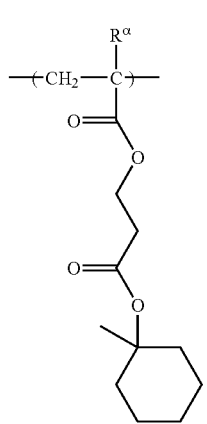

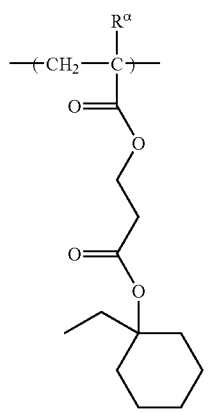 (a1-3-20)
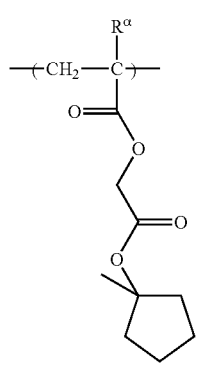 (a1-3-21)
(a1-3-22)
(a1-3-23)
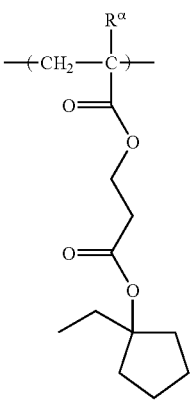 (a1-3-24)
[Chemical Formula 44]
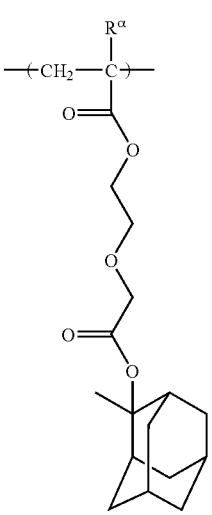 (a1-3-25)
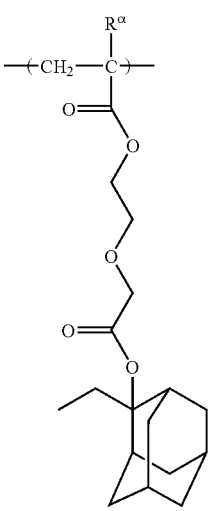 (a1-3-26)

-continued
(a1-3-27)
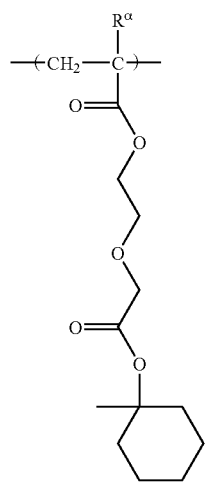
(a1-3-28)
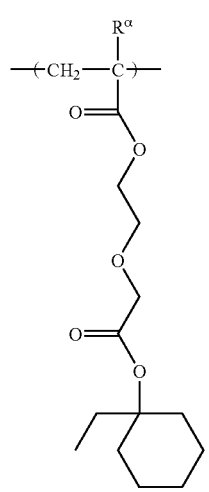
(a1-3-29)
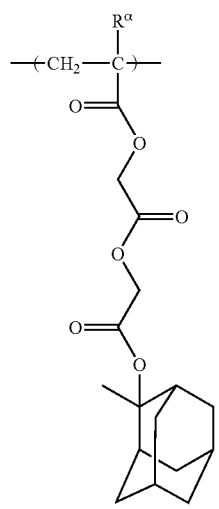
-continued
(a1-3-30)
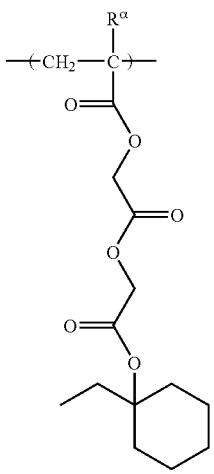
(a1-3-31)
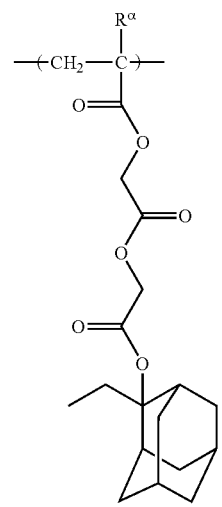
[Chemical Formula 45]
(a1-4-1)
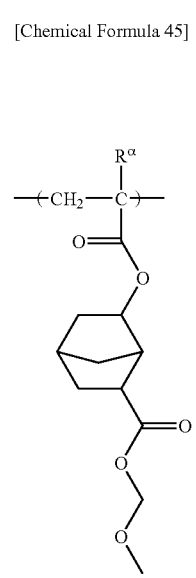

(a1-4-2)
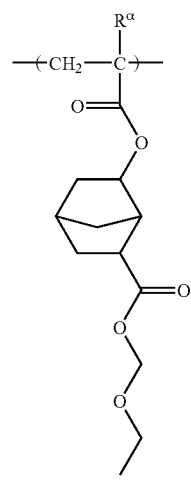
(a1-4-3)
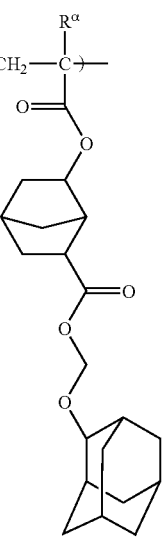
(a1-4-4)
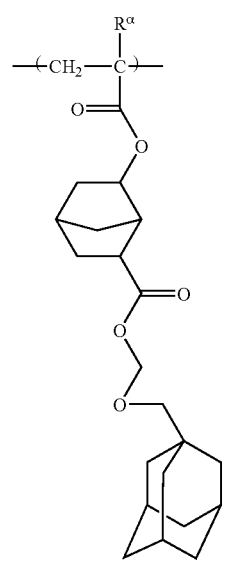
(a1-4-5)
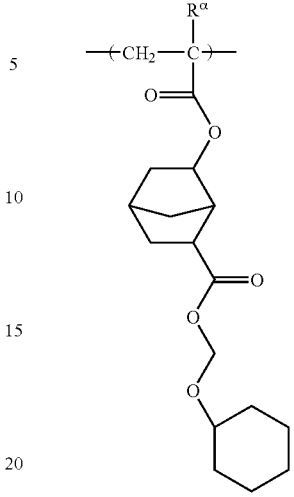
(a1-4-6)
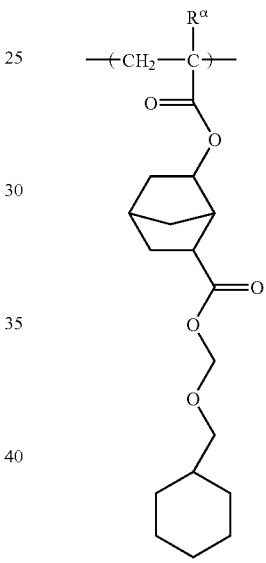
(a1-4-7)
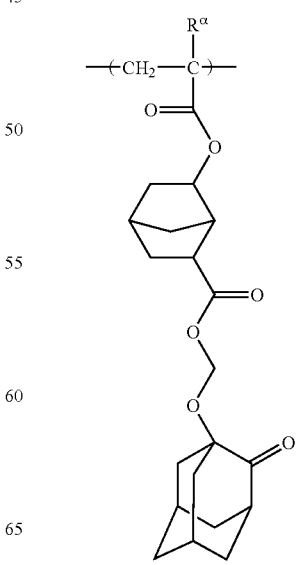

(a1-4-8) 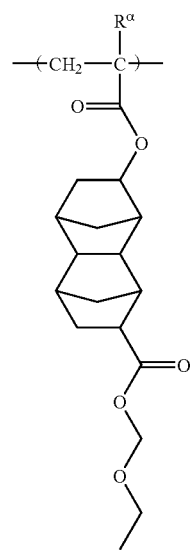
(a1-4-9) 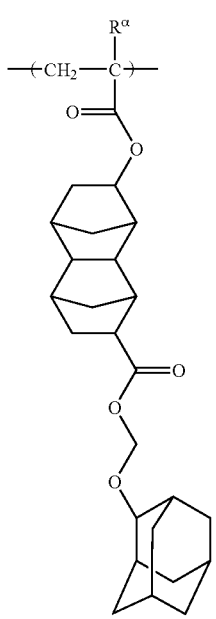
(a1-4-10) 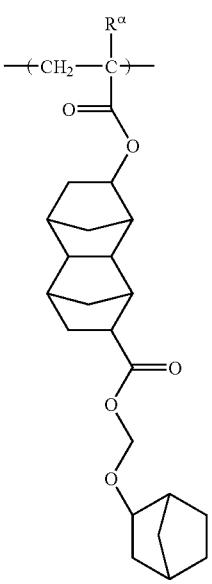
(a1-4-11) 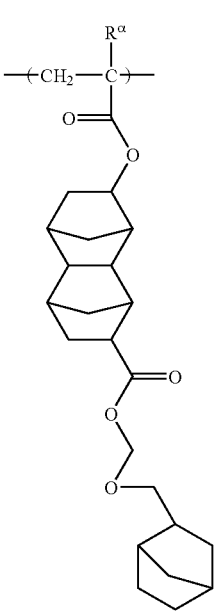

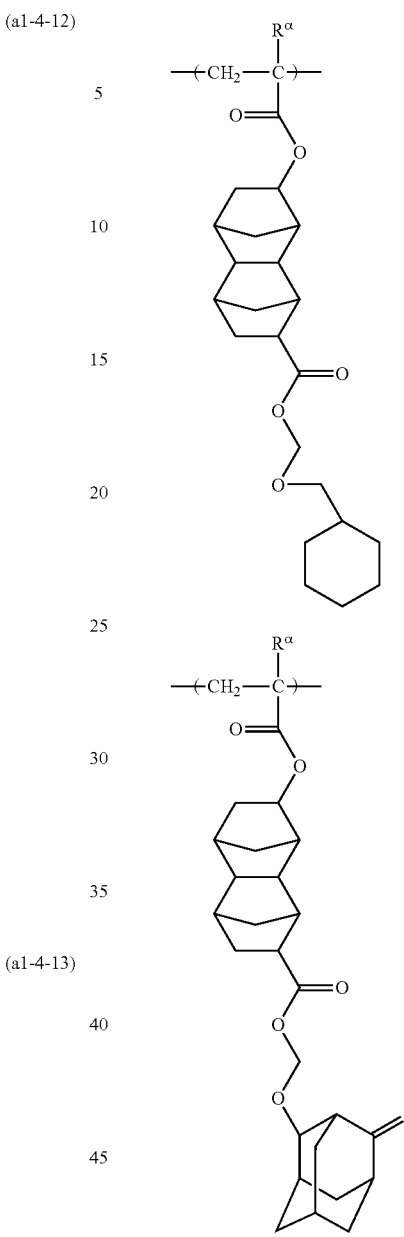

As the structural unit (a1), one type of structural unit may be used alone, or two or more types of structural units may be used in combination.

Among these, structural units represented by general formula (a1-1) or (a1-3) are preferable. More specifically, at least one structural unit selected from the group consisting of structural units represented by formulas (a1-1-1) to (a-1-1-4), (a1-1-20) to (a1-1-23) and (a1-3-25) to (a1-3-28) is more preferable.

Further, as the structural unit (a1), structural units represented by general formula (a1-1-01) shown below which includes the structural units represented by formulas (a1-1-1) to (a1-1-3), structural units represented by general formula (a1-1-02) shown below which includes the structural units represented by formulas (a1-1-16), (a1-1-17) and (a1-1-20) to (a1-1-23), structural units represented by general formula (a1-3-01) shown below which include the structural units represented by formulas (a1-3-25) and (a1-3-26), structural units represented by general formula (a1-3-02) shown below which include the structural units represented by formulas (a1-3-27) and (a1-3-28), and structural units represented by general formula (a1-3-03) shown below which include the structural units represented by formulas (a1-3-29) and (a1-3-30) are also preferable.

[Chemical Formula 46]

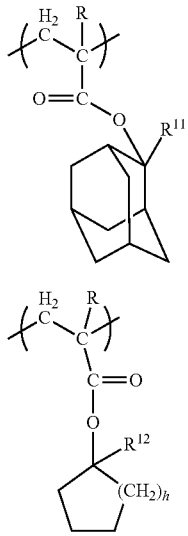

(a1-1-01)

(a1-1-02)

In the formulas, each R independently represents a hydrogen atom, an alkyl group of 1 to 5 carbon atoms or a halogenated alkyl group of 1 to 5 carbon atoms; $R^{11}$ represents an alkyl group of 1 to 5 carbon atoms; $R^{12}$ represents an alkyl group of 1 to 5 carbon atoms; and h represents an integer of 1 to 6.

In general formula (a1-1-01), R is the same as defined above. The alkyl group of 1 to 5 carbon atoms for $R^{11}$ is the same as defined for the alkyl group of 1 to 5 carbon atoms for R, and a methyl group, an ethyl group or a propyl group is preferable.

In general formula (a1-1-02), R is the same as defined above. The alkyl group of 1 to 5 carbon atoms for $R^{12}$ is the same as defined for the alkyl group of 1 to 5 carbon atoms for R, and a methyl group, an ethyl group or a propyl group is preferable. h is preferably 1 or 2, and most preferably 2.

[Chemical Formula 47]

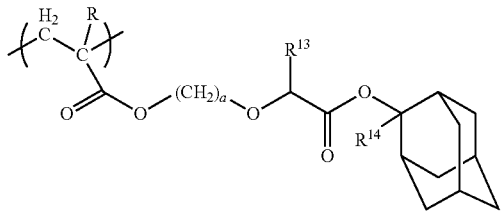

(a1-3-01)

In the formula, R represents a hydrogen atom, an alkyl group of 1 to 5 carbon atoms or a halogenated alkyl group of 1 to 5 carbon atoms; $R^{14}$ represents an alkyl group of 1 to 5 carbon atoms; $R^{13}$ represents a hydrogen atom or a methyl group; and a represents an integer of 1 to 10.

[Chemical Formula 48]

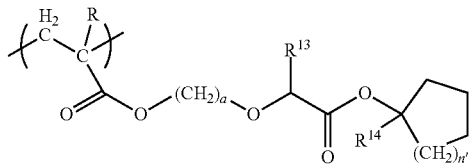

(a1-3-02)

In the formula, R represents a hydrogen atom, an alkyl group of 1 to 5 carbon atoms or a halogenated alkyl group of 1 to 5 carbon atoms; $R^{14}$ represents an alkyl group of 1 to 5 carbon atoms; $R^{13}$ represents a hydrogen atom or a methyl group; a represents an integer of 1 to 10; and n' represents an integer of 1 to 6.

[Chemical Formula 49]

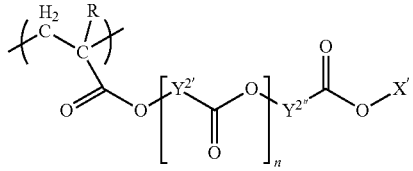

(a1-3-03)

In the formula, R is as defined above; each of $Y^{2\prime}$ and $Y^{2\prime\prime}$ independently represents a divalent linking group; X' represents an acid dissociable, dissolution inhibiting group; and n represents an integer of 1 to 3.

In general formulas (a1-3-01) to (a1-3-03), R is the same as defined above.

$R^{13}$ is preferably a hydrogen atom.

The alkyl group of 1 to 5 carbon atoms for $R^{14}$ is the same as defined for the alkyl group of 1 to 5 carbon atoms for R, and a methyl group or an ethyl group is preferable.

n' is preferably 1 or 2, and most preferably 2.

a is preferably an integer of 1 to 8, more preferably an integer of 2 to 5, and most preferably 2.

As the divalent linking group for $Y^{2\prime}$ and $Y^{2\prime\prime}$, the same groups as those described above for $Y^2$ in general formula (a1-3) can be used.

As $Y^{2\prime}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2\prime\prime}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable, dissolution inhibiting group for X', the same groups as those described above can be used. X' is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

n represents an integer of 0 to 3, preferably an integer of 0 to 2, more preferably 0 or 1, and most preferably 1.

When the structural unit is included in the component (A1') the amount of the structural unit (a1) based on the combined total of all structural units constituting the component (A1') is preferably 10 to 80 mol %, more preferably 20 to 70 mol %, and still more preferably 25 to 60 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a2))

The component (A1') may also have a structural unit (a2) derived from an acrylate ester containing a lactone-containing cyclic group, as long as the effects of the present invention are not impaired.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1') is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propiolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 50]

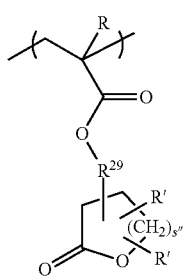
(a2-1)

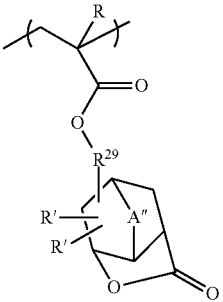
(a2-2)

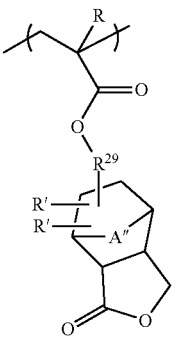
(a2-3)

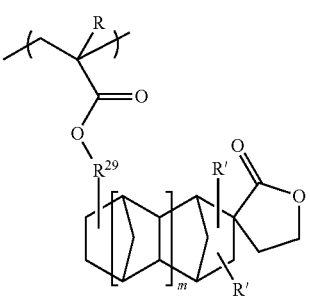
(a2-4)

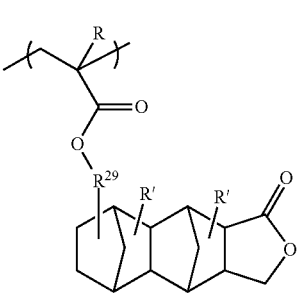
(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

Examples of the alkyl group of 1 to 5 carbon atoms for R' include a methyl group, an ethyl group, a propyl group, an n-butyl group and a tent-butyl group.

Examples of the alkoxy group of 1 to 5 carbon atoms for R' include a methoxy group, an ethoxy group, an n-propoxy group, an iso-propoxy group, an n-butoxy group and a tert-butoxy group In terms of industrial availability, X⁻ is preferably a hydrogen atom.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic cyclic group A in $Y^2$.

s" is preferably 1 or 2.

Specific examples of structural units represented by general formulas (a2-1) to (a2-5) are shown below. In the formulas shown below, $R^\alpha$ represents a hydrogen atom, a methyl group or a trifluoromethyl group.

[Chemical Formula 51]

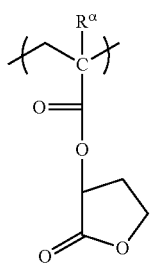

(a2-1-1)

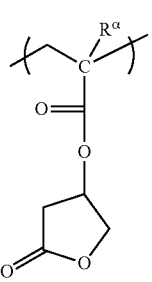

(a2-1-2)

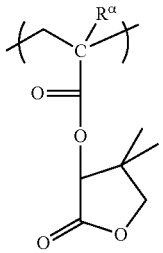

(a2-1-3)

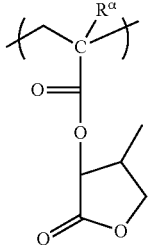

(a1-2-1-4)

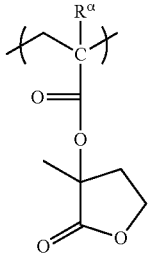

(a1-2-1-5)

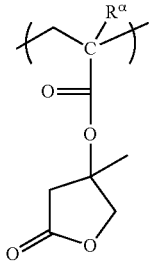

(a1-2-1-6)

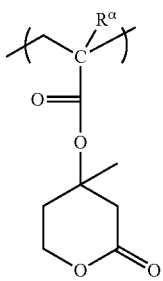

(a2-1-7)

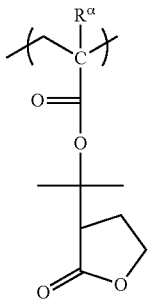

(a2-1-8)

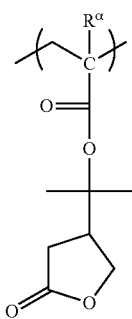
(a2-1-9)
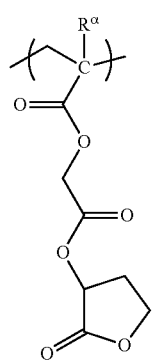
(a2-1-10)
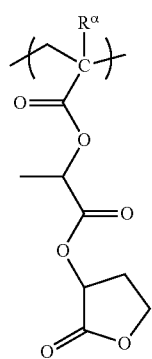
(a2-1-11)
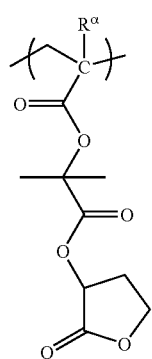
(a2-1-12)
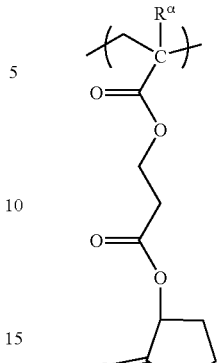
(a2-1-13)
[Chemical Formula 52]
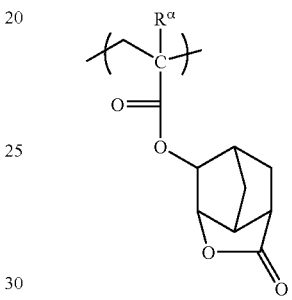
(a2-2-1)
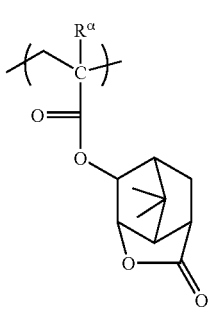
(a2-2-2)
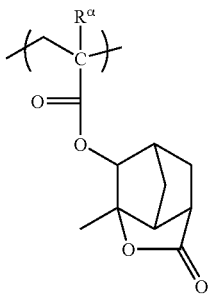
(a2-2-3)
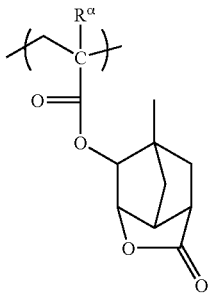
(a2-2-4)

(a2-2-5)
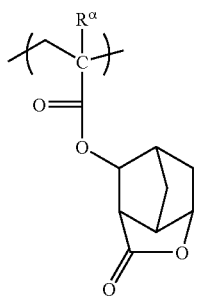
(a2-2-6)
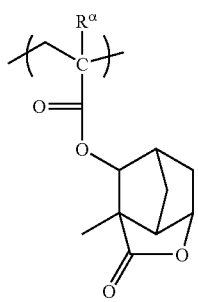
(a2-2-7)
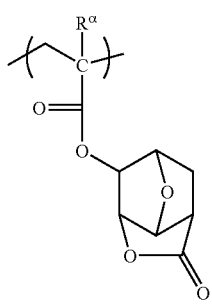
(a2-2-8)
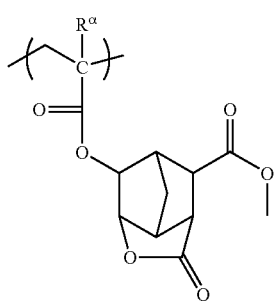
(a2-2-9)
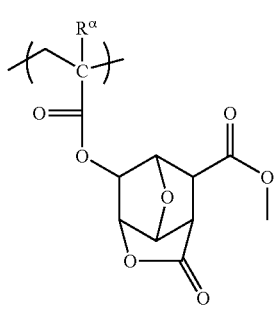
(a2-2-10)
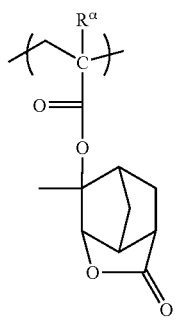
(a2-2-11)
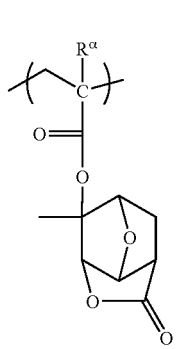
(a2-2-12)
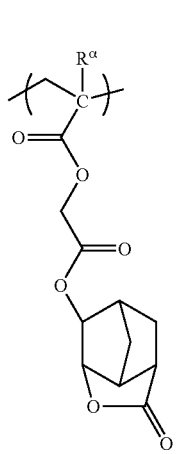
(a2-2-13)
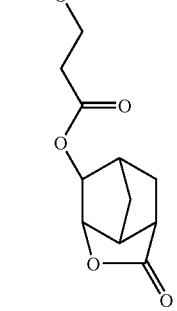

(a2-2-14)
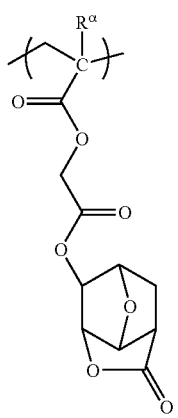
(a2-2-15)
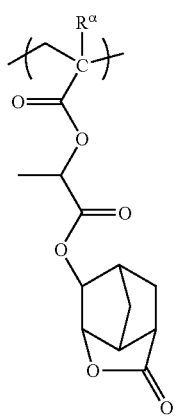
(a2-2-16)
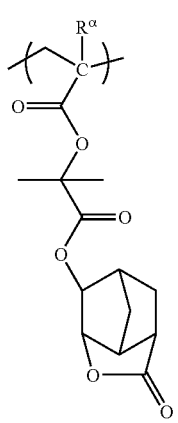
(a2-2-17)
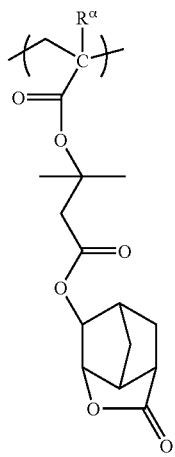
[Chemical Formula 53]
(a2-3-1)
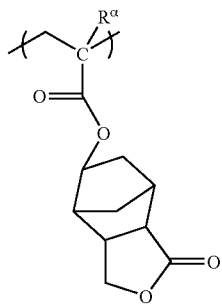
(a2-3-2)
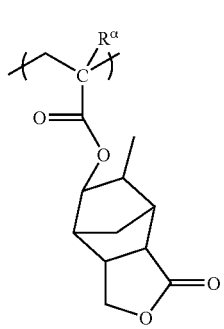
(a2-3-3)
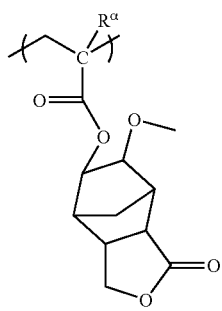

-continued
(a2-3-4)
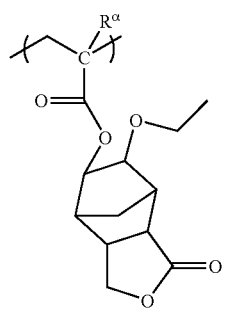
(a2-3-5)
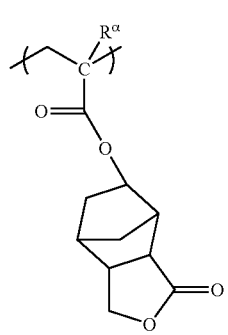
[Chemical Formula 54]
(a2-4-1)
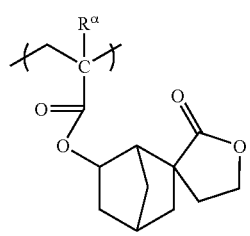
(a2-4-2)
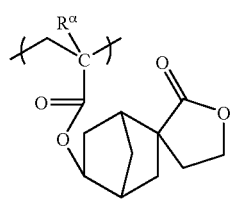
(a2-4-3)
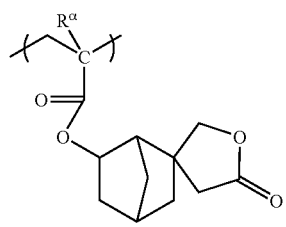
(a2-4-4)
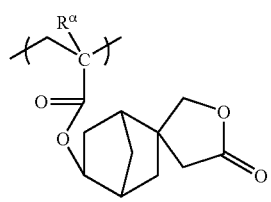
-continued
(a2-4-5)
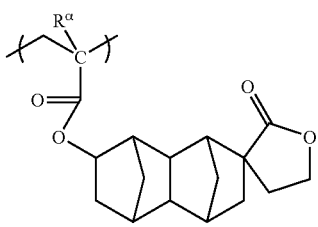
(a2-4-6)
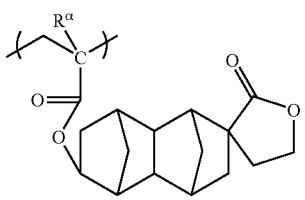
(a2-4-7)
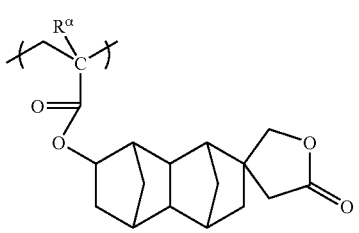
(a2-4-8)
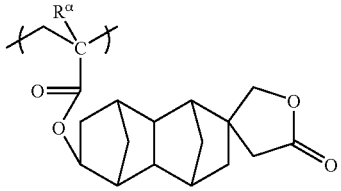
(a2-4-9)
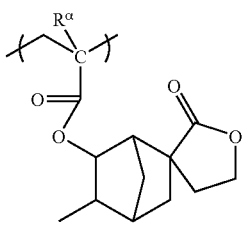
(a2-4-10)
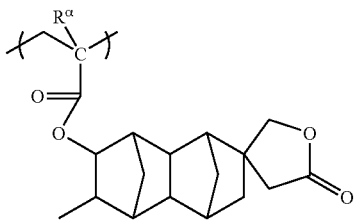

(a-2-4-11)
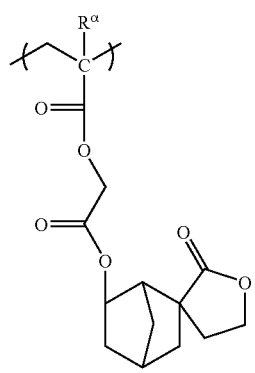
(a2-4-12)
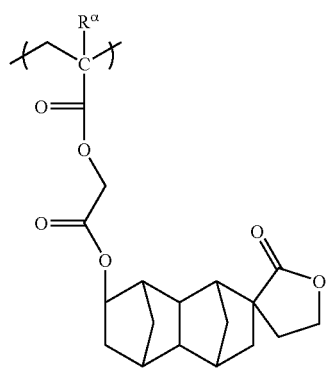
[Chemical Formula 55]
(a2-5-1)
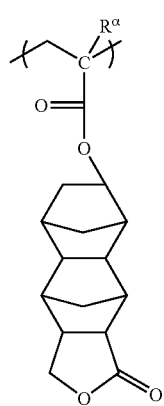
(a2-5-2)
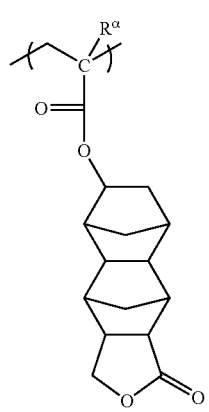
(a2-5-3)
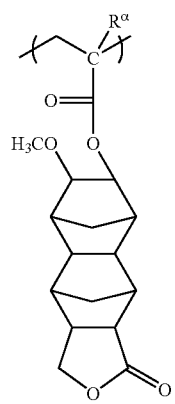
(a2-5-4)
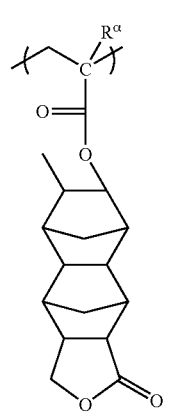
(a2-5-5)
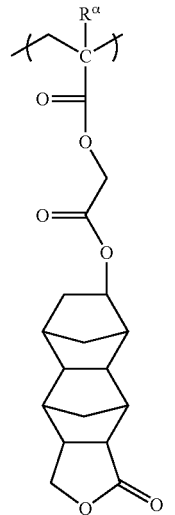

-continued

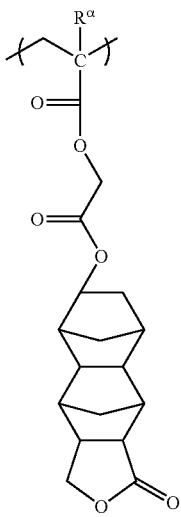

(a2-5-6)

In the component (A1'), as the structural unit (a2), one type of structural unit may be used, or two or more types may be used in combination.

As the structural unit (a2), at least one structural unit selected from the group consisting of formulas (a2-1) to (a2-5) is preferable, and at least one structural unit selected from the group consisting of formulas (a2-1) to (a2-3) is more preferable. Of these, it is preferable to use at least one structural unit selected from the group consisting of structural units represented by formulas (a2-1-1), (a2-2-1), (a2-2-7), (a2-3-1) and (a2-3-5).

When the structural unit (a2) is included in the component (A1'), in terms of improving the adhesion between a substrate and a resist film formed using a positive resist composition containing the component (A1) and increasing the compatibility with a developing solution, the amount of the structural unit (a2) within the component (A1'), based on the combined total of all structural units constituting the component (A1) is preferably 1 to 80 mol %, more preferably 5 to 75 mol %, and still more preferably 10 to 50 mol %.

(Structural Unit (a3))

The component (A1') may also have a structural unit (a3) derived from an acrylate ester containing a polar group-containing aliphatic hydrocarbon group, as long as the effects of the present invention are not impaired.

When the component (A1') includes the structural unit (a3), the hydrophilicity of the component (A') is enhanced, and hence, the compatibility of the component (A') with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 56]

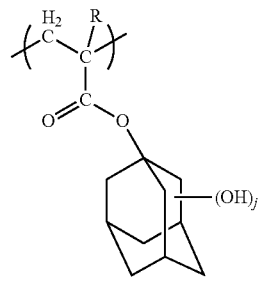

(a3-1)

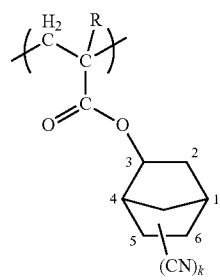

(a3-2)

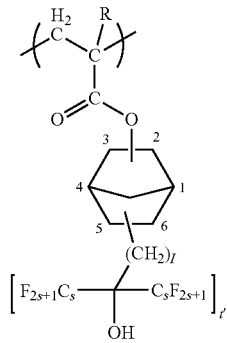

(a3-3)

In the formulas, R is the same as defined above; j represents an integer of 1 to 3; k represents an integer of 1 to 3; t' represents an integer of 1 to 3; l represents an integer of 1 to 5; and s represents an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group. j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

When the structural unit (a3) is included In the component (A1'), as the structural unit (a3), one type of structural unit may be used, or two or more types may be used in combination.

In the component (A1'), the amount of the structural unit (a3) based on the combined total of all structural units constituting the component (A1') is preferably 1 to 50 mol %, more preferably 5 to 40 mol %, and still more preferably 5 to 25 mol %.

(Structural Unit (a4))

The component (A1') may also have a structural unit other than the above-mentioned structural units (a5-1), (a0-1), (a0-2), (a1), (a2) and (a3), as long as the effects of the present invention are not impaired.

As the structural unit (a4), any other structural unit which cannot be classified as one of the above-mentioned structural units (a5-1), (a0-1), (a0-2), (a1), (a2) and (a3) can be used without any particular limitations, and any of the multitude of conventional structural units used within resist resins for ArF excimer lasers or KrF excimer lasers (and particularly for ArF excimer lasers) can be used.

Preferable examples of the structural unit (a4) include a structural unit derived from an acrylate ester which contains a non-acid-dissociable aliphatic polycyclic group, and is also derived from an acrylate ester, a structural unit derived from a styrene monomer and a structural unit derived from a vinyl-naphthalene monomer. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 57]

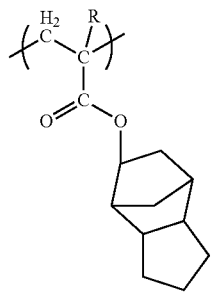

(a4-1)

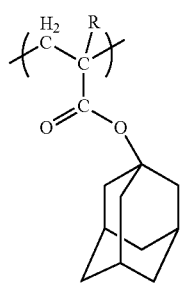

(a4-2)

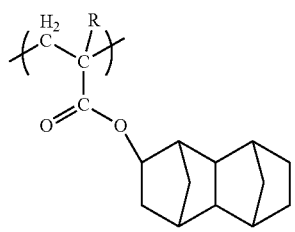

(a4-3)

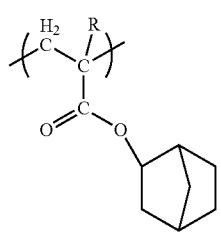

(a4-4)

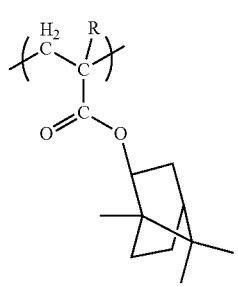

(a4-5)

In the formulas, R is the same as defined above.

When the structural unit (a4) is included in the component (A1'), the amount of the structural unit (a4) based on the combined total of all the structural units that constitute the component (A1') is preferably within the range from 1 to 30 mol %, and more preferably from 10 to 20 mol %.

In the present invention, the component (A1') is a copolymer having the structural units (a5-1), (a0-1) and (a0-2), and may further include (a1), (a2) and (a3).

Examples of such a copolymer include a copolymer consisting of the structural units (a5-1), (a0-1) and (a0-2). By virtue of the above combination of the structural units, EL margin and resist pattern shape can be improved.

In the present invention, as the component (A1'), a copolymer represented by general formula (A1'-11) shown below which includes three types of structural units is particularly desirable.

[Chemical Formula 58]

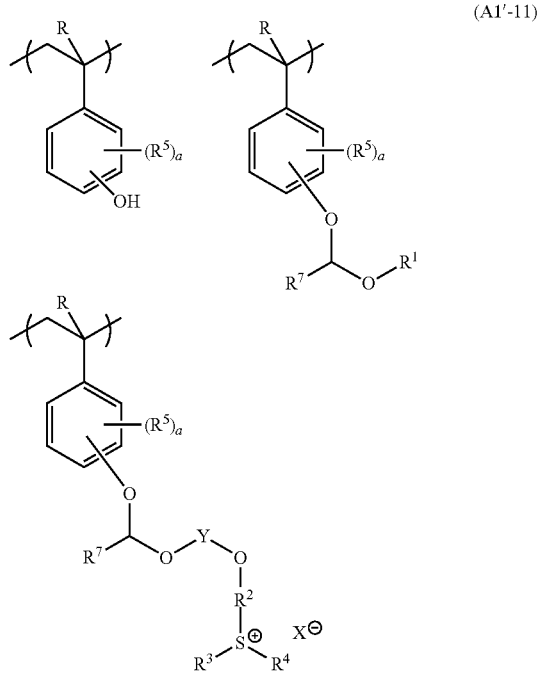

(A1'-11)

In the formulas, $R^5$, a, $R^7$, $R^1$, $R^2$, $R^3$, Y and $X^-$ are the same as defined above. Further, the plurality of R, $R^5$, $R^7$ and a may be the same or different from each other The weight average molecular weight (Mw) (the polystyrene equivalent value determined by gel permeation chromatography) of the component (A1') is not particularly limited, but is preferably 1,000 to 50,000, more preferably 1,500 to 30,000, and most preferably 2,500 to 25,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 4.0, and most preferably 1.0 to 3.0. Here, Mn is the number average molecular weight In the component (A'), as the component (A1'), one type may be used, or two or more types of compounds may be used in combination.

In the component (A'), the amount of the component (A1') based on the total weight of the component (A') is preferably 10 to 90% by weight, more preferably 20 to 80% by weight, and still more preferably 30 to 70% by weight.

In the resist composition of the present invention, the component (A') may contain "a base component which exhibits increased solubility in an alkali developing solution under action of acid" other than the component (A1') (hereafter, referred to as "component (A2)").

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally the aforementioned structural units (a2) to (a4) can be used.

As the component (A2), one type of resin may be used, or two or more types of resins may be used in combination.

In the resist composition of the present invention, the amount of the component (A') can be appropriately adjusted depending on the thickness of the resist film to be formed, and the like.

<Component (B)>

The positive resist composition of the present invention may further include an acid-generator component (B) (hereafter, referred to as "component (B)") which generates acid upon irradiation of radial rays.

When the positive resist composition of the present invention includes the component (B), as the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethaues; nitrobenzylsulfonate acid generators; iminosulfonate acid generators; and disulfone acid generators.

As an onium salt acid generator, a compound represented by general formula (b-1) or (b-2) shown below can be used.

[Chemical Formula 59]

(b-1)

(b-2)

In the formulas above, $R^{1''}$ to $R^{3''}$, $R^{5''}$ and $R^{6''}$ each independently represent an aryl group or alkyl group, wherein two of $R^{1''}$ to $R^{3''}$ may be bonded to each other to form a ring with the sulfur atom; and $R^{4''}$ represents an alkyl group, a halogenated alkyl group, an aryl group or an alkenyl group which may have a substituent, with the provision that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group or an alkyl group. In formula (b-1), two of $R^{1''}$ to $R^{3''}$ may be bonded to each other to form a ring with the sulfur atom.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom.

When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be given.

As preferable examples of the cation moiety for the compound represented by general formula (b-1), those represented by formulas (I-1-1) to (I-1-10) shown below can be given. Among these, a cation moiety having a triphenylmethane skeleton, such as a cation moiety represented by any one of formulas (I-1-1) to (I-1-8) shown below is particularly desirable.

In formulas (I-1-9) and (I-1-10), each of $R^9$ and $R^{10}$ independently represents a phenyl group or naphthyl group which may have a substituent, an alkyl group of 1 to 5 carbon atoms, an alkoxy group or a hydroxy group.

u is an integer of 1 to 3, and most preferably 1 or 2.

[Chemical Formula 60]

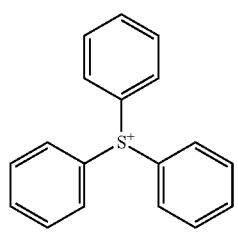
(I-1-1)

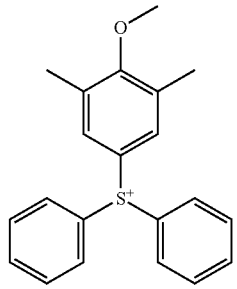
(I-1-2)

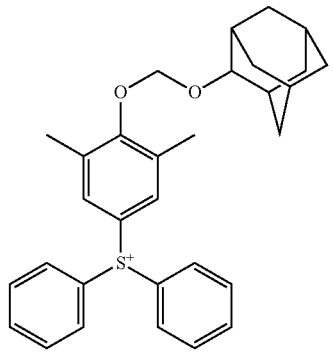
(I-1-3)

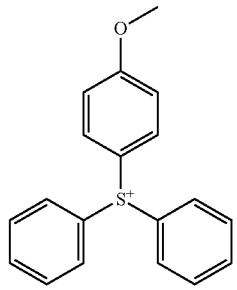
(I-1-4)

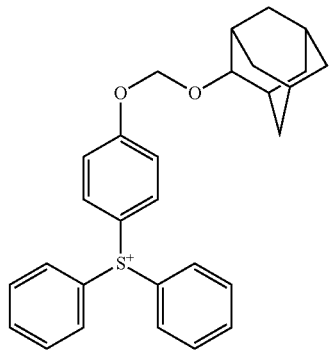
(I-1-5)

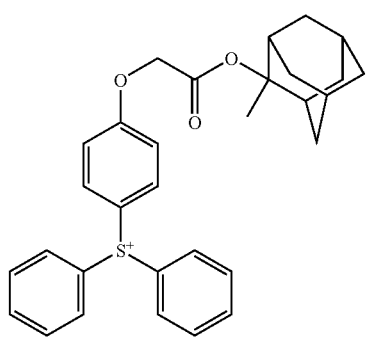
(I-1-6)

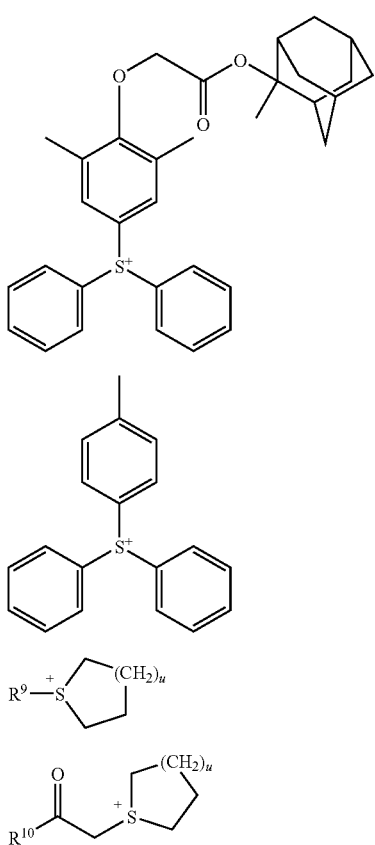

R[4"'] represents an alkyl group, a halogenated alkyl group, an aryl group or an alkenyl group which may have a substituent.

The alkyl group for R[4"'] may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for R[4"'], a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for R[4"'] is preferably an aryl group of 6 to 20 carbon atoms.

The alkenyl group for R[4"'] is preferably an alkenyl group of 2 to 10 carbon atoms.

With respect to R[4"'], the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

R[4"'] may have one substituent, or two or more substituents.

Examples of the substituent include a halogen atom, a hetero atom, an alkyl group, and a group represented by the formula $X^{00}$-$Q^8$- (in the formula, $Q^8$ represents a divalent linking group containing an oxygen atom; and $X^{00}$ represents a hydrocarbon group of 3 to 30 carbon atoms which may have a substituent).

Examples of halogen atoms and alkyl groups as substituents for R[4"'] include the same halogen atoms and alkyl groups as those described above with respect to the halogenated alkyl group for R[4"'].

Examples of hetero atoms include an oxygen atom, a nitrogen atom, and a sulfur atom.

In the group represented by formula $X^{00}$-$Q^8$-, $Q^8$ represents a divalent linking group containing an oxygen atom.

$Q^8$ may contain an atom other than an oxygen atom. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —R[91]—O—, —R[92]—O—C(=O)—, —C(=O)—O—R[93]—O—C(=O)— (in the formulas, each of R[91] to R[93] independently represents an alkylene group).

The alkylene group for R[91] to R[93] is preferably a linear or branched alkylene group, and preferably has 1 to 12 carbon atoms, more preferably 1 to 5, and most preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

$Q^1$ is preferably a divalent linking group containing an ester linkage or ether linkage, and more preferably a group of —R[91]—O—, —R[92]—O—C(=O)— or —C(=O)—O—R[93]—O—C(=O)—.

In the group represented by the formula $X^{00}$-$Q^8$-, the hydrocarbon group for $X^{00}$ is the same as defined for $X^0$ in formula (1) explained above in relation to the structural unit (a0-2).

In the present invention, as $X^{00}$, a cyclic group which may have a substituent is preferable.

The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the aforementioned formulas (L2) to (L5), (S3) and (S4) are preferable.

In the present invention, $R^{4'''}$ preferably has $X^{00}$-$Q^8$- as a substituent. In such a case, $R^{4'''}$ is preferably a group represented by the formula $X^{00}$-$Q^8$-$Y^1$— (in the formula, $Q^8$ and $X^{00}$ are the same as defined above; and $Y^1$ represents an alkylene group of 1 to 4 carbon atoms which may have a substituent, or a fluorinated alkylene group of 1 to 4 carbon atoms which may have a substituent).

In the group represented by the formula $X^{00}$-$Q^8$-$Y^1$—, as the alkylene group for $Y^1$, the same alkylene group as those described above for $Q^1$ in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5'''}$ and $R^{6'''}$ each independently represent an aryl group or alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same as the aryl groups for $R^{1'''}$ to $R^{3'''}$ can be used.

As the alkyl group for $R^{5'''}$ and $R^{6'''}$, the same as the alkyl groups for $R^{1'''}$ to $R^{3'''}$ can be used.

It is particularly desirable that both of $R^{5'''}$ and $R^{6'''}$ represents a phenyl group.

As $R^{4'''}$ in formula (b-2), the same groups as those mentioned above for $R^{4'''}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulforate, heptafluoropropanesulfonate or nonathorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetzahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by methanesulfonate, n-propanesulfonate, n-butanesulfonate, n-octanesulfonate, 1-adamantanesulfonate, or 2-norbornanesulfonate, d-camphor-10-sulfonate, benzenesulfonate, perfluorobenzenesulfonate, or p-toluenesulfonate.

Furthermore, onium salts in which the anion moiety of these onium salts are replaced by an anion moiety represented by any one of formulas (1) to (5) explained above in relation to the aforementioned structural unit (a0-2) can be used.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 61]

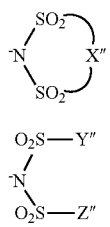

(b-3)

(b-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, an onium salt-based acid generator in which the anion moiety ($R^{4"}SO_3^-$) in general formula (b-1) or (b-2) has been replaced with $R^{8"}$—$COO^-$ (in the formula, $R^{8"}$ represents an alkyl group or a fluorinated alkyl group) can also be used (the cation moiety is the same as that in general formula (b-1) or (b-2)).

As $R^{8"}$, the same groups as those described above for $R^{4"}$ can be used.

Specific examples of the group represented by the formula "$R^{8"}$—$COO^-$" include a trifluoroacetate ion, an acetate ion, and a 1-adamantanecarboxylic acid ion.

Furthermore, as an onium salt-based acid generator, a sulfonium salt having a cation moiety represented by general formula (b-5) or (b-6) shown below may be used.

[Chemical Formula 62]

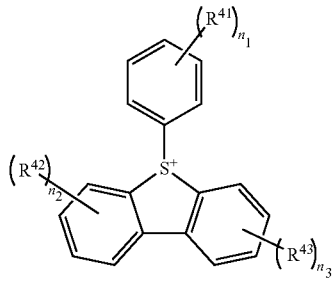

(b-5)

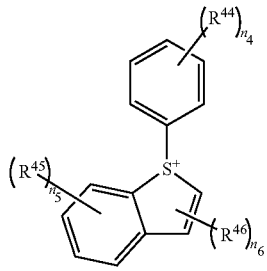

(b-6)

In formulas (b-5) and (b-6) above, each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for cilium salt-based acid generators which have been proposed may be used. Examples of such anion moieties include fluorinated alkylsulfonic acid ions such as anion moieties ($R^{4"}SO_3^-$) for onium salt-based acid generators represented by general formula (b-1) or (b-2) shown above; and anion moieties represented by general formula (b-3) or (b-4) shown above.

In the present description, an oximesulfonate-based acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 63]

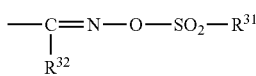

(B-1)

In formula (B-1), each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sultanate acid generator include compounds represented by general formula (B-2) or (B-3) shown below.

[Chemical Formula 64]

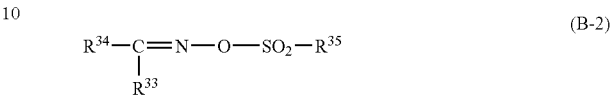

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 65]

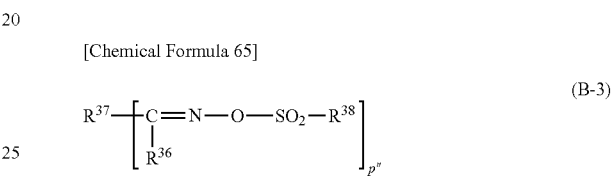

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1. to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an, alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (3-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxylmino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyhimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxylmino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoramethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 20041074242A2 (Examples 1 to 40 described at pages 65 to 85) may be preferably used.

Furthermore, as preferable examples, the following can be used.

[Chemical Formula 66]

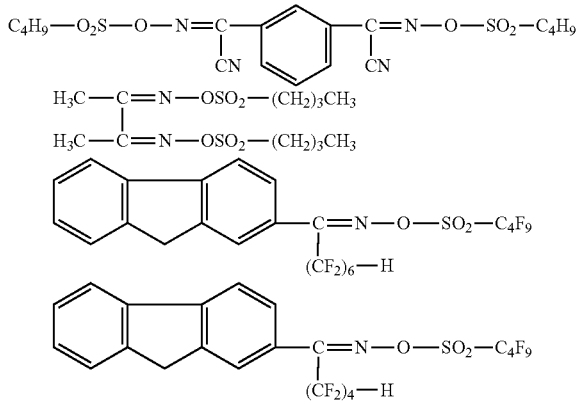

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types of acid generators may be used in combination.

As the component (B), an onium salt having a fluorinated alkylsulfonic acid ion as the anion moiety is preferable.

In the positive resist composition of the present invention, the amount of the component (B) relative to 100 parts by weight of the component (A') is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>

The positive resist composition of the present invention may further contain a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable. The term "aliphatic cyclic group" refers to a monocyclic group or polycyclic group that has no aromaticity. An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and laurildiethanolamine. Among these, trialkylamines and/or alkylalcoholamines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

Examples of other aliphatic amines include tris(2-methoxymethoxyethyl)amine, tris {2-(2-methoxyethoxy)ethyl}amine, tris{2-(2-methoxyethoxymethoxy)ethyl}amine, tris {2-(1-methoxyethoxy)ethyl}amine, tris {2-(1-ethoxyethoxy)ethyl}amine, tris{2-(1-ethoxypropoxy)ethyl}amine and tris[2-{2-(2-hydroxyethoxy)ethoxy}ethyl]amine.

These compounds can be used either alone, or in combinations of two or more different compounds.

The component (D) is typically used in an amount within a range from 0.01 to 5.0 parts by weight, relative to 100 parts by weight of the component (A'). When the amount of the component (D) is within the above-mentioned range, the shape of the resist pattern and the post exposure stability of the latent image formed by the pattern-wise exposure of the resist layer are improved.

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphoric acid and phosphinic acid. Among these, phosphoric acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphoric acid derivatives include phosphoric acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A').

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cycloheptanone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably ha the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the FGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

In the positive resist composition of the present invention, by directly incorporating the structural unit (a0-2) which generates acid upon exposure into the base component (A'), the heat resistance can be improved, as compared to a conventional resist composition in which, the base component and the acid-generator component are separately used. As a result of the improvement in the heat resistance, the latitude of the bake temperature during resist pattern formation becomes large, thereby improving the lithography properties.

Further, according to the resist composition of the present invention, various lithography properties such as line width roughness (LWR), exposure latitude (EL) and resolution are improved when an exposure source such as extreme ultraviolet (EUV) is used. Therefore, the resist composition of the present invention is particularly desirable for use in a method including a step of subjecting the resist film to exposure with BUY as an exposure source.

The reason why the above effects can be obtained has not been elucidated yet, but one of the factors is presumed that by branching the acid-generator component from the base component, outgas can be suppressed as compared to a conventional resist composition, thereby homogenizing the materials inside the resist film.

Further, the anion moiety contained in the structural unit (a0-2), as represented by any one of the aforementioned formulas (1) to (5), has a three-dimensionally bulky structure. By virtue of the three-dimensionally bulky structure, it is presumed that diffusion of the anion moiety (acid) within a resist film can be chemically and physically suppressed, as compared to a conventional anion moiety of an acid generator such as nonafluorobutanesulfonate. Hence, it is presumed that by including such anion moiety, acid generated in exposed regions can be suppressed from diffusing into unexposed regions, and as a result, the difference in alkali solubility between unexposed portions and exposed portions (i.e., dissolution contrast) can be improved, thereby improving the resist pattern shape or the exposure margin (EL).

In addition, the acid dissociable, dissolution inhibiting group contained in the structural unit (a0-1) has a bulky structure, as compared to a conventional acetal-type acid dissociable, dissolution inhibiting group. Therefore, the acid dissociable, dissolution inhibiting group is less likely to be vaporized after dissociation, so that outgas can be suppressed. As a result, contamination and the like of the exposure apparatus can be reduced. Moreover, it becomes possible to suppress thickness loss.

<<Method of Forming a Resist Pattern>>

The method of forming a resist pattern according to the present invention includes: applying a positive resist composition of the present invention to a substrate to form a resist film on the substrate; conducting exposure of the resist film; and developing the resist film to form a resist pattern.

More specifically, the method for fanning a resist pattern according to the present invention can be performed, for example, as follows.

Firstly, a positive resist composition according to the present invention is applied onto a substrate using a spinner or the like, and a prebake (post applied bake (PAB)) is conducted at a temperature of 80 to 150° C. for 40 to 120 seconds, preferably 60 to 90 seconds, to form a resist film. Following selective exposure of the thus formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, FEB (post exposure baking) is conducted under temperature conditions of 80 to 150° C. for 40 to 120 seconds, and preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays, The positive resist composition of the present invention is effective to KrF excimer laser, ArF excimer laser, EB and EUV, and more effective to ArF excimer laser, EB or EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than, the refractive index of air, and the exposure (immersion exposure) is conducted in this state.

The immersion medium preferably exhibits a refractive index larger than the refractive index of air but smaller than the refractive index of the resist film, to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

<<Polymeric Compound>>

The compound according to the third aspect of the present invention is a polymeric compound including a structural unit (a5-1) represented by general formula (a5-1) shown below, a structural unit (a0-1) represented by general formula (a0-1) shown below and a structural unit (a0-2) that generates acid upon exposure, the structural unit (a0-2) containing a group represented by general formula (a0-2') shown below. The polymeric compound is the same as the component (A1') contained in the component (A') of the resist composition according to the first aspect.

[Chemical Formula 67]

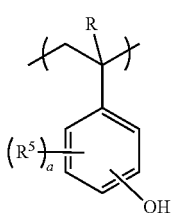

(a5-1)

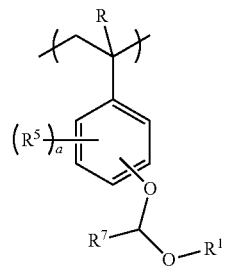

(a0-1)

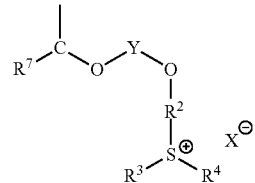

(a0-2')

In the formulas, each, R independently represents a hydrogen atom, an alkyl group of 1 to 5 carbon atoms or a halogenated alkyl group of 1 to 5 carbon atoms; $R^1$ represents a hydrocarbon group of at least 10 carbon atoms; $R^2$ represents an arylene group which may have a substituent; each of $R^3$ and $R^4$ independently represents an organic group, wherein $R^3$ and $R^4$ may be mutually bonded to form a ring with the sulfur atom; $R^5$ represents a substituent; a represents an integer of 0 to 4; each $R^7$ independently represents a hydrogen atom or an alkyl group of 1 to 5 carbon atoms; Y represents a divalent linking group; and $X^-$ represents an anion moiety represented by any one of general formulas (1) to (5) shown below.

[Chemical Formula 68]

 (1)

 (2)

 (3)

 (4)

 (5)

In the formulas, each $X^0$ independently represents a hydrocarbon group of 3 to 30 carbon atoms which may have a substituent; $Q^1$ represents a divalent linking group containing a carbonyl group; each p independently represents an integer of 1 to 3; $Q^2$ represents a single bond or an alkylene group; $X^{10}$ represents a hydrocarbon group of 1 to 30 carbon atoms which may have a substituent; $Q^3$ represents a single bond or a divalent linking group; $Y^{10}$ represents —C(=O)— or —SO$_2$—; $Y^{11}$ represents an alkyl group of 1 to 10 carbon atoms which may have a substituent or a fluorinated alkyl group of 1 to 10 carbon atoms which may have a substituent; $A^-$ represents a carboanion; Y represents a cyclic alkyl group of 4 to 20 carbon atoms which may have an oxygen atom (=O) as a substituent; and q represents 0 or 1.

The explanation of the polymeric compound of the present invention is the same as that of the aforementioned component (A1').

<Production Method of Compound Having Partial Structure of Structural Unit (a0-2)>

Hereinbelow, the production method of a compound having a partial structure of the structural unit (a0-2) will be described, mainly focusing on the anion moiety of the structural unit (a0-2).

(Anion Moiety (1))

A compound having an anion represented by general formula (1-1-1) as the anion moiety, a compound having an anion represented by general formula (1-1-2) as the anion moiety, a compound having an anion represented by general formula (1-1-3) as the anion moiety, and a compound having an anion represented by general formula (1-1-4) as the anion moiety can be produced as follows.

[Production Method of Compound Having an Anion Moiety Represented by General Formula (1-1-1)]

A compound (1-1-0) having an anion moiety represented by general formula (1-1-1) can be produced by reacting a compound (1-1-04) represented by general formula (1-1-0-1) shown below with a compound (0-0) represented by general formula (0-0) shown below.

[Chemical Formula 69]

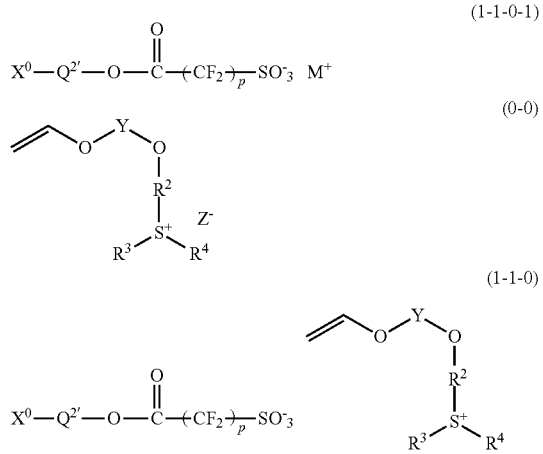

In formulas (1-1-0-1) and (0-0), $X^0$, $Q^{2'}$ and p are respectively the same as defined for $X^0$, $Q^{2'}$ and p in the aforementioned formula (1-1-1).

In formula (0-0), Y and $R^2$ to $R^4$ are respectively the same as defined for Y and $R^2$ to $R^4$ in the aforementioned formula (a0-2).

$M^+$ represents an alkali metal ion, or an ammonium ion which may have a substituent.

Examples of alkali metal ions include a sodium ion, a lithium ion and a potassium ion, and a sodium ion or a lithium ion is preferable.

As an example of the ammonium ion which may have a substituent, a group represented by general formula (0-1) shown below can be given.

[Chemical Formula 70]

In the formula, each of $Y^3$ to $Y^6$ independently represents a hydrogen atom or a hydrocarbon group which may have a substituent, provided that at least one of $Y^3$ to $Y^6$ represents a hydrocarbon group; and at least two of $Y^3$ to $Y^6$ may be mutually bonded to form a ring.

In formula (0-1), each of $Y^3$ to $Y^6$ independently represents a hydrogen atom or a hydrocarbon group which may have a substituent, provided that at least one of $Y^3$ to $Y^6$ represents a hydrocarbon group.

As the hydrocarbon group for $Y^3$ to $Y^6$, the same groups as those described above for $X^0$ can be mentioned.

The hydrocarbon group may be either an aliphatic hydrocarbon group or an aromatic hydrocarbon group. When the hydrocarbon group is an aliphatic hydrocarbon group, it is particularly desirable that the hydrocarbon group is an alkyl group of 1 to 12 carbon atoms which may have a substituent.

At least one of $Y^3$ to $Y^6$ is a hydrocarbon group, and it is preferable that two or three groups are hydrocarbon groups.

At least two of $Y^3$ to $Y^6$ may be mutually bonded to form a ring. For example, two of $Y^3$ to $Y^6$ may be bonded to form a ring, three of $Y^3$ to $Y^6$ may be bonded to form a ring, or two of $Y^3$ to $Y^6$ may be bonded to form a ring, and the remaining two may be bonded to form another ring.

The ring which is formed by at least two of $Y^3$ to $Y^6$ bonded together with the nitrogen atom (i.e., the hetero ring containing nitrogen as a hetero atom) may be either an aliphatic hetero ring, or an aromatic hetero ring. Further, the hetero ring may be either a monocyclic group or a polycyclic group.

Specific examples of the ammonium ion represented by general formula (0-1) include ammonium ions derived from an amine.

Here, an "ammonium ion derived from an amine" refers to an amine having a hydrogen atom bonded to the nitrogen atom to become a cation, and a tertiary ammonium ion in which a substituent has been bonded to the nitrogen atom of an amine.

The amine from which the ammonium ion is derived may be either an aliphatic amine or an aromatic amine.

As the aliphatic amine, an amine in which at least one hydrogen atom of ammonia ($NH_3$) has been substituted with an alkyl group or hydroxyalkyl group of no more than 12 carbon atoms (i.e., alkylamines or alkylalcoholamines), or a cyclic amine is particularly desirable.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine (DHAP), pyrrole, indole, pyrazole, and imidazole.

Examples of the tertiary ammonium ion include a tetramethylammonium ion, a tetraethylammonium ion and a tetrabutylammonium As the ammonium ion represented by general formula (0-1), a group in which at least one of $Y^3$ to $Y^6$ is an alkyl group and at least one is a hydrogen atom is particularly desirable.

Especially, a group in which three of $Y^3$ to $Y^6$ are alkyl groups, and the remaining one is a hydrogen atom (i.e., a trialkylammonium ion), or a group in which two of $Y^3$ to $Y^6$ are alkyl groups, and the remaining two are hydrogen atoms (i.e., dialkylammonium ion) is preferable.

It is preferable that each, of the alkyl groups within the trialkylammonium ion or the dialkylammonium ion independently has 1 to 10 carbon atoms, more preferably 1 to 8, and most preferably 1 to 5. Specific examples include a methyl group, an ethyl group, a propyl group, a butyl group, a pentyl group, a hexyl group, a heptyl group, an octyl group, a nonyl group and a decyl group. Among these, an ethyl group is particularly desirable.

In formula (0-0), $Z^-$ represents an anion.

Examples of the anion include a halogen ion such as a bromine ion or a chlorine ion, an ion capable of forming an acid exhibiting a lower acidity than the compound (1-1-0-1), and an organic carboxylic acid ion such as an acetate ion or a propionate ion.

Examples of the ion represented by $Z^-$ which is capable of forming an acid exhibiting a lower acidity than the compound (1-1-0-1) include sulfonate ions such as a p-toluene sulfonate ion, a methanesulfonate ion, a benzenesulfonate ion and a camphorsulfonate ion.

As the compound (1-1-0-1) and the compound (0-0), commercially available compounds may be used, or the compounds may be synthesized by a conventional method.

The method of producing the compound (1-1-0-1) is not particularly limited. For example, a compound represented by general formula (1-1-0-11) shown below can be dissolved in a solvent such a tetrahydrofuran or water, and the resulting solution can be subjected to a reaction in an aqueous solution of an ammonium compound or an alkali metal hydroxide such as sodium hydroxide or lithium hydroxide, thereby obtaining a compound represented by general formula (1-1-0-12) shown below. Then, the compound represented by general formula (1-1-0-12) can be subjected to a dehydration/condensation reaction with an alcohol represented by general formula (1-1-0-13) shown below in an organic solvent such as benzene or dichloroethane in the presence of an acidic catalyst, thereby obtaining a compound represented by general formula (1-1-0-1).

[Chemical Formula 71]

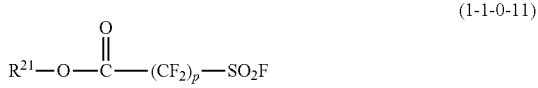

(1-1-0-11)

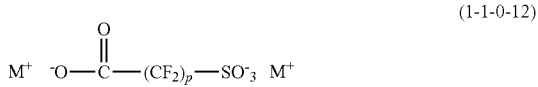

(1-1-0-12)

(1-1-0-13)

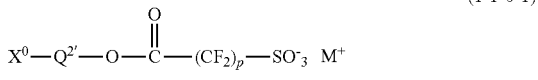

(1-1-0-1)

In the formulas, $R^{21}$ represents an alkyl group of 1 to 5 carbon atoms; and $X^0$, $Q^{2'}$, p and $M^+$ are respectively the same as defined for $X^0$, $Q^{2'}$, p and $M^+$ in the aforementioned formula (1-1-0-1).

The aforementioned compound (0-0) can be produced as follows.

Firstly, for example, a compound represented by general formula (1-1-0-21) shown below and a compound represented by general formula (1-1-0-22) shown below are added to and reacted in a solution, of an organic acid $H^+B^-$ ($B^-$ represents an anion moiety of an organic acid, such as a methanesulfonate ion). Then, pure water and an organic solvent (e.g., dichloromethane, tetrahydrofuran, or the like) are added thereto, and the organic phase is collected. From the organic phase, a compound represented by general formula (1-1-0-23) is obtained.

[Chemical Formula 72]

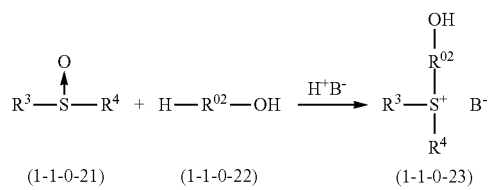

In the formulas, $R^3$ and $R^4$ are the same as defined above; $R^{02}$ represents a group in which one hydrogen atom has been removed from the $R^2$ group in general fouuula (1), provided that the hydrogen atom has not been removed from a substituent; and $B^-$ represents an anion moiety of an organic acid.

In the formulas, $R^3$ and $R^4$ are respectively the same as defined for $R^3$ and $R^4$ in general formula (1).

$R^{02}$ represents a group in which one hydrogen atom has been removed from the $R^2$ group in general formula (1), provided that the hydrogen atom has not been removed from a substituent. For example, when $R^2$ represents an aryl group, $R^{02}$ represents an arylene group. Alternatively, when $R^2$ represents an alkyl group, $R^{02}$ represents an alkylene group.

Subsequently, the compound represented by general formula (1-1-0-23) is added to an organic solvent (e.g., acetonitrile, dichloromethane, tetrahydrofuran, or the like), followed by stirring. Then, in the presence of a basic catalyst such as potassium carbonate, a compound represented by general formula (1-1-0-24) shown below is added thereto and reacted, followed by liquid separation and washing with water, From the resulting organic phase, a compound represented by general formula (1-1-0-25) shown below is obtained.

[Chemical Formula 73]

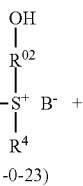

(1-1-0-23)

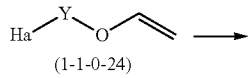

(1-1-0-24)

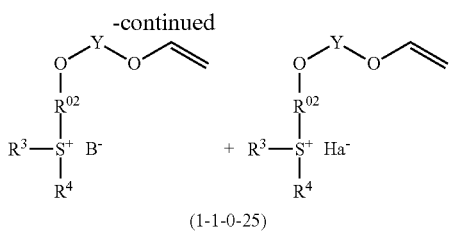

(1-1-0-25)

In the formulas, $R^{02}$, $R^3$, $R^4$, $R^{02}$ and $B^-$ are the same as defined above; Ha represents a halogen atom; $Ha^-$ represents a halogen ion; and Y is the same as defined for Y in the aforementioned formula (a0-2).

In the formulas, $R^{02}$, $R^3$, $R^4$, $R^{02}$ and $B^-$ if are the same as defined above, and Y is the same as defined for Y in general formula (a0-2).

Ha represents a halogen atom, and $Ha^-$ represents a halogen ion.

The compound represented by general formula (1-1-0-25) is a mixture of a compound having an organic acid ($B^-$) as the anion moiety and a compound having a halogen ion ($Ha^-$) as the anion moiety.

The reaction between the compound (1-1-04) and the compound (0-0) can be effected by dissolving the compounds in a, solvent such as water, dichloromethane, acetonitrile, methanol, chloroform or methylene chloride, followed by stirring.

The reaction temperature is preferably 0 to 150° C., and more preferably 0 to 100° C. The reaction time depends on the reactivity of the compounds (1-1-0-1) and (0-0), the reaction temperature or the like. However, in general, the reaction time is preferably 0.5 to 10 hours, and more preferably 1 to 5 hours.

In general, the amount of the compound (0-0) used in the reaction is preferably 0.5 to 2 moles, per 1 mole of the compound (1-1-0-1).

After the reaction, the compound (1-1-0) within, the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

[Production Method of Compound Having an Anion Moiety Represented by General Formula (1-1-2)]

A compound (1-2-0) having an anion moiety represented by general formula (1-1-2) can be produced by reacting a compound (1-2-0-1) represented by general formula (1-2-0-1) shown below with a compound (0-0) represented by general formula (0-0) shown below.

In the formulas, $Z^-$ is the same as defined in the aforementioned formula (0-0).

[Chemical Formula 74]

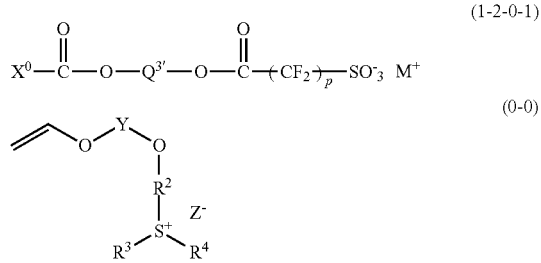

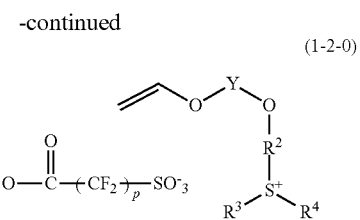

(1-2-0)

In the formulas, $X^0$, p and $M^+$ are the same as defined above; and $Z^-$ represents an anion. Y and $R^2$ to $R^4$ are respectively the same as defined for Y and $R^2$ to $R^4$ in general formula (a0-2).

The compound (0-0) is the same as defined above.

The aforementioned compound (1-2-0-1) can be synthesized, for example, by reacting a compound (1-2-0-11) represented by general formula (1-2-0-11) shown below with a compound (1-2-0-12) represented by general formula (1-2-0-12) shown below.

[Chemical Formula 75]

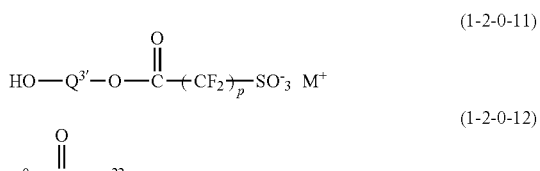

In the formulas, $X^0$, $Q^{3'}$, p and $M^+$ the same as defined above; and $X^{22}$ represents a halogen atom.

Examples of the halogen atom represented by $X^{22}$ include a bromine atom, a chlorine atom, an iodine atom and a fluorine atom. In terms of reactivity, a bromine atom or a chlorine atom is preferable, and a chlorine atom is particularly desirable.

As the compounds (1-2-0-11) and (1-2-0-12), commercially available compounds may be used, or the compounds may be synthesized.

A preferable method of synthesizing the compound (1-2-0-11) includes reacting a compound (1-2-0-111) represented by general formula (1-2-0-111) shown below with a compound (1-2-0-112) represented by general formula (1-2-0-112) shown below, thereby obtaining a compound (1-2-0-11).

[Chemical Formula 76]

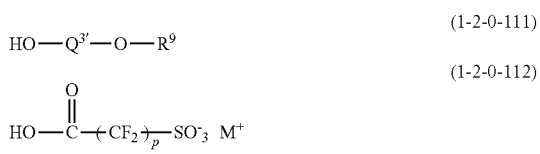

In the formulas, $Q^{3'}$, p and $M^+$ are the same as defined above; and $R^9$ represents an aliphatic group which may have an aromatic group as a substituent.

In formula (1-2-0-111), $R^9$ represents an aliphatic group which may have an aromatic group as a substituent.

The aliphatic group may be either a saturated aliphatic group, or an unsaturated aliphatic group. Further, the aliphatic group may be linear, branched or cyclic, or a combination thereof.

The aliphatic group may be any one of an aliphatic hydrocarbon group consisting of carbon atoms and hydrogen atoms, a group in which part of the carbon atoms constituting the aforementioned aliphatic hydrocarbon group have been substituted with a hetero atom-containing substituent, or a group in which part or all of the hydrogen atoms constituting the aforementioned aliphatic hydrocarbon group have been substituted with a hetero atom-containing substituent.

As the hetero atom, there is no particular limitation as long as it is an atom other than carbon atom and hydrogen, and examples thereof include a halogen atom, an oxygen atom, a sulfur atom and a nitrogen atom. Examples of the halogen atom include a fluorine atom, a chlorine atom, an iodine atom and a bromine atom.

The hetero atom-containing substituent may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —NH— (the H may be replaced with a substituent such as an alkyl group or am acyl group), —S—, —S(=O)$_2$—, and —S(=O)$_2$—O—. When the aliphatic hydrocarbon group contains a cyclic group, the aliphatic hydrocarbon group may contain these substituent groups in the ring structure of the cyclic group.

Examples of the substituent group for substituting part or all of the hydrogen atoms include an alkoxy group, a halogen atom, a halogenated alkyl group, a hydroxyl group, an oxygen atom (=O), —COOR$^{96}$, —OC(=O)R$^{97}$ and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

Each of R$^{96}$ and R$^{97}$ independently represents a hydrogen atom or a linear, branched or cyclic alkyl group of 1 to 15 carbon atoms.

When the alkyl group for R$^{96}$ and R$^{97}$ is a linear or branched alkyl group, it preferably has 1 to 10 carbon atoms, more preferably 1 to 5, and still more preferably 1 or 2. Specific examples of alkyl groups include the same groups as those for the linear or branched monovalent saturated hydrocarbon group described below.

When the alkyl group for R$^{96}$ and R$^{97}$ is a cyclic group, it may be either a monocyclic group or a polycyclic group. The cyclic group preferably has 3 to 15 carbon atoms, more preferably 4 to 12, and still more preferably 5 to 10. Specific examples of cyclic groups include the same groups as those for the cyclic monovalent saturated hydrocarbon group described below.

As the aliphatic hydrocarbon group, a linear or branched saturated hydrocarbon group of 1 to 30 carbon atoms, a linear or branched, monovalent unsaturated hydrocarbon group of 2 to 10 carbon atoms, or a cyclic aliphatic hydrocarbon group (aliphatic cyclic group) of 3 to 30 carbon atoms is preferable.

The linear saturated hydrocarbon group preferably has 1 to 20 carbon atoms, more preferably 1 to 15, and most preferably 1 to 10, Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 5 carbon atoms, more preferably 2 to 4, and most preferably 3. Examples of linear monovalent unsaturated hydrocarbon groups include a vinyl group, a propenyl group (an alkyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12. As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

The aliphatic group for R$^9$ in formula (1-2-0-111) may have an aromatic group as a substituent.

Examples of aromatic groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and a heteroaryl group in which a part of the carbon atoms constituting the aforementioned aryl group has been substituted with a hetero atom such as an oxygen atom, a sulfur atom or a nitrogen atom.

The aromatic group may have a substituent such as an alkyl group of 1 to 10 carbon atoms, a halogenated alkyl group, an alkoxy group, a hydroxyl group or a halogen atom. The alkyl group or halogenated alkyl group as a substituent preferably has 1 to 8 carbon atoms, and more preferably 1 to 4 carbon atoms. Further, the halogenated alkyl group is preferably a fluorinated alkyl group. Examples halogen atoms include a fluorine atom, a chlorine atom, an iodine atom and a bromine atom, and a fluorine atom is preferable.

If the R$^9$ group in the compound (1-2-0-111) represents an aromatic group, i.e., when the oxygen atom adjacent to the R$^9$ group is directly bonded to an aromatic ring without interposing an aliphatic group, the reaction between the compound (1-2-0-111) and the compound (1-2-0-112) does not proceed, such that the compound (1-2-0-11) cannot be obtained.

As the compounds (1-2-0-111) and (1-2-0-112), commercially available compounds may be used, or the compounds may be synthesized by a conventional method.

For example, a compound (1-2-0-112) can be obtained by a method including heating a compound (1-2-0-1121) represented by general formula (1-2-0-1121) shown below in the presence of an alkali, and neutralizing the resultant, thereby obtaining a compound (1-2-0-1122) represented by general formula (1-2-0-1122) shown below (hereafter, this step is referred to as "salt-formation step", and heating the compound (1-2-0-1122) in the presence of an acid having an acid strength stronger than that of the compound (1-2-0-112), thereby obtaining the compound (1-2-0-112) (hereafter, this step is referred to as "carboxylic acid-generation step").

[Chemical Formula 77]

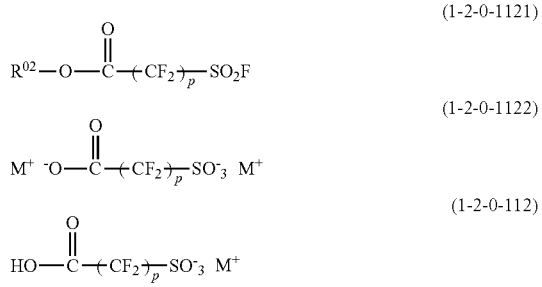

In the formulas, $R^{02}$ represents an alkyl group; and p and $M^+$ are the same as defined above.

As the alkyl group for $R^{02}$, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group. Among these, an alkyl group of 1 to 4 carbon atoms is preferable, and a methyl group is particularly desirable.

As the compound (0-1), a commercially available compound can be used.

The salt-formation step can be performed, for example, by dissolving the compound (1-2-0-1121) in a solvent, and adding an alkali to the resulting solution, followed by heating.

As the solvent, any solvent which is capable of dissolving the compound (1-2-0-1121) can be used. Examples of such a solvent include water and tetrahydrofuran.

As the alkali, an alkali corresponding to M in formula (1-2-0-1122) is used. Examples of such an alkali include alkali metal hydroxides such as sodium hydroxide, potassium hydroxide and lithium hydroxide.

The amount of the alkali used is preferably 1 to 5 moles, more preferably 2 to 4 moles, per 1 mole of the compound (1-2-04121).

The heating temperature is preferably 20 to 120° C., and more preferably about 50 to 100° C. The heating time depends on the heating temperature, but in general, the heating time is preferably 0.5 to 12 hours, and more preferably 1 to 5 hours.

The neutralization following the heating can be conducted by adding an, acid such as hydrochloric acid, sulfuric acid or p-toluenesulfonic acid to the reaction mixture following the heating.

It is preferable to conduct the neutralization so that the pH of the reaction mixture (25° C.) after addition of an acid falls within the range of 6 to 8. Further, the temperature of the reaction mixture during the neutralization is preferably 20 to 30° C., and more preferably 23 to 27° C.

After the reaction, the compound (1-2-0-1122) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

In the carboxylic acid-generation step, the compound (1-2-0-1122) obtained in the salt-formation step is heated in the presence of an acid having an acid strength stronger than that of the compound (1-2-0-112), thereby obtaining the compound (1-2-0-112).

"An acid having an acid strength stronger than that of the compound (1-2-0-112)" (hereafter, frequently referred to simply as "strong acid") refers to an acid having a pKa value (25° C.) smaller than that of —COOH within the compound (1-2-0-112). By using such a strong acid, —COO⁻M⁺ within the compound (1-2-0-1122) can, be converted to —COOH, thereby obtaining the compound (1-2-0-112).

The strong acid can be appropriately selected from any conventional acids which exhibit a pKa value smaller than that of —COOH within the compound (1-2-0-112). The pKa value of —COOH within the compound (1-2-0-112) can be determined by a conventional titration method.

Specific examples of strong acids include a sulfonic acid, such as arylsulfonic acid or an alkylsulfonic acid; sulfuric acid; and hydrochloric acid. An example of an arylsulfonic acid includes p-toluenesulfonic acid. Examples of alkylsulfonic acids include methanesulfonic acid and trifluoromethane sulfonic acid. In consideration of solubility in an organic solvent and ease in purification, p-toluenesulfonic acid is particularly desirable as the strong acid.

The carboxylic acid-generation step can be performed, for example, by dissolving the compound (1-2-0-1122) in a solvent, and adding an acid to the resulting solution, followed by heating.

As the solvent, any solvent which is capable of dissolving the compound (1-2-0-1122) can be used. Examples of such solvents include acetonitrile and methyl ethyl ketone.

The amount of the strong acid used is preferably 0.5 to 3 moles, and more preferably 1 to 2 moles, per 1 mole of the compound (1-2-0-1122).

The heating temperature is preferably 20 to 150° C., and more preferably about 50 to 120° C. The heating time depends on the heating temperature, but in general, the heating time is preferably 0.5 to 12 hours, and more preferably 1 to 5 hours.

After the reaction, the compound (1-2-0-112) within the reaction mixture may be separated and purified. The separation and purification can be conducted by a conventional method. For example, any one of concentration, solvent extraction, distillation, crystallization, recrystallization and chromatography can be used alone, or two or more of these methods may be used in, combination.

The method of reacting the compound (1-2-0-11) with the compound (1-2-0-12) is not particularly limited, and can be performed, for example, by allowing the compound (1-2-0-11) to come in contact with the compound (1-2-0-12) in a reaction solvent. Such a method can be performed, for example, by adding the compound (1-2-0-12) to a solution obtained by dissolving the compound (1-2-0-11) in a reaction solvent, in the presence of a base.

As the reaction solvent, any solvent which is capable of dissolving the compound (1-2-0-11) and the compound (1-2-0-12) as the raw materials can be used. Specific examples of such solvents include tetrahydrofuran (THF), acetone, dimethylformamide (DMF), dimethylacetamide, dimethylsulfoxide (DMSO) and acetonitrile.

Examples of the base include organic bases such as triethylamine, 4-dimethylaminopyridine (DMAP) and pyridine; and inorganic bases such as sodium hydride, $K_2CO_3$ and $Cs_2CO_3$.

The amount of the compound (1-2-0-12) is preferably 1 to 3 equivalents, and more preferably 1 to 2 equivalents, based on the amount of the compound (1-2-0-11).

The reaction temperature is preferably −20 to 40° C., more preferably 0 to 30° C. The reaction time depends on the reactivity of the compounds (1-2-0-11) and (1-2-0-12), the reaction temperature or the like. However, in general, the reaction time is preferably 1 to 120 hours, and more preferably 1 to 48 hours.

The reaction between the compound (1-2-0-1) and the compound (0-0) can be conducted by a conventional salt substitution method. For example, the reaction may be conducted by dissolving the compound (1-2-0-1) and the compound (0-0) in a solvent such as water, dichloromethane, acetonitrile, methanol or chloroform, followed by stirring or the like.

The reaction temperature is preferably 0 to 150° C., and more preferably 0 to 100° C. The reaction time depends on the reactivity of the compounds (1-2-0-1) and (0-0), the reaction temperature or the like. However, in general, the reaction time is preferably 0.5 to 10 hours, and more preferably 1 to 5 hours.

After the reaction, the compound (1-2-0) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

[Production Method of Compound Having an Anion Moiety Represented by General Formula (1-1-3)]

A compound (1-3-0) having an anion moiety represented by general formula (1-1-3) can be produced by reacting a compound (1-3-1) represented by general formula (1-3-1) shown below with a compound (0-0) represented by general formula (0-0) shown below.

[Chemical Formula 78]

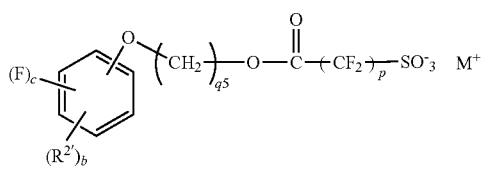
(1-3-1)

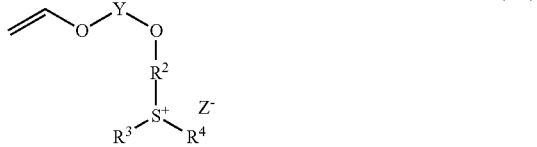
(0-0)

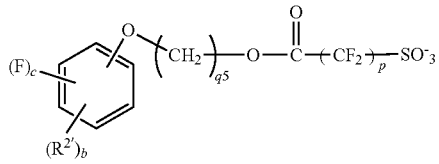
(1-3-0)

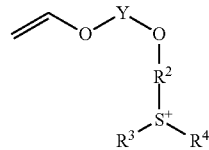
-continued

In the formulas, $R^{2\prime}$, b, c, q5 and p are respectively the same as defined for $R^{2\prime}$, b, c, q5 and p in general formula (1-1-3). $M^+$ is the same as defined above. $Z^-$ is the same as defined for $Z^-$ in the aforementioned general formula (0-0). Y and $R^2$ to $R^4$ are respectively the same as defined for Y and $R^2$ to $R^4$ in general formula (a0-2).

As the compound (1-3-1) and the compound (0-0), commercially available compounds may be used, or the compounds may be synthesized by a conventional method.

The production method of the compound (1-3-1) is not particularly limited. For example, the compound (1-3-1) can be produced by conducting dehydration/condensation between a compound (1-3-11) represented by general formula (1-3-11) shown below and a compound (1-3-12) represented by general formula (1-3-12) shown below in the presence of an acidic catalyst.

The compound (0-0) is the same as defined above.

[Chemical Formula 79]

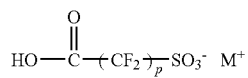
(1-3-11)

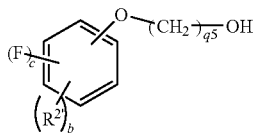
(1-3-12)

The compound (1-3-11) is the same as the compound (1-2-0-112) used in the synthesis of the aforementioned compound (1-2-0-11).

In general formula (1-3-12), $R^{2\prime}$, b, c and q5 are respectively the same as defined for $R^{2\prime}$, b, c and q5 in general formula (1-1-3).

As the compound (1-3-11) and the compound (1-3-12), commercially available compounds may be used, or the compounds may be synthesized.

The dehydration/condensation reaction between the compound (1-3-11) and the compound (1-3-12) can be performed by dissolving the compound (1-3-11) and the compound (1-3-12) in an aprotic organic solvent such as dichloroethane, benzene, toluene, ethylbenzene, chlorobenzene, acetonitrile or N,N-dimethylformamide, followed by stirring in the presence of an acidic catalyst.

In the dehydration/condensation reaction, in terms of improving the yield, purity and the like of the obtained compound (I), it is particularly desirable to use an aromatic organic solvent (e.g., toluene, xylene or chlorobenzene) as the organic solvent.

The reaction temperature of the dehydration/condensation reaction is preferably about 20 to 200° C., and more preferably 50 to 150° C. The reaction time depends on the reactivity of the compounds (1-3-11) and (1-3-12), the reaction temperature or the like. However, in general, the reaction time is preferably 1 to 30 hours, and more preferably 3 to 30 hours.

The amount of the compound (1-3-11) used in the dehydration/condensation reaction is not particularly limited, but in general, the amount of the compound (1-3-11) is preferably about 0.2 to 3 moles, more preferably about 0.5 to 2 moles, and most preferably about 0.75 to 1.5 mole, per 1 mole of the compound (1-3-12).

Examples of the acidic catalyst include an organic acid such as p-toluenesulfonic acid, and an organic acid such as sulfuric acid or hydrochloric acid. These acidic catalysts may be used individually or in a combination of two or more.

In the dehydration/condensation reaction, the acidic catalyst may be used in a catalyst amount. In general, the amount of the acidic catalyst used is about 0.001 to 5 moles, per 1 mole of the compound (1-3-12).

The dehydration/condensation reaction may be conducted while removing water by using a Dean-Stark apparatus. In this manner, the reaction time can be shortened.

Further, in the dehydration/condensation reaction, a dehydrating agent such as 1,1'-carbonyldiimidazole or N,N'-dicyclohexylcarbodiimide may also be used.

When a dehydrating agent is used, in general, the amount of the dehydrating agent is preferably 0.2 to 5 moles, more preferably 0.5 to 3 moles, per 1 mole of the compound (1-3-12).

The reaction between the compound (1-3-1) and the compound (0-0) can be effected by dissolving the compounds in a solvent such as water, dichloromethane, acetonitrile, methanol, chloroform, or methylene chloride, followed by stirring.

The reaction temperature is preferably 0 to 150° C., and more preferably 0 to 100° C. The reaction time depends on the reactivity of the compounds (1-3-1) and (0-0), the reaction temperature or the like. However, in general, the reaction time is preferably 0.5 to 10 hours, and more preferably 1 to 5 hours.

In general, the amount of the compound (0-0) used in the reaction is preferably 0.5 to 2 moles, per 1 mole of the compound (1-3-1).

After the reaction, the compound (1-3-0) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

[Production Method of Compound Having an Anion Moiety Represented by General Formula (1-1-4)]

A compound (1-4-0) having an anion moiety represented by general formula (1-1-4) can be produced by reacting a compound (1-4-1) represented by general formula (1-4-1) shown below with a compound (0-0) represented by general formula (0-0) shown below.

[Chemical Formula 80]

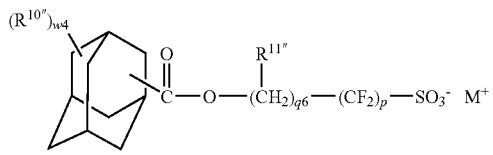

(1-4-1)

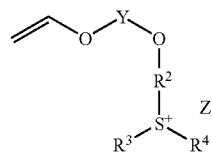

(0-0)

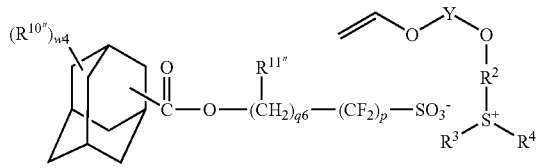

(1-4-0)

In the formulas, p, q6, w4, $R^{10''}$ and $R^{11''}$ are respectively the same as defined for p, q6, w4, e'' and $R^{11''}$ in general formula (1-1-4). $M^+$ is the same as defined above. $Z^-$ is the same as defined for $Z^-$ in general formula (0-0). Y and $R^2$ to $R^4$ are respectively the same as defined for Y and $R^2$ to $R^4$ in general formula (a0-2).

As the compound (1-4-1) and the compound (0-0), commercially available compounds may be used, or the compounds may be synthesized by a conventional method.

The production method of the compound (1-44) is not particularly limited, and the compound (1-4-1) can be produced by a conventional method.

The compound (0-0) is the same as defined above.

The reaction between the compound (1-44) and the compound (0-0) can be effected by dissolving the compounds in a solvent such as water, dichloromethane, acetonitrile, methanol, chloroform or methylene chloride, followed by stirring.

The reaction temperature is preferably 0 to 150° C., and more preferably 0 to 100° C. The reaction time depends on the reactivity of the compounds (1-4-1) and (0-0), the reaction temperature or the like. However, in general, the reaction time is preferably 0.5 to 10 hours, and more preferably 1 to 5 hours.

In general, the amount of the compound (0-0) used in the reaction is preferably 0.5 to 2 moles, per 1 mole of the compound (1-4-1).

After the reaction, the compound (1-4-0) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

(Anion Moiety (2))

A compound (2-0) shown below which has an anion moiety represented by the aforementioned formula (2) can be produced, as follows. For example, a compound (2-0-1) represented by general formula (2-0-1) is reacted with an aqueous solution of an alkali metal compound (e.g., sodium hydroxide, lithium hydroxide, or the like) or an ammonium compound in an organic solvent (e.g., tetrahydrofuran, acetone, methyl ethyl ketone, or the like) or water, thereby obtaining a compound (2-0-2) represented by general formula (2-0-2) shown below. Then, for example, the compound (2-0-2) is reacted with a compound (0-0) represented by general formula (0-0) shown below in an aqueous solution.

143

[Chemical Formula 81]

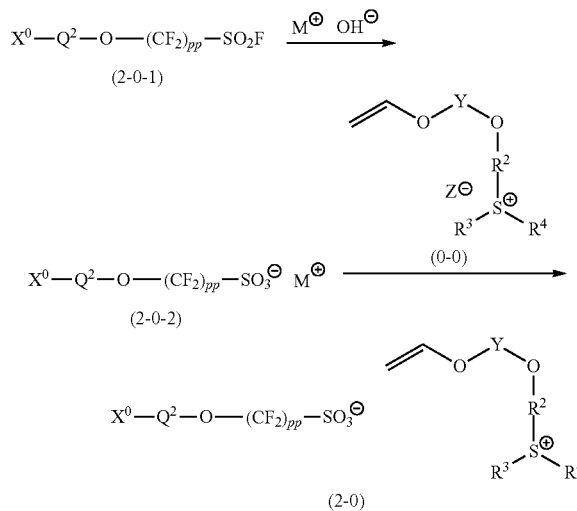

In formulas (2-0-1), (2-0-2) and (0-0), $X^0$, $Q^2$ and pp are respectively the same as defined for $X^0$, $Q^2$ and pp in the aforementioned formula (2).

In general formula (2-0-2), $M^+$ represents an alkali metal ion, or an ammonium ion which may have a substituent.

Examples of alkali metal ions include a sodium ion, a lithium ion, and a potassium ion, and a sodium ion or a lithium ion is preferable.

Examples of the ammonium ion which may have a substituent include the same groups as those described above in relation to formula (0-1).

Formula (0-0) is the same as defined above.

As the compound (2-0-1), commercially available compounds may be used, or the compounds may be synthesized by a conventional method.

The method of producing the compound (2-0-1) is not particularly limited. For example, referring to the method described in Example 1 of Published Japanese Translation No. Hei 11-502543 of the PCT International Publication, silver fluoride (AgF), a compound represented by general formula (2-0-11) shown below and a compound represented by general formula (2-0-12) shown below can be reacted in an organic solvent such as diglyme anhydride.

In general formula (2-0-12), as the halogen atom for $X_h$, a bromine atom or a chlorine atom is preferable.

[Chemical Formula 82]

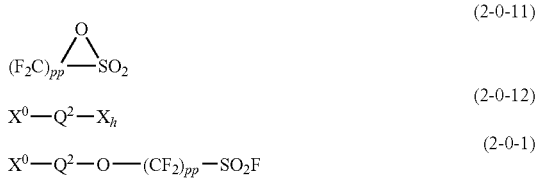

In the formulas, $X^0$, $Q^2$ and pp are respectively the same as defined for $X^0$, $Q^2$ and pp in the aforementioned formula (2); and $X_h$ represents a halogen atom.

The compound represented by general formula (2-0-11) can be produced, for example, by a method described in Japanese Unexamined Patent Application, First Publication No. 2006-348382 or U.S. Pat. No. 6,624,328 B1.

144

The reaction between the compound (2-0-2) and the compound (0-0) can, be effected by dissolving the compounds in a solvent such as water, dichloromethane, acetonitrile, methanol, chloroform or methylene chloride, followed by stirring.

The reaction temperature is preferably 0 to 150° C., and more preferably 0 to 100° C. The reaction time depends on the reactivity of the compounds (2-0-2) and (0-0), the reaction temperature or the like. However, in general, the reaction time is preferably 0.5 to 10 hours, and more preferably 1 to 5 hours.

In general, the amount of the compound (0-0) used in the reaction is preferably 0.5 to 2 moles, per 1 mole of the compound (2-0-2).

After the reaction, the compound represented by general formula (2-0) within the reaction mixture may be separated and purified. The separation and purification can be conducted by a conventional method. For example, any one of concentration, solvent extraction, distillation, crystallization, recrystallization and chromatography can, be used alone, or two or more of these methods may be used in combination.

(Anion Moiety (3))

A compound (3-0) having an anion moiety represented by general formula (3) can be produced, for example, by reacting a compound (3-0-1) represented by general formula (3-0-1) shown below with a compound (0-0) represented by general formula (0-0) shown below.

[Chemical Formula 83]

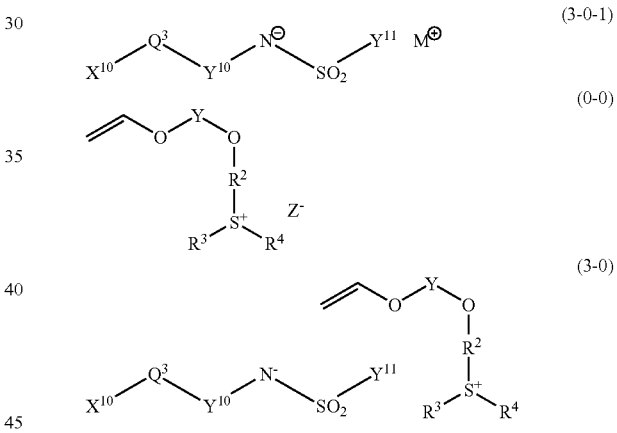

In general formula (3-0), $X^{10}$, $Q^3$, $Y^{10}$ and $Y^{11}$ are respectively the same as defined for $X^{10}$, $Q^3$, $Y^{10}$ and $Y^{11}$ in general formula (3).

Formula (0-0) is the same as defined above.

In general formula (3-0-1), $M^+$ represents an alkali metal ion, or an ammonium ion which may have a substituent.

Examples of alkali metal ions include a sodium ion, a lithium ion and a potassium ion, and a sodium ion or a lithium ion is preferable.

As an example of the ammonium ion which may have a substituent, a group represented by the aforementioned general formula (0-1) can be given.

Formula (0-0) is the same as defined above.

The reaction between the compound (3-0-1) and the compound (0-0) can be effected by dissolving the compounds in a solvent such as water, dichloromethane, acetonitrile, methanol, chloroform or methylene chloride, followed by stirring.

The reaction temperature is preferably 0 to 150° C., and more preferably 0 to 100° C.

The reaction time depends on the reactivity of the compounds (3-0-1) and (0-0), the reaction temperature or the like.

However, in general, the reaction time is preferably 0.5 to 30 hours, and more preferably 1 to 20 hours.

In general, the amount of the compound (0-0) used in the reaction is preferably 0.5 to 2 moles, per 1 mole of the compound (3-04).

The method of producing the compound (3-0-1) is not particularly limited. For example, a method in which a compound (3-0-11) represented by general formula (3-0-11) shown below is reacted with a compound (3-0-12) represented by general formula (3-0-12) in the presence of a base and an organic solvent to thereby obtain the compound (3-0-1) can be preferably used.

[Chemical Formula 84]

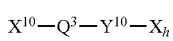
(3-0-11)

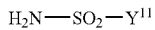
(3-0-12)

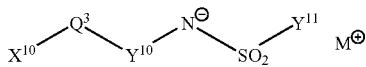
(3-0-1)

In general formulas (3-0-11) and (3-0-12), $X^{10}$, $Q^3$, $Y^{10}$ and $Y^{11}$ are respectively the same as defined for $X^{10}$, $Q^3$, $Y^{10}$ and $Y^{11}$ in general formula (3).

$X_h$ represents a halogen atom, and examples thereof include a fluorine atom, a chlorine atom, a bromine atom and an iodine atom.

As the compound (3-0-11) and the compound (3-0-12), commercially available compounds may be used, or the compounds may be synthesized.

The reaction of the compound (3-0-11) with the compound (3-0-12) can be performed as follows. Firstly, the compound (3-0-12) is dissolved in an appropriate organic solvent, followed by stirring in the presence of an appropriate base.

In the above reaction, in terms of improving the yield, the purity and the like of the obtained compound (3-0-1), it is particularly desirable to use acetone, tetrahydrofuran (THF), methanol, ethanol or dichloromethane as the organic solvent.

Thereafter, the reaction solution is cooled with ice, and the compound (3-0-11) is added thereto, followed by stirring. Then, the reaction mixture is subjected to filtration, and the filtrate is dried.

Finally, the resultant is washed with an organic solvent or the like such as tent-butylmethylether (TBME).

The reaction temperature is preferably 20 to 200° C., and more preferably 20 to 150° C.

The reaction time depends on the reactivity of the compounds (3-0-11) and (3-0-12), the reaction temperature or the like. However, in general, the reaction time is preferably 1 to 80 hours, and more preferably 3 to 70 hours.

The amount of the compounds used in the reaction is not particularly limited, but in general, the amount of the compound (3-0-12) is preferably 0.5 to 5 moles, and more preferably 1 to 5 moles, per 1 mole of the compound (3-0-11).

Examples of the base include sodium carbonate, potassium carbonate, triethylamine and sodium hydride. These bases may be used individually or in a combination of two or more.

The base may be used in a catalyst amount, or in an amount corresponding to the solvent. In general, the amount of the base is about 0.001 to 5 moles, per 1 mole of the compound (3-0-11).

The reaction between the compound (3-0-1) and the compound (0-0) can be effected by dissolving the compounds in a solvent such as water, dichloromethane, acetonitrile, methanol, chloroform or methylene chloride, followed by stirring.

The reaction temperature is preferably 0 to 150° C., and more preferably 0 to 100° C. The reaction time depends on the reactivity of the compounds (3-0-1) and (0-0), the reaction temperature or the like. However, in general, the reaction time is preferably 0.5 to 10 hours, and more preferably 1 to 5 hours.

In general, the amount of the compound (0-0) used in the reaction is preferably 0.5 to 2 moles, per 1 mole of the compound (3-0-1).

After the reaction, the compound represented by general formula (3-0) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

(Anion Moiety (4))

A compound (4-0) shown below which has an anion moiety represented by general formula (4) can be obtained by reacting a compound (4-0-1) represented by general formula (4-0-1) shown below with a compound (0-0) represented by general formula (0-0) shown below.

[Chemical Formula 85]

(4-0-1)

(0-0)

(4-0)

In the formulas, $A^-$ is the same as defined for $A^-$ in general formula (4); Y and $R^2$ to $R^4$ are respectively the same as defined for Y and $R^2$ to $R^4$ in general formula (a0-2); $W^+$ represents an alkali metal ion or an ion represented by the aforementioned general formula (0-1); and $Z^-$ represents an anion.

Formula (0-0) is the same as defined above.

The reaction between the compound (4-0-1) and the compound (0-0) can be conducted by a conventional salt substitution method. For example, the reaction may be conducted by dissolving the compound (4-0-1) and the compound (0-0) in a solvent such as water, dichloromethane, acetonitrile, methanol or chloroform, followed by stirring or the like.

The reaction temperature is preferably 0 to 150° C., and more preferably 0 to 100° C. The reaction time depends on the reactivity of the compounds (4-0-1) and (0-0), the reaction temperature or the like. However, in general, the reaction time is preferably 0.5 to 10 hours, and more preferably 1 to 5 hours.

As the compound (4-0-1) and the compound (0-0), commercially available compounds may be used, or the compounds may be synthesized by a conventional method.

After the reaction, the compound (4-0) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

(Anion Moiety (5))

A compound (5-0) shown below which has an anion moiety represented by general formula (5) can be produced, for example, by a method including a step of reacting a compound (5-0-1) represented by general formula (5-0-1) shown below with a compound (0-0) represented by general formula (0-0) shown below, thereby obtaining a compound (5-0).

[Chemical Formula 86]

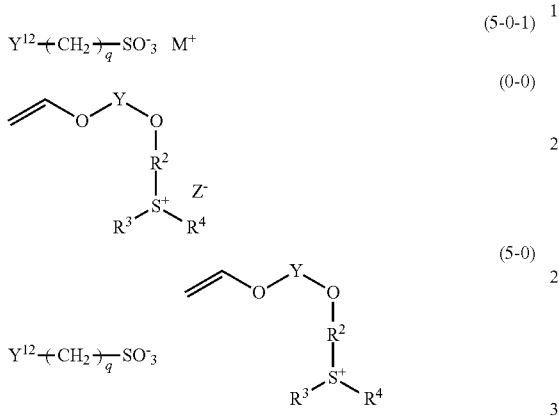

In the formulas, Y and $R^2$ to $R^4$ are respectively the same as defined for Y and $R^2$ to $R^4$ in general formula (a0-2); $M^+$ represents an alkali metal ion, or an ammonium ion which may have a substituent; and $Z^-$ represents an anion.

In the formulas, Y, $R^2$ to $R^4$, $Y^{12}$ and q are the same as defined above.

$M^+$ represents an alkali metal ion, or an ammonium ion which may have a substituent.

Examples of alkali metal, ions include a sodium ion, a lithium ion and a potassium ion, and a sodium ion or a lithium ion is preferable.

As an example of the ammonium ion which may have a substituent, a group represented by the aforementioned general formula (0-1) can be given.

Formula (0-0) is the same as defined above.

As the compound (5-0-1) and the compound (0-0), commercially available compounds may be used, or the compounds may be synthesized by a conventional method.

The reaction between the compound (5-0-1) and the compound (0-0) can be effected by dissolving the compounds in a solvent such as water, dichloromethane, acetonitrile, methanol, chloroform or methylene chloride, followed by stirring.

The reaction temperature is preferably 0 to 150° C., and more preferably 0 to 100° C. The reaction time depends on the reactivity of the compounds (5-0-1) and (0-0), the reaction temperature or the like. However, in general, the reaction time is preferably 0.5 to 10 hours, and more preferably 1 to 5 hours.

In general, the amount of the compound (0-0) used in the reaction is preferably 0.5 to 2 moles, per 1 mole of the compound (5-0-1). After the reaction, the compound (5-0) within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

The structure of the compounds obtained in the manner described above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

<Synthesis of Polymeric Compound (A1')>

The polymeric compound of the present invention can be synthesized by reacting polyhydroxystyrene, the aforementioned compound including a structural unit (a0-2) having a specific partial structure (anion moiety), and a compound (a0-1-0) shown below in the presence of an acidic catalyst using a conventional method.

[Chemical Formula 87]

In the formulas, $R^1$ is the same as defined for $R^1$ in general formula (a0-1).

The structure of the polymeric compound obtained in the manner described above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

The aforementioned polymeric compound is a novel polymeric compound useful as a base component for a resist composition, and can be blended within a resist composition as a base component.

EXAMPLES

As follows is a description of examples of the present invention, although the scope of the present invention is by no way limited by these examples.

In the following examples, a unit represented by a chemical formula (1) is designated as "compound (1)", and the same applies for compounds represented by other formulas.

in the NMR analysis, the internal standard for $^1$H-NMR is tetramethylsilane (TMS), and the internal standard for $^{19}$F-NMR is hexafluorobenzene (the peak of hexafluorobenzene was regarded as −160 ppm).

Synthesis Example 1

Synthesis of Compound (A')

10.65 g of a compound (A) and 106.46 g of acetonitrile were added to a three-necked flask in a nitrogen atmosphere, followed by stirring. Then, 18.28 g of potassium carbonate was added thereto, and stirring was conducted at room temperature for 10 minutes, followed by dropwise adding 32.1 g of 2-chloroethylvinylether. Subsequently, the temperature of the resultant was elevated to 80° C., and stirring was conducted for 72 hours. The reaction solution was cooled to room temperature, and subjected to filtration. Then, the filtrate was subjected to concentration and drying using a rotary evaporator. The obtained oil product was dissolved in 52.47 g of water, and washed with 52.47 g of hexane three times. Thereafter, extraction was conducted with 159.69 g of dichloromethane, and the organic solvent phase was washed with 52.47 g of water three times. After the washing, the organic solvent phase was concentrated and solidified, thereby obtaining 5.6 g of a compound (A') as an objective precursor.

The obtained compound (A') was analyzed by NMR.

$^1$H-NMR (CDCl$_3$, 400 MHz): δ(ppm)=7.69-7.81 (m, 10H, Ar), 7.46 (s, 2H, Ar), 6.49-6.55 (m, 1HVinyl), 4.02-4.27 (m, 6H, CH$_2$+Vinyl), 2.75 (s, 3H, CH$_3$SO$_3$), 2.36 (s, 6H, CH$_3$)

Further, from the results of an ion chromatograph, it was found that the obtained compound was a mixture of compounds having different anion moieties, namely, a mixture of a CH$_3$SO$_3$ compound and a Cl compound with a mixing ratio of CH$_3$SO$_3$:Cl=73.4:26.6 (molar ratio).

From the results shown above, it was confirmed that the compound (A') had a structure shown below.

[Chemical Formula 88]

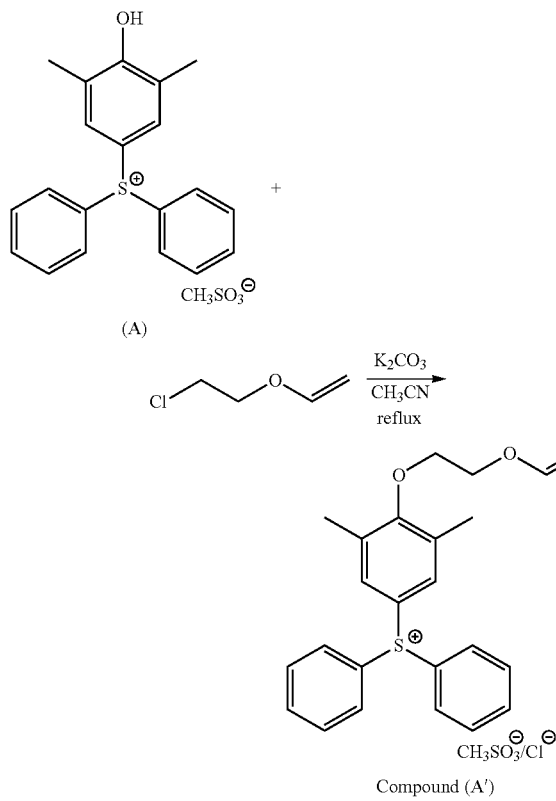

Compound (A')

Synthesis Example 2

Synthesis of Compound (B-1)

150 g of methyl fluorosulfonyl(difluoro)acetate and 375 g of pure water were maintained at 10° C. or lower in an ice bath, and 343.6 g of a 30% by weight aqueous solution of sodium hydroxide was dropwise added thereto. Then, the resultant was refluxed at 100° C. for 3 hours, followed by cooling and neutralizing with a concentrated hydrochloric acid. The resulting solution was dropwise added to 8,888 g of acetone, and the precipitate was collected by filtration and dried, thereby obtaining 184.5 g of a compound (I) in the form of a white solid (purity: 88.9%, yield: 95.5%).

[Chemical Formula 89]

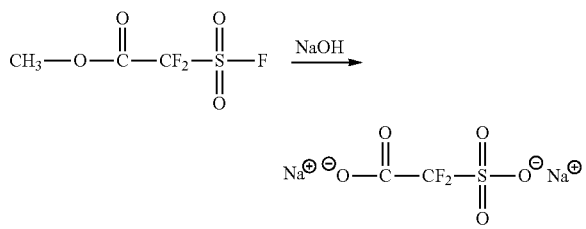

Subsequently, 562 g of the compound (I) and 562.2 g of acetonitrile were prepared, and 77.4 g of p-toluenesulfonic acid monohydrate was added thereto. The resultant was refluxed at 110° C. for 3 hours. Then, the reaction mixture was filtered, and the filtrate was concentrated and dried to obtain a solid. 900 g of t-butyl methyl ether was added to the obtained solid and stirred. Thereafter, the resultant was filtered, and the residue was dried, thereby obtaining 22.2 g of a compound (II) in the form of a white solid (purity: 91.0%, yield: 44.9%).

[Chemical Formula 90]

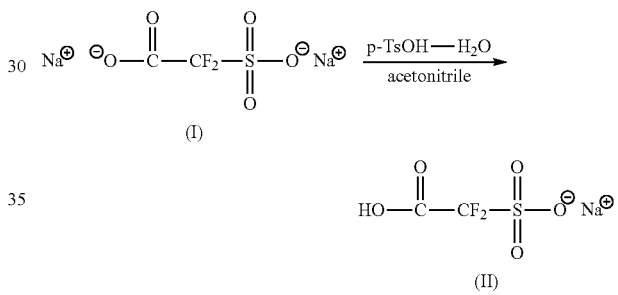

Subsequently, 4.34 g of the compound (II) (purity: 94.1%), 3.14 g of 2-benzyloxyethanol and 43.4 g of toluene were prepared, and 0.47 g of p-toluenesulfonic acid monohydrate was added thereto. The resultant was refluxed at 105° C. for 20 hours. Then, the reaction mixture was filtered, and 20 g of hexane was added to the residue and stirred. Thereafter, the resultant was filtered, and the residue was dried, thereby obtaining 1.41 g of a compound (III) (yield: 43.1%).

[Chemical Formula 91]

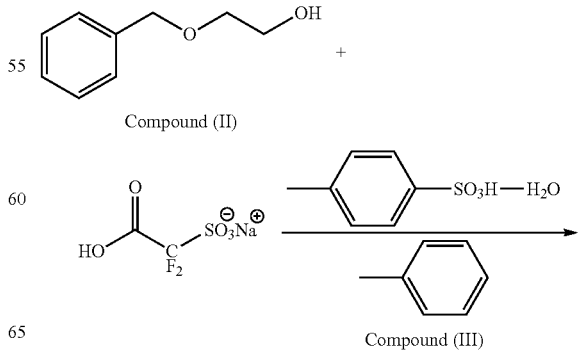

-continued

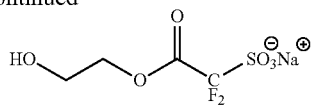

The obtained compound (III) was analyzed by NMR.

$^1$H-NMR (DMSO-d6, 400 MHz): δ(ppm)=4.74-4.83 (t, 1H, OH), 4.18-4.22 (t, 2H, H$^a$), 3.59-3.64 (q, 2H, H$^b$)

$^{19}$F-NMR (DMSO-d6, 376 MHz): δ(ppm)=−106.6

From the results shown above, it was confirmed that the compound (III) had a structure shown, below.

[Chemical Formula 92]

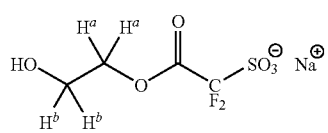

Next, 1.00 g of the compound (III) and 3.00 g of acetonitrile were prepared, and 0.82 g of 1-adamantanecarbonyl chloride and 0.397 g of triethylamine were dropwise added thereto while cooling with ice. Then, the resultant was stirred at room temperature for 20 hours, followed by filtration. The filtrate was concentrated and dried, and dissolved in 30 g of dichloromethane, followed by washing with water three times. Thereafter, the organic phase was concentrated and dried, thereby obtaining 0.82 g of a compound (B-1) (yield: 41%).

[Chemical Formula 93]

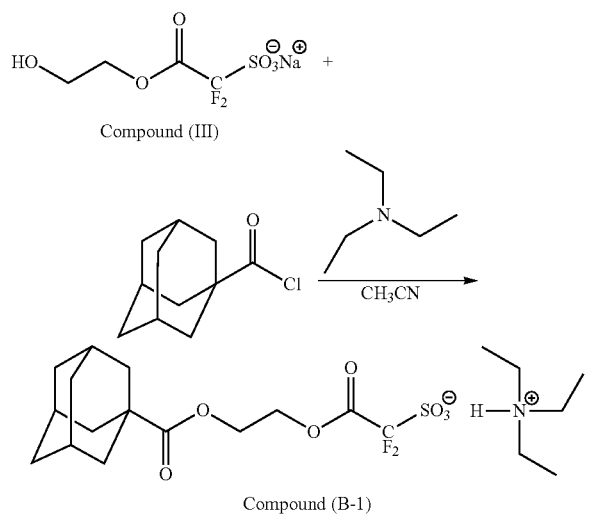

The obtained compound (B-1) was analyzed by NMR.

$^1$H-NMR (DMSO-d6, 400 MHz): δ(ppm)=8.81 (s, 1H, H$^c$), 4.37-4.44 (t, 2H, H$^d$), 4.17-4.26 (t, 2H, H$^e$), 3.03-3.15 (q, 6H, H$^b$), 1.61-1.98 (m, 15H, Adamantane), 1.10-1.24 (t, 9H, H$^a$)

$^{19}$F-NMR (DMSO-d6, 376 MHz): δ(ppm)=−106.61

From the results shown above, it was confirmed that the compound (B-1) had a structure shown below.

[Chemical Formula 94]

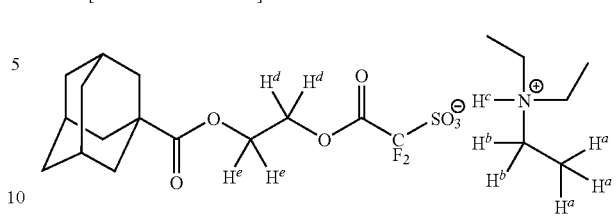

Synthesis Example 3

Synthesis of Compound (B-2)

2 g of the compound (A') was added to 20 g of dichloromethane and 20 g of water, followed by stirring. Then, 2.54 g of the compound (B-1) was added thereto, followed by stirring for 1 hour. The reaction mixture was subjected to liquid separation, and the resultant was washed four times with 20 g of water. After the washing, the organic solvent phase was concentrated and solidified, thereby obtaining 2.3 g of a compound (B-2).

The obtained compound (B-2) was analyzed by NMR.

$^1$H-NMR (DMSO-d6, 400 MHz): δ(ppm)=7.72-7.83 (m, 10H, Ar), 7.72 (s, 2H, Ar), 6.49-6.55 (m, 1H, Vinyl), 4.37-4.44 (t, 2H, CH$_2$), 4.20-4.23 (d, 1H, Vinyl), 4.00-4.26 (m, 7H, CH$_2$+Vinyl), 2.27 (s, 6H, CH$_3$), 1.61-1.98 (m, 15H, Adamantane)

$^{19}$F-NMR (DMSO-d6, 376 MHz): δ(ppm)=−106.61

From the results shown above, it was confirmed that the compound (B-2) had a structure shown below.

[Chemical Formula 95]

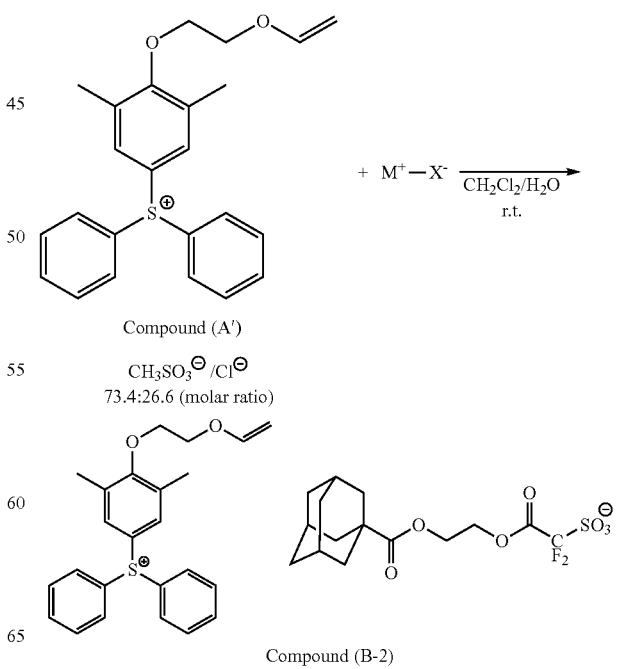

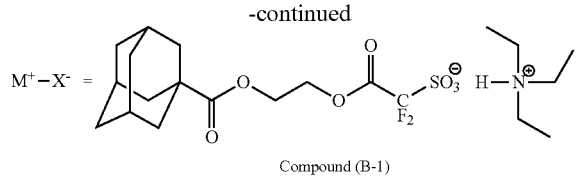

Compound (B-1)

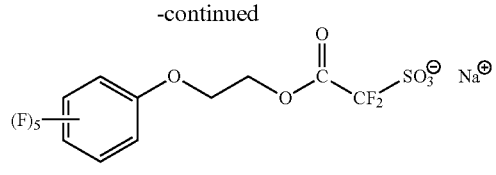

Compound (C-1)

Synthesis Example 4

Synthesis of Compound (C-1)

5.00 g of the compound (II) obtained in Synthesis Example 2 (purity: 91.0%), 10.48 g of pentafluorophenoxyethanol and 50.00 g of toluene were prepared, and 0.935 g of p-toluenesulfonic acid monohydrate was added thereto. The resultant was refluxed at 110° C. for 15 hours. Thereafter, the reaction mixture was filtered, and 46.87 g of toluene was added to the residue, followed by stirring at room temperature for 15 minutes. This filtration step was performed twice to obtain a white powder. The white powder was dried under reduced pressure for one night. On the next day, 46.87 g of acetonitrile was added to the white powder, followed by stirring at room temperature for 15 minutes. Then, the resultant was subjected to filtration, and the obtained filtrate was gradually added to 468.7 g of TBME in a dropwise manner. The precipitated solid was collected by filtration and dried, thereby obtaining 6.69 g of a compound (C-1) in the form of a white powder (purity: 99.5%, yield: 71.0%).

The compound (C-1) was analyzed by $^1$H-NMR and $^{19}$F-NMR.

$^1$H-NMR (DMSO-d6, 400 MHz): δ(ppm) 4.4-4.5 (t, 4H, Ha, Hb)

$^{19}$F-NMR (DMSO-d6, 400 MHz): δ(ppm) −106.7 (s, 2F, Fa), −154.0 (s, 2F, Fb), −160.0 to −161.5 (s, 3F, Fc)

From the results shown above, it was confirmed that the compound (C-1) had a structure shown below.

[Chemical Formula 97]

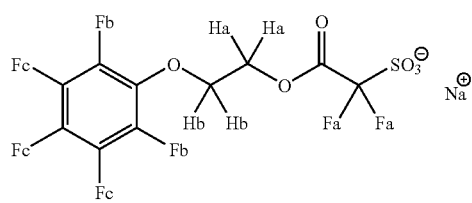

Synthesis Example 5

Synthesis of Compound (D-1)

To 2.42 g of the compound (III) obtained in Synthesis Example 2 and 7.26 g of acetonitrile were dropwise added 2.19 g of undecanoylcarbonyl chloride and 1.01 g of triethylamine while cooling with ice.

Then, the resultant was stirred at room temperature for 20 hours, followed by filtration. The filtrate was concentrated and dried, and dissolved in 20 g of dichloromethane, followed by washing with water three times. Thereafter, the organic phase was concentrated and dried, thereby obtaining 3.41 g of a compound (D-1) (yield: 80.4%).

[Chemical Formula 96]

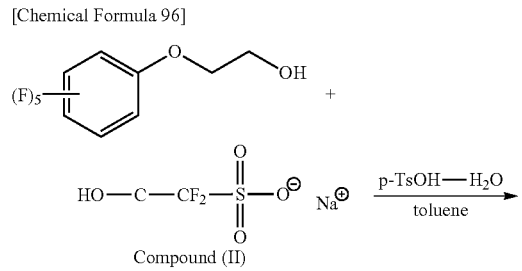

[Chemical Formula 98]

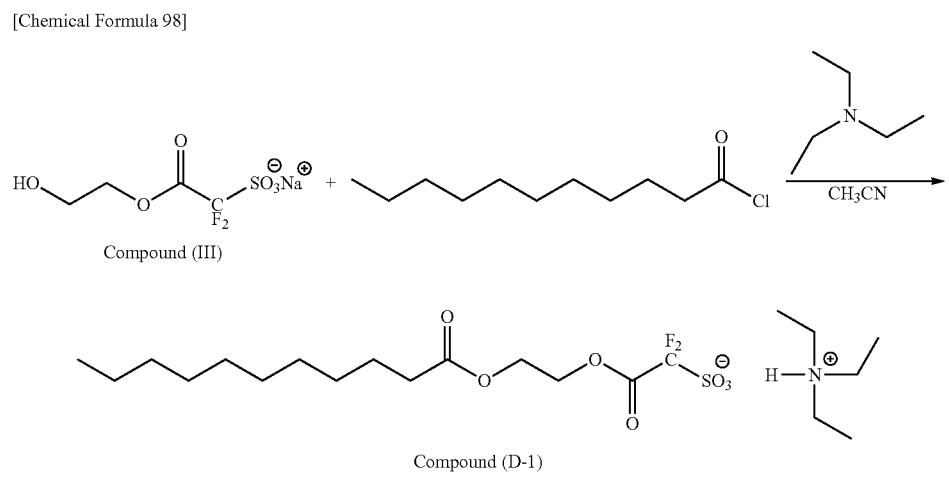

Compound (D-1)

The obtained compound (D-1) was analyzed by NMR.

$^1$H-NMR (DMSO-d6, 400 MHz): δ(ppm)=8.81 (s, 1H, H$^f$), 4.39-4.41 (t, 2H, H$^d$), 4.23-4.39 (t, 2H, H$^e$), 3.06-3.10 (q, 6H, H$^c$), 2.24-2.29 (t, 2H, H$^c$), 1.09-1.51 (m, 25H, H$^b$+H$^g$), 0.83-0.89 (t, 3H, H$^a$)

$^{19}$F-NMR (DMSO-d6, 376 MHz): δ(ppm)=−106.8

From the results above, it was confirmed that the compound (D-1) had a structure shown below.

[Chemical Formula 99]

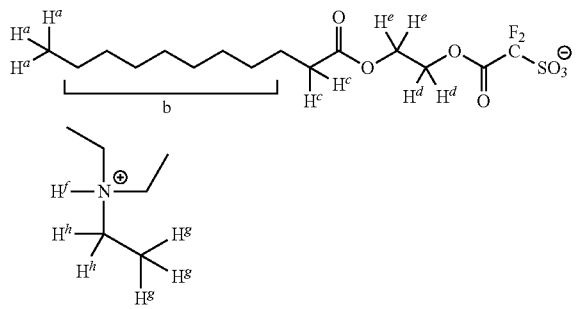

Synthesis Example 6

Synthesis of Compound (E-1)

5.00 g of the compound (II) obtained in Synthesis Example 2 (purity: 91.0%), 4.80 g of sultone-OH (3) and 25.0 g of toluene were prepared, and 0.935 g of p-toluenesulfonic acid monohydrate was added thereto. The resultant was refluxed at 110° C. for 26 hours. Thereafter, the reaction mixture was filtered, and 25.0 g of toluene was added to the residue, followed by stirring at room temperature for 10 minutes. This filtration step was performed twice to obtain a white powder.

The white powder was dried under reduced pressure for one night. On the next day, 5 g of acetone was added to the white powder, followed by stirring at room temperature for 15 minutes. Then, the resultant was subjected to filtration, and the obtained filtrate was gradually added to 25.0 g of TBME and 25.0 g of methylene chloride in a dropwise manner. The precipitated solid was collected by filtration and dried, thereby obtaining 5.89 g of a compound (E-1) in the form of a white powder (purity: 98.4%, yield: 68.1%).

[Chemical Formula 100]

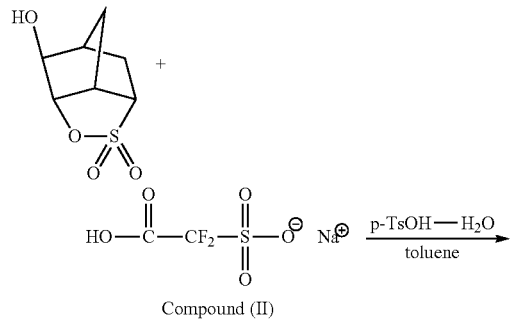

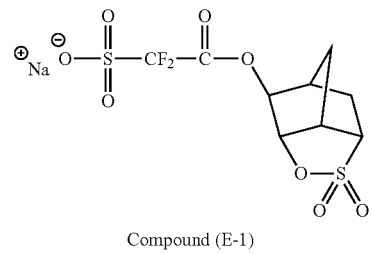

Compound (E-1)

The compound (E-1) was analyzed by $^1$H-NMR and $^{19}$F-NMR.

$^1$H-NMR (DMSO-d6, 400 MHz): δ(ppm) 1.73-2.49 (m, 4H, Ha, Hb), 2.49 (m, 1H, Hc), 3.34 (m, 1H, Hd), 3.88 (t, 1H, He), 4.66 (t, 1H, Hf), 4.78 (m, 1H, Hg)

$^{19}$F-NMR (DMSO-d6, 400 MHz): δ(ppm) ~107.7 (m, 2F, Fa)

From the results shown above, it was confirmed that the compound (E-1) had a structure shown below.

[Chemical Formula 101]

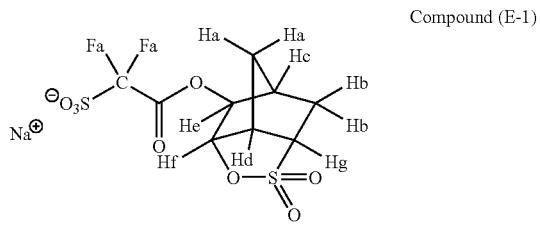

Compound (E-1)

Synthesis Example 7

Synthesis of Compound (F-1)

10.0 g of the compound (III) obtained in Synthesis Example 2 and 50 g of acetonitrile were added to a three-necked flask, and 7.35 g of isonicotinoyl chloride hydrochloride was added thereto. The resulting suspension was cooled with ice, and 8.36 g of triethylamine was gradually added thereto in a dropwise manner. After the dropwise addition, the ice cooling was stopped, followed by stirring at room temperature for 1.5 hours. Thereafter, the reaction mixture was filtered, and the filtrate was concentrated under reduced pressure. The obtained crude product was dissolved in 130.2 g of dichloromethane, and the resultant was washed with 37.2 g of water. The organic phase was concentrated and dried under reduced pressure, thereby obtaining 10.7 g of a compound (F-1).

[Chemical Formula 102]

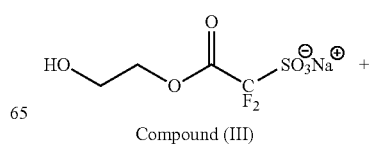

Compound (III)

-continued

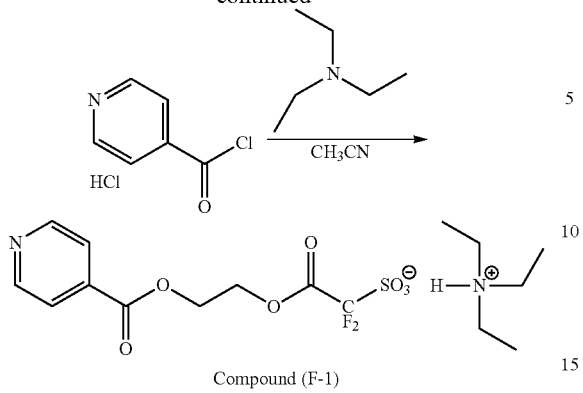

Compound (F-1)

The obtained compound (F-1) was analyzed by NMR.

$^1$H-NMR (DMSO-d6, 400 MHz): δ(ppm)=8.74-8.82 (m, 3H, Pyridyl and H$^c$), 7.84 (dd, 2H, Pyridyl), 4.54-4.61 (m, 4H, H$^d$), 3.08 (m, 6H, H$^b$), 1.16 (t, 9H, H$^a$)

$^{19}$F-NMR (DMSO-d6, 376 MHz): δ(ppm)=−106.5

From the results shown above, it was confirmed that the compound (F-1) had a structure shown below.

[Chemical Formula 103]

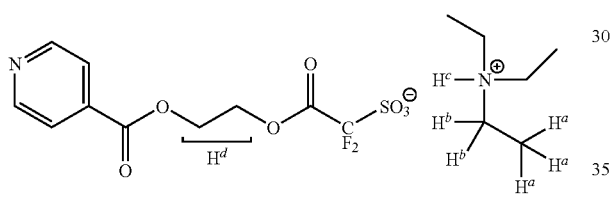

Synthesis Example 8

Synthesis of Compound (G-1)

3.23 g of the compound (II) obtained in Synthesis Example 2 (purity: 91.0%), 5.00 g of a compound (II') represented by formula (II') shown below and 32.2 g of dichloroethane were prepared, and 0.328 g of p-toluenesulfonic acid monohydrate was added thereto. The resultant was refluxed at 110° C. for 21 hours. Then, the reaction mixture was filtered, and 49.4 g of methyl ethyl ketone was added to the residue, followed by stirring. Thereafter, the resultant was filtered, and the residue was dried, thereby obtaining 2.62 g of a compound (G-1) in the form of a brownish white solid (purity: 43.8%, yield: 21.3%).

[Chemical Formula 104]

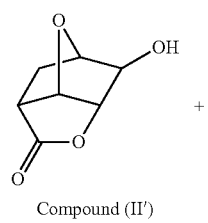

Compound (II')

+

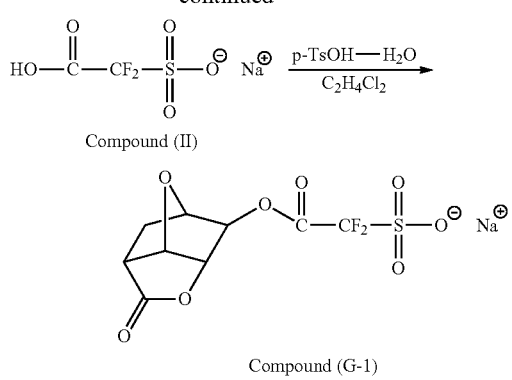

Synthesis Example 9

Synthesis of Compound (I-1)

To 8.00 g of the compound (III) obtained in Synthesis Example 2 and 150.00 g of dichloromethane were added 7.02 g of 1-adamantaneacetyl chloride and 3.18 g of triethylamine while cooling with ice. Then, the resultant was stirred at room temperature for 20 hours, followed by filtration. The filtrate was washed with 54.6 g of pure water three times, and the organic phase was concentrated and dried, thereby obtaining 14.90 g of a compound (I-1) (purity: 88.0%).

[Chemical Formula 105]

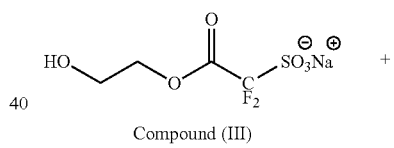

Compound (III)

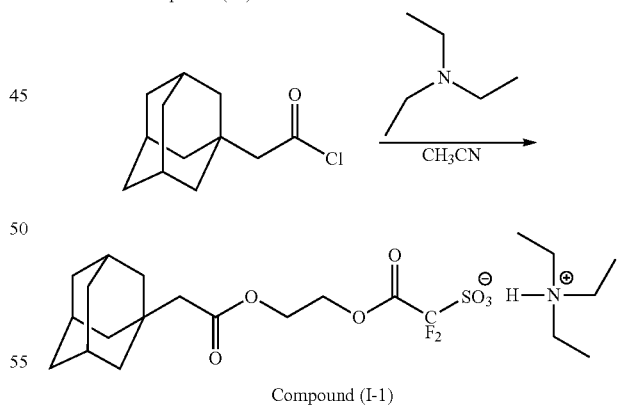

Compound (I-1)

The obtained compound (I-1) was analyzed by NMR.

$^1$H-NMR (DMSO, 400 MHz): δ(ppm)=8.81 (br s, 1H, H$^c$), 4.40 (t, 2H, H$^d$), 4.20 (t, 2H, H$^e$), 3.08 (q, 6H, H$^b$), 2.05 (s, 2H, H$^f$), 1.53-1.95 (m, 15H, Adamantane), 1.17 (t, 9H, H$^a$)

$^{19}$F-NMR (DMSO, 376 MHz): δ(ppm)=−106.90

From the results shown above, it was confirmed that the compound (I-1) had a structure shown below.

[Chemical Formula 106]

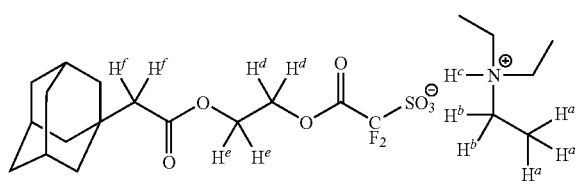

Synthesis Example 10

Synthesis of Compound (K-1)

2.35 g of trifluoromethanesulfoneamide and 11.75 g of acetone were added to and dissolved in a three-necked flask equipped with a stirrer and a thermometer, and 3.34 g of sodium carbonate was added thereto, followed by stirring at room temperature for 10 minutes. The reaction mixture was cooled with ice, and 120 g of cyclohexylsulfonyl chloride was gradually added thereto. Then, the resultant was stirred at room temperature for 60 hours, and the reaction mixture was filtered, followed by drying the filtrate. Finally, washing was conducted using tert-butylmethylether (TBME), thereby obtaining 1.94 g of a compound (K-1) shown below.

The obtained compound (K-1) was analyzed by NMR.
$^1$H-NMR (DMSO-d6, 400 MHz): δ(ppm) 1.04-1.41 (m, 5H, a), 1.58 (d, 1H, a), 1.73 (d, 2H, b), 2.07 (d, 2H, b), 2.98 (tt, 1H, c)
$^{19}$F-NMR (DMSO-d6, 376 MHz): δ(ppm)=−78.2.
From the results above, it was confirmed that the compound (K-1) had a structure shown below.

[Chemical Formula 107]

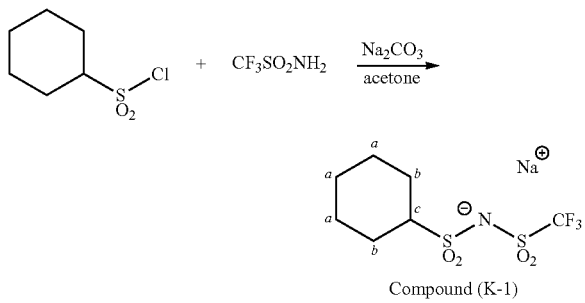

Compound (K-1)

Synthesis Example 11

Synthesis of Compound (M-1)

1.71 g of trifluoromethanesulfoneamide and 17.1 g of THF were stirred while cooling with ice, and 0.45 g of sodium hydride was added thereto. Then, a mixture containing 3.62 g of a compound (M-0) and 7.24 g of THF was added thereto while maintaining the temperature of the mixture at 10° C. or lower, and a reaction was performed under reflux for 20 hours. Thereafter, 22 ml of water and 44 g of t-butylmethylether (TBME) were added to the resultant in this order and stirred, followed by collecting the TBME, phase. The collected phase was dried and purified, thereby obtaining 1.2 g of a compound (M-1) in the form of a transparent liquid (yield: 24%).

The obtained compound (M-1) was analyzed by NMR.
$^1$H-NMR (acetone, 400 MHz): δ(ppm)=1.60 (m, 6H, adamantane), 2.08 (m, 6H, adamantane), 2.17 (m, 3H, adamantane)
$^{19}$F-NMR (acetone, 376 MHz): δ(ppm)=−68.4 (s, 2F, c), −75.3 (s, 3F, a), −112.0 (s, 2F, b)
From the results above, it was confirmed that the compound (M-1) had a structure shown below.

[Chemical Formula 108]

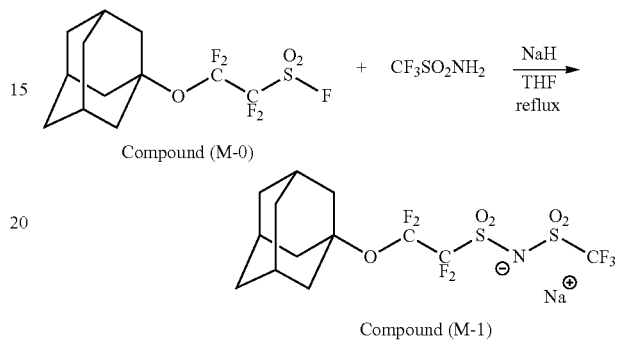

Compound (M-1)

Synthesis Example 12

Synthesis of Compound (N-1)

16.7 ml of tetrahydrofuran was added to 5.0 g of 2-naphthylmethyloxytetrafluoroethanesulfonyl fluoride, and an aqueous solution obtained by dissolving 0.98 g of lithium hydroxide in 13.6 ml of pure water was dropwise added to the resulting solution in an ice bath. Then, the solution was stirred in the ice bath. Since no absorption ascribed to —SO$_2$F was observed at −217.6 ppm by $^{19}$F-NMR, it was confirmed that all fluorinated sulfonyl groups were converted to lithium sultanate.

Thereafter, the reaction mixture was concentrated and dried to obtain a viscous white solid (crude product). The obtained crude product was dissolved in 14.2 ml of acetone, and filtered to remove the by-produced LiF. The filtrate was concentrated, thereby obtaining 5.50 g of a precursor compound (N-1).

[Chemical Formula 109]

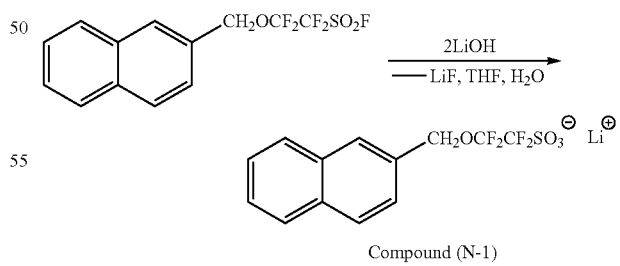

Compound (N-1)

Synthesis Example 13

Synthesis of Compound (O-1)

142.35 g of diglyme was added to 28.57 g of silver fluoride and cooled to 0° C. Then, 40.55 g of tetrafluoro-1,2-oxathiethane-2,2-dioxide was dropwise added thereto. The resultant was stirred at room temperature for 1 hour, and the reaction system was cooled to 0° C. again. A diglyme (99.88 g) solution of 1-bromoadamantane (49.94 g) was dropwise added thereto, and stirred at room temperature for 14 hours, 508 ml of hexane was further added, and the reaction system was cooled to 0° C. 127 ml of water was dropwise added thereto at 0° C., and stirred for 10 minutes. Insoluble matter was removed by filtration, and the filtrate was subjected to liquid separation. The obtained organic phase was washed with 169 ml of a saturated saline solution, and dried with magnesium sulfate, followed by concentration under reduced pressure. 254 ml of hexane was added to the residue, and the precipitated crystal was separated by filtration. Then, the filtrate was concentrated under reduced pressure, thereby obtaining 23.30 g of 1-adamantoxytetrafluoroethanesulfonyl fluoride (compound (O-0)) (yield: 30%).

The obtained compound (O-0) was analyzed by NMR.

$^1$H-NMR (DMSO-d6, 400 MHz): δ(ppm)=2.19 (s, 3H, adamantane), 2.05 (s, 6H, adamantane), 1.62 (s, 6H, adamantane)

$^{19}$F-NMR (DMSO-d6, 376 MHz): δ(ppm)=−69.96, −108.05

From the results above, it was confirmed that the compound (O-0) had a structure shown below.

[Chemical Formula 110]

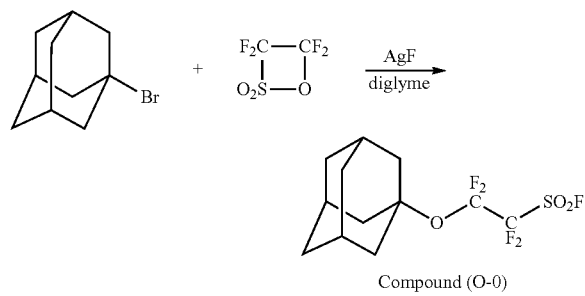

Compound (O-0)

Subsequently, 16.7 nil of tetrahydrofuran was added to 10 g of 1-adamantoxytetrafluoroethanesulfonyl fluoride (compound (O-0)), and an aqueous solution obtained by dissolving 0.64 g of lithium hydroxide in 13.6 ml of pure water was dropwise added to the resulting solution in an ice bath. Then, the solution was stirred in the ice bath. Thereafter, the reaction mixture was filtered to remove LiF, and the filtrate was washed with 33.4 ml of t-butylmethylether. Then, the aqueous solution was collected by liquid separation, thereby obtaining a 32% by weight aqueous solution of a compound (O-1) (yield: 70%).

The obtained compound (O-1) was analyzed by NMR.

$^1$H-NMR (DMSO-d6, 400 MHz): δ(ppm)=2.33 (s, 3H, adamantane), 2.21 (s, 6H, adamantane), 1.80 (s, 6H, adamantane)

$^{19}$F-NMR (DMSO-d6, 376 MHz): δ(ppm)=−70.37, −113.70

From the results above, it was confirmed that the compound (0-1) had a structure shown below.

[Chemical Formula 111]

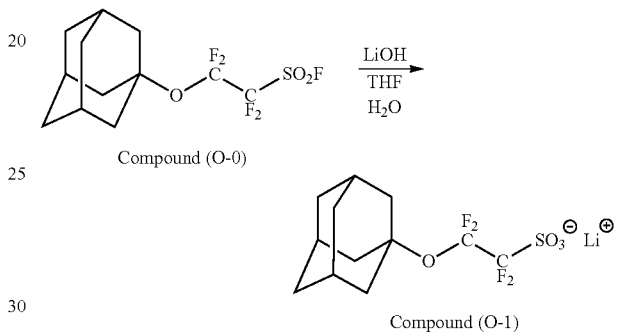

Synthesis Examples 14 to 30

Synthesis of Compounds (C-2) to (R-2) and (X-2)

The same procedure as in Synthesis Example 3 was performed, except that the compound (M$^+$-X$^-$) was changed to one of the compounds synthesized in Synthesis Examples 4 to 13 or a compound shown in Tables 1 to 6 (equimolar amount). As a result, compounds (C-2) to (R-2) and (X-2) were obtained.

Each of the obtained compounds were analyzed by NMR. The results are shown in Tables 1 to 6. In Tables 1 to 6, "↑" indicates that the cation of the product is the same as that of the compound (B-2).

TABLE 1

| Compound | NMR | Compound M$^+$—X$^-$ |
|---|---|---|
| B-2 | $^1$H-NMR (DMSO-d6, 400 MHz): δ (ppm) = 7.72-7.83 (m, 10H, Ar), 7.72 (s, 2H, Ar), 6.49-6.55 (m, 1H, Vinyl), 4.37-4.44 (t, 2H, CH2), 4.20-4.23 (d, 1H, Vinyl), 4.00-4.26 (m, 7H, CH2 + Vinyl), 2.27 (s, 6H, CH$_3$), 1.61-1.98 (m, 15H, Adamantane) $^{19}$F-NMR (DMSO-d6, 376 MHz): δ (ppm) = −106.61 | (B-1) |

TABLE 1-continued

| Compound | NMR | Structure |
|---|---|---|
| C-2 | ¹H-NMR (DMSO-d6, 400 MHz): δ (ppm) = 7.69-7.81 (m, 10H, Ar), 7.46 (s, 2H, Ar), 6.49-6.55 (m, 1H, Vinyl), 4.4-4.5 (t, 4H, $CH_2$), 4.02-4.27 (m, 6H, $CH_2$ + Vinyl), 2.36 (s, 6H, CH3) ¹⁹F-NMR (DMSO-d6, 376 MHz): δ (ppm) = −106.7 (s, 2F), −154.0 (s, 2F), −106.0, −161.5 (s, 3F) | (C-1) 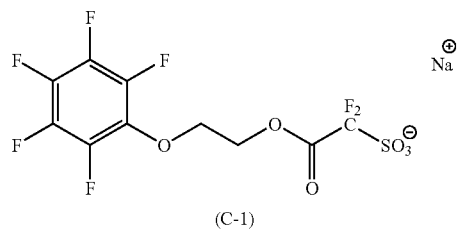 |
| D-2 | ¹H-NMR (DMSO-d6, 400 MHz): δ (ppm) = 7.69-7.81 (m, 10H, Ar), 7.46 (s, 2H, Ar), 6.49-6.55 (m, 1H Vinyl), 4.39-4.42 (t, 2H, $CH_2$), 4.02-4.27 (m, 8H, $CH_2$ + Vinyl), 2.36 (s, 6H, $CH_3$), 2.25-2.89 (t, 3H, $CH_3$), 1.17-1.50 (m, 15H, CH2), 0.79-0.88 (t, 3H, $CH_3$) ¹⁹F-NMR (DMSO-d6, 376 MHz): δ (ppm) = −106.8 | (D-1) 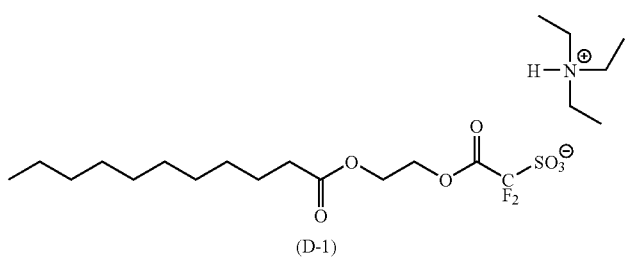 |

| Compound | Product Cation | Product Anion |
|---|---|---|
| B-2 | [diphenyl-(3,5-dimethyl-4-(2-(vinyloxy)ethoxy)phenyl)sulfonium] | [adamantane-1-carbonyloxyethoxy-CF₂-SO₃⁻] |
| C-2 | ↑ | [pentafluorophenoxy-ethoxy-CF₂-SO₃⁻] |
| D-2 | ↑ | [decanoyloxyethoxy-CF₂-SO₃⁻] |

TABLE 2

| Compound | NMR | Compound M⁺—X⁻ |
|---|---|---|
| E-2 | ¹H-NMR (DMSO-d6, 400 MHz): δ (ppm) = 7.69-7.81 (m, 10H, Ar), 7.46 (s, 2H, Ar), 6.49-6.55 (m, 1H, Vinyl), 4.78 (m, 1H, CH), 4.66 (t, 1H, CH), 4.02-4.27 (m, 6H, CH2 + Vinyl), 3.88 (t, 1H, CH), 3.34 (m, 1H, CH), 2.49 (m, 1H, CH), 1.73-2.49 (m, 10H, sultone) ¹⁹F-NMR (DMSO-d6, 376 MHz): δ (ppm) = −107.7 | (E-1) Na⁺ sultone-O-CO-CF₂-SO₃⁻ |

TABLE 2-continued

| | | |
|---|---|---|
| F-2 | ¹H-NMR (DMSO-d6, 400 MHz): δ (ppm) = 8.74-8.82 (m, 2H, Py—H), 7.84 (dd, 2H, Py—H), 7.69-7.81 (m, 10H, Ar), 7.46 (s, 2H, Ar), 6.49-6.55 (m, 1H, Vinyl), 4.54-4.61 (m, 4H, CH₂CH₂), 4.02-4.27 (m, 6H, CH2 + Vinyl), 2.36 (s, 6H, CH₃) ¹⁹F-NMR (DMSO-d6, 376 MHz): δ (ppm) = −106.5 | 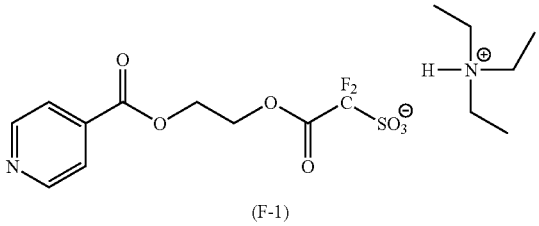 (F-1) |
| G-2 | ¹H-NMR (DMSO-d6, 400 MHz): δ (ppm) = 7.69-7.81 (m, 10H, Ar), 7.46 (s, 2H, Ar), 6.49-6.55 (m, 1H, Vinyl), 5.48 (m, 1H, CH), 4.98 (s, 1H, CH), 4.73-4.58 (d, 2H, CH₂), 4.02-4.27 (m, 6H, CH₂ + Vinyl), 2.71 (m, 1H, CH), 2.36 (s, 6H, CH₃), 2.14 (m, 2H, CH₂), ¹⁹F-NMR (DMSO-d6, 376 MHz): δ (ppm) = −110.0 | 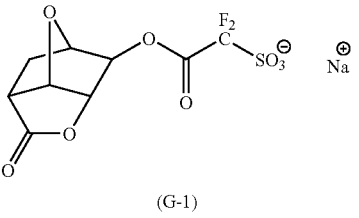 (G-1) |

| | Product | |
|---|---|---|
| Compound | Cation | Anion |
| E-2 | ↑ | 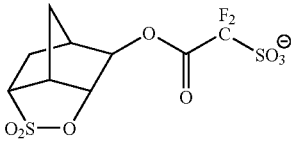 |
| F-2 | ↑ | 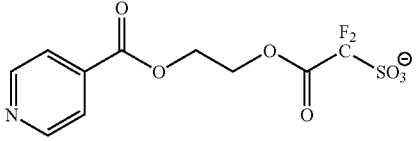 |
| G-2 | ↑ | 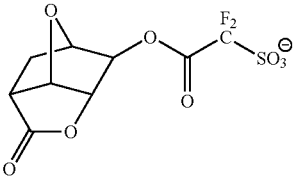 |

TABLE 3

| Compound | NMR | Compound M⁺—X⁻ |
|---|---|---|
| H-2 | ¹H-NMR (DMSO-d6, 400 MHz): δ (ppm) = 7.69-7.81 (m, 10H, Ar), 7.46 (s, 2H, Ar), 6.49-6.55 (m, 1H, Vinyl), 4.55 (t, 2H, CF₂CH₂), 4.02-4.27 (m, 6H, CH₂ + Vinyl), 2.36 (s, 6H, CH₃), 1.94 (m, 3H, Ad), 1.82 (m, 6H, Ad), 1.64 (m, 6H, Ad), ¹⁹F-NMR (DMSO-d6, 376 MHz): δ (ppm) = −111.2. | 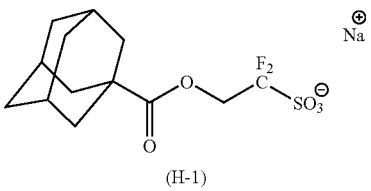 (H-1) |

TABLE 3-continued

| | | |
|---|---|---|
| I-2 | ¹H-NMR (DMSO-d6, 400 MHz): δ (ppm) = 7.69-7.81 (m, 10H, Ar), 7.46 (s, 2H, Ar), 6.49-6.55 (m, 1H Vinyl), 4.40 (t, 2H, CH₃), 4.02-4.27 (m, 8H, CH₂ + CH₂ + Vinyl), 2.36 (s, 6H, CH₃), 2.05 (s, 2H, CH₂), 1.53-1.95 (m, 15H, Adamantane)<br>¹⁹F-NMR (DMSO-d6, 376 MHz): δ (ppm) = −106.90 | 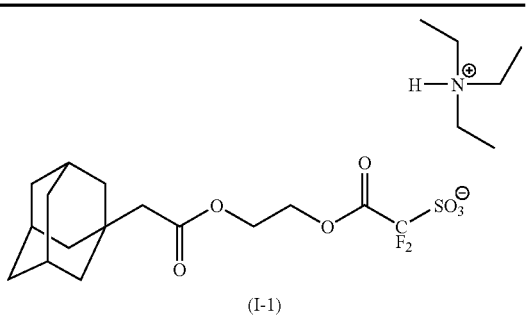<br>(I-1) |
| J-2 | ¹H-NMR (DMSO-d6, 400 MHz): δ (ppm) = 7.69-7.81 (m, 10H, Ar), 7.46 (s, 2H, Ar), 6.49-6.55 (m, 1H Vinyl), 4.02-4.27 (m, 6H, CH₂ + Vinyl), 2.36 (s, 6H, CH₃), 1.55-1.67 (m, 17H, adamantane + CH₂)<br>¹⁹F-NMR (DMSO-d6, 376 MHz): δ (ppm) = −77.7 | 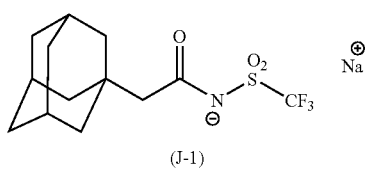<br>(J-1) |

| | Product | |
|---|---|---|
| Compound | Cation | Anion |
| H-2 | ↑ | ![structure with adamantane-C(O)-O-CH₂-CF₂-SO₃⁻] |
| I-2 | ↑ | ![structure with adamantane-CH₂-C(O)-O-CH₂-CH₂-O-C(O)-CF₂-SO₃⁻] |
| J-2 | ↑ | ![structure with adamantane-CH₂-C(O)-N⁻-SO₂-CF₃] |

TABLE 4

| Compound | NMR | Compound M⁺—X⁻ |
|---|---|---|
| K-2 | ¹H-NMR (DMSO-d6, 400 MHz): δ (ppm) = 7.69-7.81 (m, 10H, Ar), 7.46 (s, 2H, Ar), 6.49-6.55 (m, 1H, Vinyl), 4.02-4.27 (m, 6H, CH₂ + Vinyl), 2.77-2.81 (m, 1H, Cyclohexyl), 2.36 (s, 6H, CH₃), 2.04-2.08 (m, 2H, Cyclohexyl), 1.73-1.75 (m, 2H, Cyclohexyl), 1.56-1.59 (m, 1H, Cyclohexyl), 1.07-1.33 (m, 5H, Cyclohexyl),<br>¹⁹F-NMR (DMSO-d6, 376 MHz): δ (ppm) = −74.7 | ![cyclohexyl-SO₂-N⁻-SO₂-CF₃ Na⁺] (K-1) |
| L-2 | ¹H-NMR (DMSO-d6, 400 MHz): δ (ppm) = 7.69-7.81 (m, 10H, Ar), 7.46 (s, 2H, Ar), 6.49-6.55 (m, 1H, Vinyl), 4.02-4.27 (m, 6H, CH₂ + Vinyl), 2.36 (s, 6H, CH₃), 1.55-1.88 (m, 15H, Adamantane)<br>¹⁹F-NMR (DMSO-d6, 376 MHz): δ (ppm) = −74.5 | ![adamantane-C(O)-N⁻-SO₂-CF₃ Na⁺] (L-1) |

TABLE 4-continued

| | | | |
|---|---|---|---|
| M-2 | ¹H-NMR (DMSO-d6, 400 MHz): δ (ppm) = 7.69-7.81 (m, 10H, Ar), 7.46 (s, 2H, Ar), 6.49-6.55 (m, 1H, Vinyl), 4.02-4.27 (m, 6H, CH₂ + Vinyl), 2.36 (s, 6H, CH₃), 2.13 (m, 3H, adamantane) 1.99 (m, 6H, adamantane), 1.59 (s, 6H, adamantane) ¹⁹F-NMR (DMSO-d6, 376 MHz): δ (ppm) = −69.2, −76.0, −112.9 | 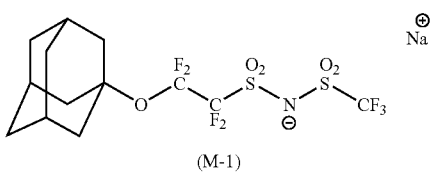 (M-1) | |

| | | Product | |
|---|---|---|---|
| Compound | Cation | | Anion |
| K-2 | ↑ | | cyclohexyl-S(O₂)-N⁻-S(O₂)-CF₃ |
| L-2 | ↑ | | adamantyl-C(O)-N⁻-S(O₂)-CF₃ |
| M-2 | ↑ | | adamantyl-O-CF₂-CF₂-S(O₂)-N⁻-S(O₂)-CF₃ |

TABLE 5

| Compound | NMR | Compound M⁺—X⁻ |
|---|---|---|
| N-2 | ¹H-NMR (DMSO-d6, 400 MHz): δ (ppm) = 7.51-7.96 (m, 17H, Ar), 7.46 (s, 2H, Ar), 6.49-6.55 (m, 1H, Vinyl), 5.20 (s, 2H, CH₂), 4.02-4.27 (m, 6H, CH₂ + Vinyl), 2.36 (s, 6H, CH₃) ¹⁹F-NMR (DMSO-d6, 376 MHz): δ (ppm) = −80.5, −113.7 | naphthyl-CH₂-O-CF₂-CF₂-SO₃⁻ Li⁺ (N-1) |
| O-2 | ¹H-NMR (DMSO-d6, 400 MHz): δ (ppm) = 7.69-7.81 (m, 10H, Ar), 7.46 (s, 2H, Ar), 6.49-6.55 (m, 1H, Vinyl), 4.02-4.27 (m, 6H, CH₂ + Vinyl), 2.36 (s, 6H, CH₃), 2.09 (s, 3H, adamantane) 1.96 (c, 6H, adamantane) 1.56 (s, 6H, adamantane) ¹⁹F-NMR (DMSO-d6, 376 MHz): δ (ppm) = −70.13, −113.36 | adamantyl-O-CF₂-CF₂-SO₃⁻ Li⁺ (O-1) |
| P-2 | ¹H-NMR (DMSO-d6, 400 MHz): δ (ppm) = 7.69-7.81 (m, 10H, Ar), 7.46 (s, 2H, Ar), 6.49-6.55 (m, 1H, Vinyl), 4.02-4.27 (m, 6H, CH₂ + Vinyl), 2.36 (s, 6H, CH₃) ¹⁹F-NMR (DMSO-d6, 376 MHz): δ (ppm) = −73.68 | Na⁺ (F₃CO₂S)(SO₂CF₃)C⁻(SO₂CF₃) (P-1) |

TABLE 5-continued

| Compound | Cation | Product Anion |
|---|---|---|
| N-2 | ↑ | naphthalene-CH₂-O-CF₂-CF₂-SO₃⁻ |
| O-2 | ↑ | adamantyl-O-CF₂-CF₂-SO₃⁻ |
| P-2 | ↑ | (F₃CO₂S)(F₃CO₂S)C⁻(SO₂CF₃) |

TABLE 6

| Compound | NMR | Compound M⁺—X⁻ | Product Cation | Product Anion |
|---|---|---|---|---|
| Q-2 | $^1$H-NMR (DMSO-d6, 400 MHz): δ (ppm) = 7.69–7.81 (m, 10H, Ar), 7.46 (s, 2H, Ar), 6.49–6.55 (m, 1H, Vinyl), 4.02–4.27 (m, 6H, CH₂ + Vinyl), 2.36 (s, 6H, CH₃) $^{19}$F-NMR (DMSO-d6, 376 MHz): δ (ppm) = −161.1, −149.7, −131.6, −76.2. | pentafluorophenyl-CH(SO₂CF₃)₂⁻ Na⁺ (Q-1) | ↑ | pentafluorophenyl-C⁻(SO₂CF₃)₂ |
| R-2 | $^1$H-NMR (DMSO-d6, 400 MHz): δ (ppm) = 7.69–7.81 (m, 10H, Ar), 7.46 (s, 2H, Ar), 6.49–6.55 (m, 1H, Vinyl), 4.02–4.27 (m, 6H, CH₂ + Vinyl), 2.86–2.90 (d, 1H, CH), 2.66–2.74 (m, 1H, CH), 2.35–2.38 (m, 7H, CH + CH₂), 2.17–2.24 (m, 1H, CH), 1.89–1.91 (t, 1H, CH), 1.74–1.89 (m, 2H, CH₂), 1.22–1.29 (m, 2H, CH₂), 1.03 (m, 3H, CH₃), 0.71 (s, 3H, CH₃) | camphorsulfonate Na⁺ (R-1) | ↑ | camphorsulfonate⁻ |
| X-2 | $^1$H-NMR (DMSO-d6, 400 MHz): δ (ppm) = 7.69–7.81 (m, 10H, Ar), 7.46 (s, 2H, Ar), 6.49–6.55 (m, 1H, Vinyl), 4.02–4.27 (m, 6H, CH₂ + Vinyl), 2.36 (s, 6H, CH₃) $^{19}$F-NMR (DMSO-d6, 376 MHz): δ (ppm) = −77.7, −111.9, −118.5, −122.8 | C₄F₉SO₃⁻ K⁺ (X-1) | ↑ | C₄F₉SO₃⁻ |

Synthesis Example 31

Synthesis of Compound (B-3)

5.00 g of polyp-hydroxystyrene) (Mw=7,200, Mw/Mn=1.09) and 18.75 g of 1,3-dioxolane were added to and dissolved in a three-necked flask in a nitrogen atmosphere. The resulting solution was cooled to 15° C., and 0.065 g of trifluoroacetic acid was added. Then, a 50 wt % dioxolane solution containing 1.70 of a compound Z was gradually added thereto in a dropwise manner. Subsequently, a reaction was effected at 30° C. for 3 hours, and the solution was cooled to 15° C. again. Then, a 16.7 wt % dioxolane solution containing 3.25 g of a compound B-2 was gradually added thereto in a dropwise manner. Thereafter, a reaction was effected at 30° C. for 12 hours, and 0.68 g of a 1% $NH_3$ aquesou solution was added thereto, followed by stirring for 10 minutes. The reaction solution was dropwise added to 521.23 g of pure water, and the obtained powder was collected by filtration and dried in vacuum, thereby obtaining 8.12 g of a polymer (B-3).

The obtained compound B-3 was analyzed by NMR.

$^1$H-NMR (Acetone, 400 MHz): δ(ppm)=7.25-8.81 (br peak, OH+CationArH), 6.11-7.18 (m peak, ArH), 5.41 (br peak, acetal-methine), 3.43-4.45 (br peak, protect group+methylene), 0.75-2.46 (br peak, protect group+main chain+CationCH$_3$+Adamantane)

$^{19}$F-NMR (DMSO-d6, 376 MHz): δ(ppm)=−106.61

From the results shown above, it was confirmed that the compound B-3 had a structure shown below. Further, the compositional ratio of the obtained polymer was calculated from the integral ratio of the acetal portion and the aromatic portion of each structural unit as determined by $^{13}$C-NMR. As a result, it was found that A:B:C=74.6:1.5.1:10.3. Further, as a result of a GPC measurement, it was found that Mw=1.48× 10$^4$ and Mw/Mn=1.08.

[Chemical Formula 112]

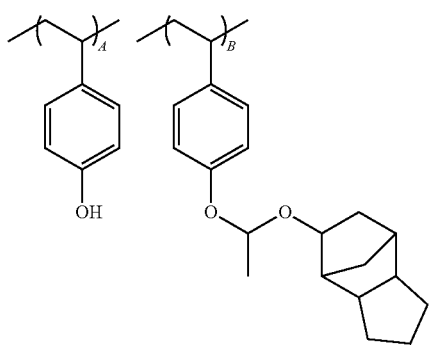

B-3

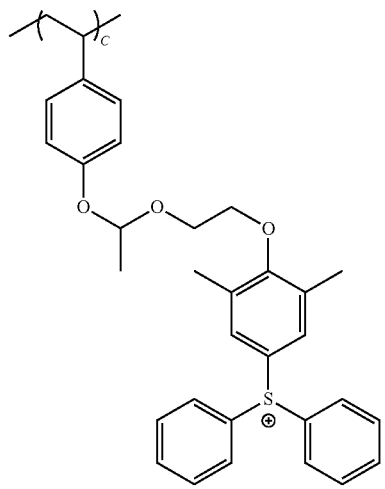

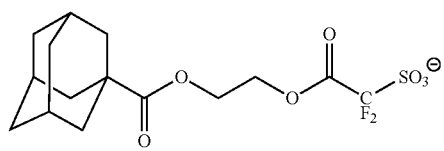

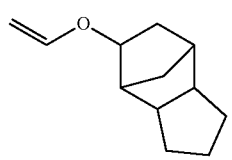

Z

Synthesis Examples 32 to 50

Synthesis of Polymeric Compounds (C-3) to (R-3) and (X-3) to (X-5)

In Synthesis Examples 32 to 48, the same procedure as in Synthesis Example 31 was performed, except that the compound (B-2) was respectively changed to the compounds (C-2) to (R-2) and (c-2) synthesized in Synthesis Examples 14 to 30. As a result, compounds (C-3) to (1-3) and (X-3) were obtained. In Synthesis Example 49, the same procedure as in Synthesis Example 31 was performed, except that the compound Z was changed to ethylvinylether (in an equimolar amount). In Synthesis Example 50, the same procedure as in Synthesis Example 31 was performed, except that the compound Z was changed to ethylvinylether (m, an equimolar amount), and the compound (B-2) was changed to the compound (X-2) (in an equimolar amount).

Each compound was analyzed by $^{13}$C-NMR, and the compositional ratio (molar ratio) was determined by the integral ratio of the acetal, portion and the aromatic portion. The results are shown below

[Chemical Formula 113]
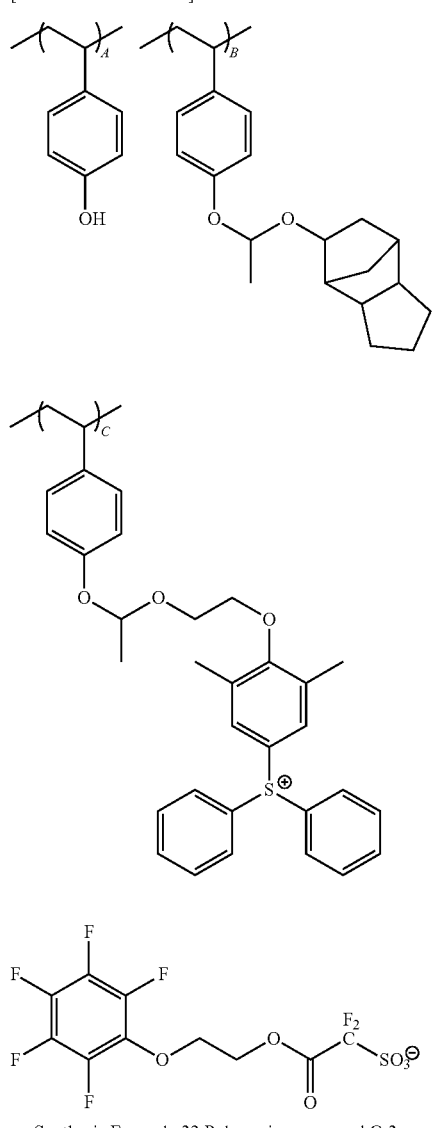
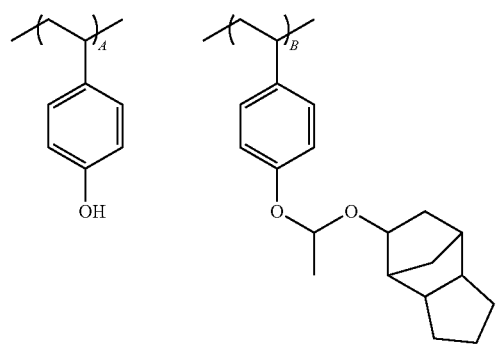
Synthesis Example 32 Polymeric compound C-3
[A:B:C=75.2:14.8:10.0, Mw=1.49×10$^4$, Mw/Mn=1.08]
[Chemical Formula 114]
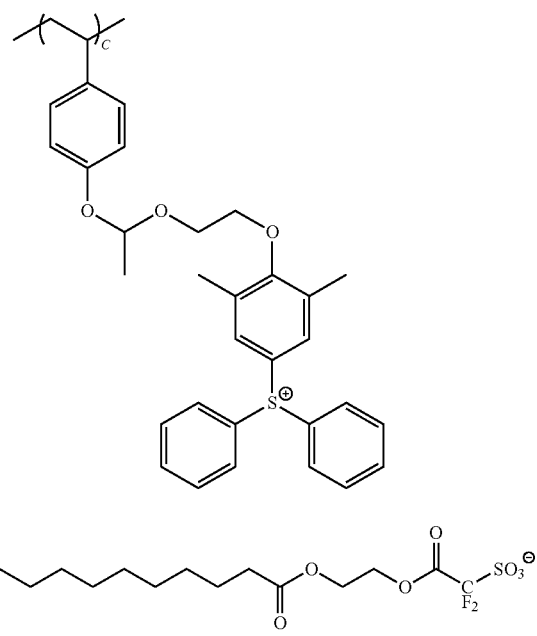
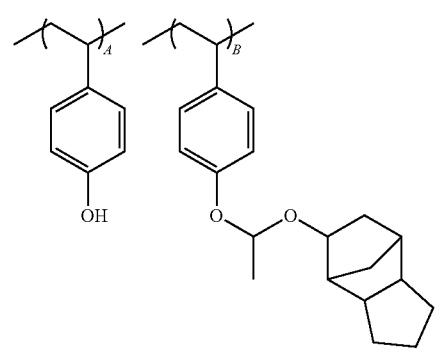
Synthesis Example 33 Polymeric compound D-3
[A:B:C=75.2:15.0:9.8, Mw=1.47×10$^4$, Mw/Mn=1.08]
[Chemical Formula 115]
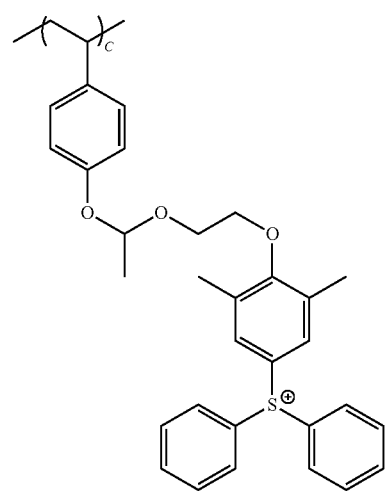

-continued
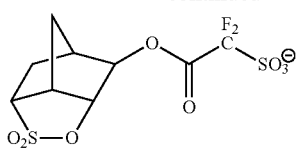
Synthesis Example 34 Polymeric compound E-3
[A:B:C=74.8:14.8:10.4, Mw=1.48×10⁴, Mw/Mn=1.08]
[Chemical Formula 116]
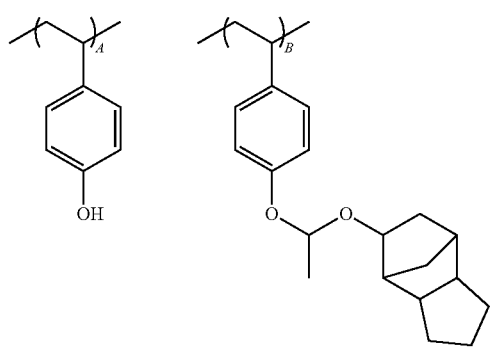
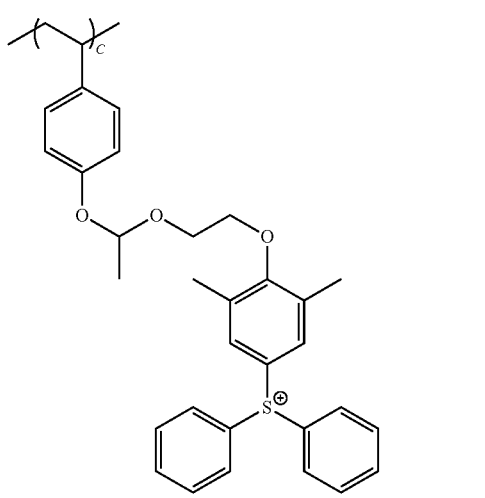
Synthesis Example 35 Polymeric compound F-3
[A:B:C=74.6:14.8:10.6, Mw=1.45×10⁴, Mw/Mn=1.08]
[Chemical Formula 117]
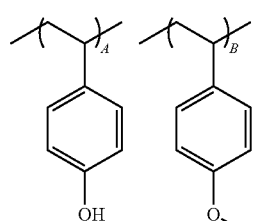
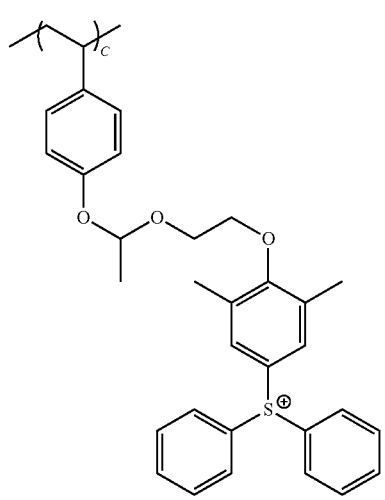
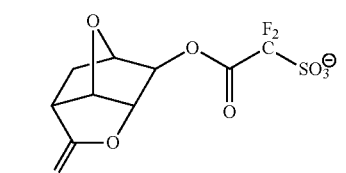
Synthesis Example 36 Polymeric compound G-3
[A:B:C=75.3:15.0:9.7, Mw=1.43×10⁴, Mw/Mn=1.08]
[Chemical Formula 118]
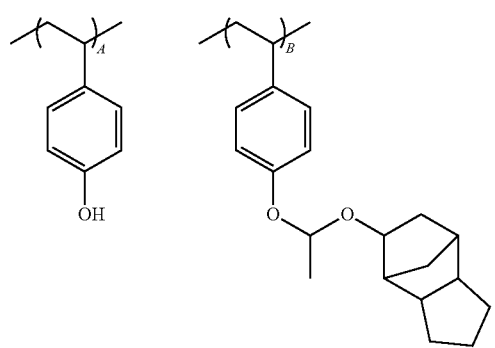

-continued
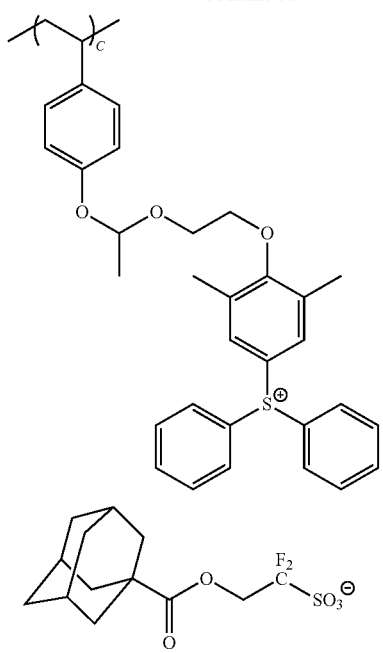
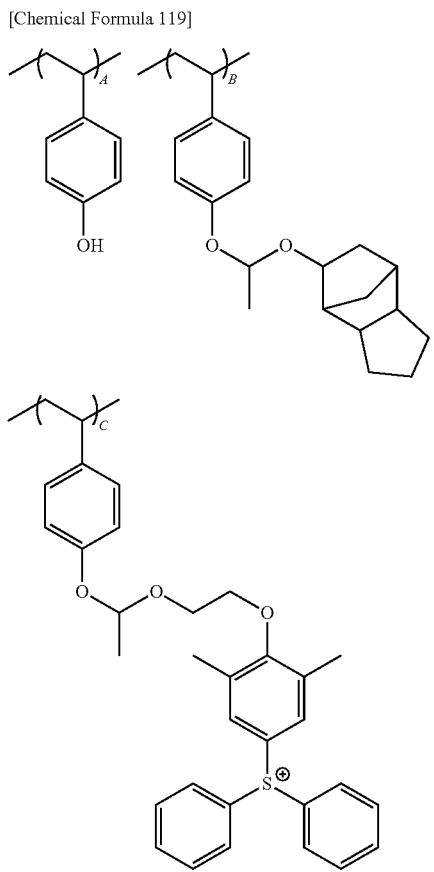
Synthesis Example 37 Polymeric compound H-3
[A:B:C=74.6:15.4:10.0, Mw=1.44×10⁴, Mw/Mn=1.08]
[Chemical Formula 119]
-continued
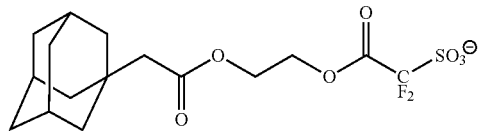
Synthesis Example 38 Polymeric compound I-3
[A:B:C=74.5:15.2:10.3, Mw=1.44×10⁴, Mw/Mn=1.08]
[Chemical Formula 120]
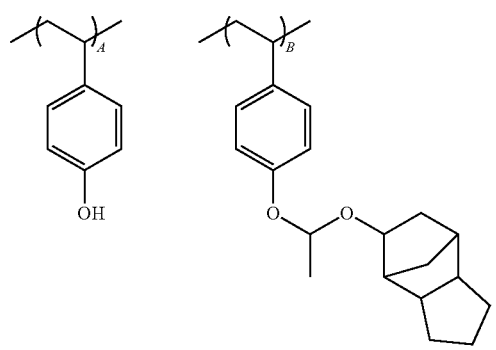
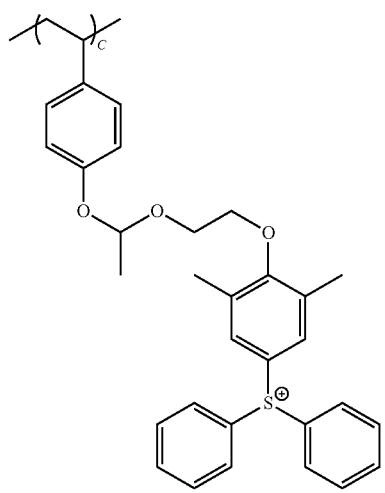
Synthesis Example 39 Polymeric compound J-3
[A:B:C=74.8:14.6:10.6, Mw=1.46×10⁴, Mw/Mn=1.08]

[Chemical Formula 121]
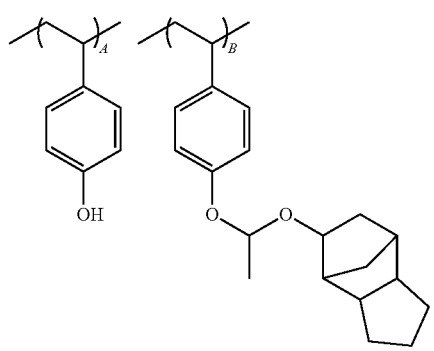
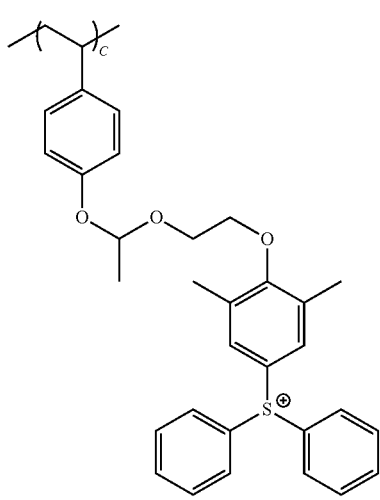
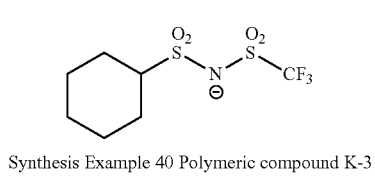
Synthesis Example 40 Polymeric compound K-3
[A:B:C=74.6:14.8:10.6, Mw=1.47×10$^4$, Mw/Mn=1.08]
[Chemical Formula 122]
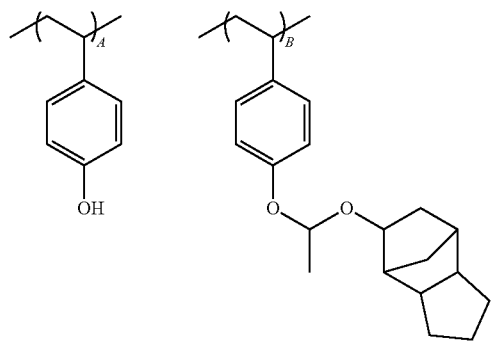
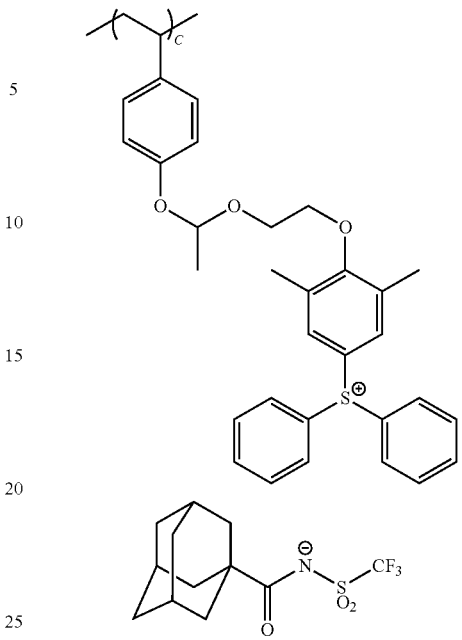
Synthesis Example 41 Polymeric compound L-3
[A:B:C=74, 4:15.2:10.4, Mw=1.44×10$^4$, Mw/Mn=1.08]
[Chemical Formula 123]
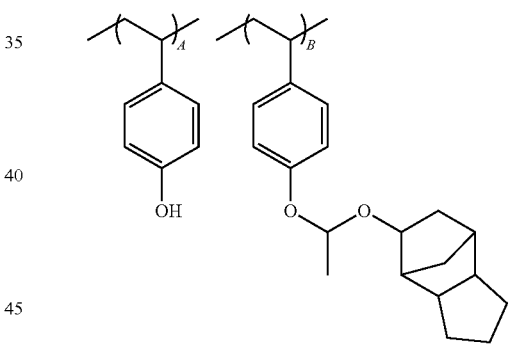
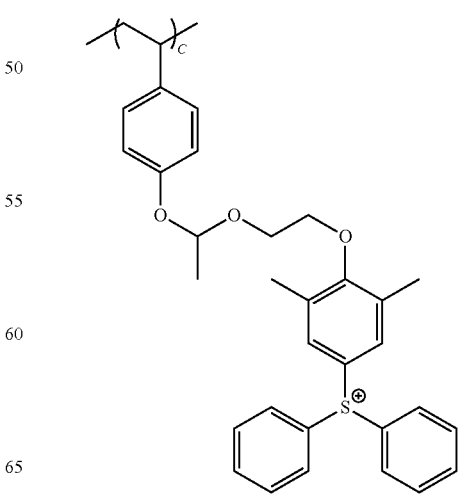

-continued
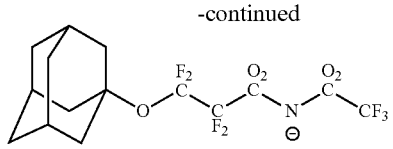
Synthesis Example 42 Polymeric compound M-3
[A:B:C=75.3:14.6:10.1, Mw=1.53×10$^4$, Mw/Mn=1.08]
[Chemical Formula 124]
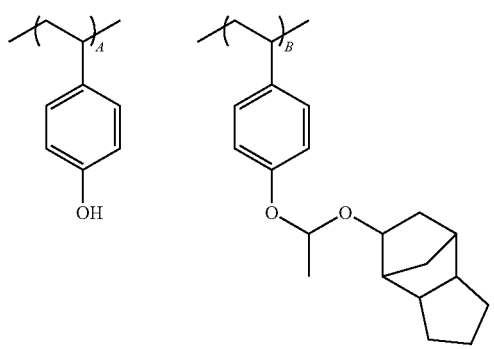
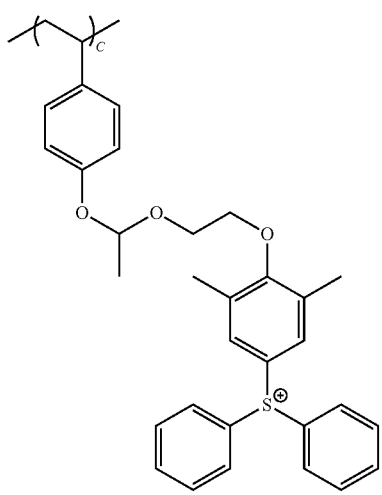
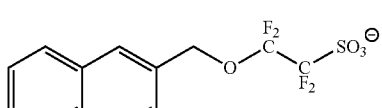
Synthesis Example 43 Polymeric compound N-3
[A:B:C=75.0:14.6:10.4, Mw=1.45×10$^4$, Mw/Mn=1.08]
[Chemical Formula 125]
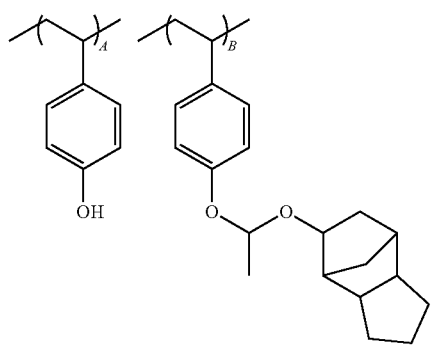
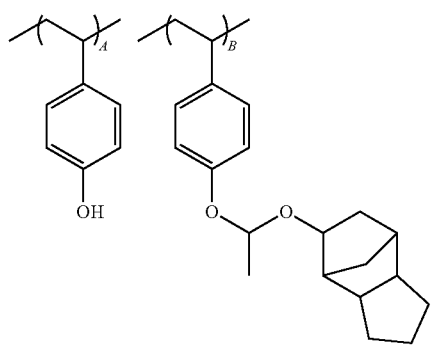
Synthesis Example 44 Polymeric compound O-3
[A:B:C=74.1:15.0:10.9, Mw=1.46×10$^4$, Mw/Mn=1.08]
[Chemical Formula 126]
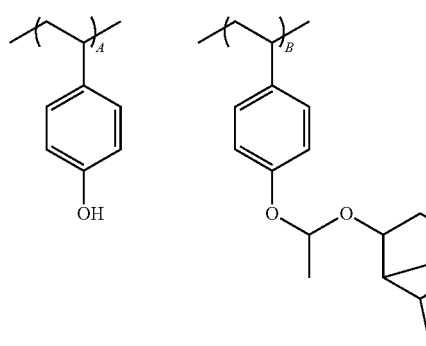

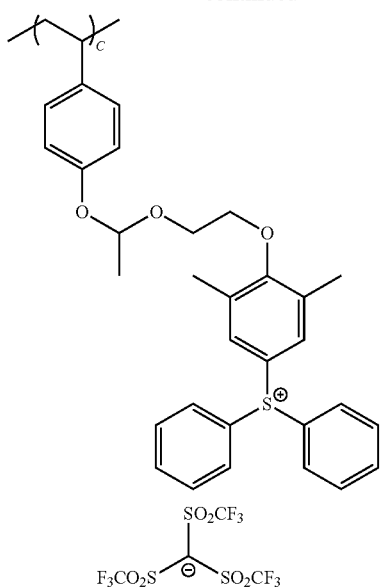
Synthesis Example 45 Polymeric compound P-3
[A:B:C=75.1:15.3:9.6, Mw=1.52×10⁴, Mw/Mn=1.08]
[Chemical Formula 127]
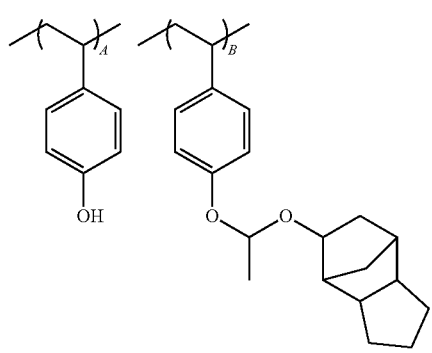
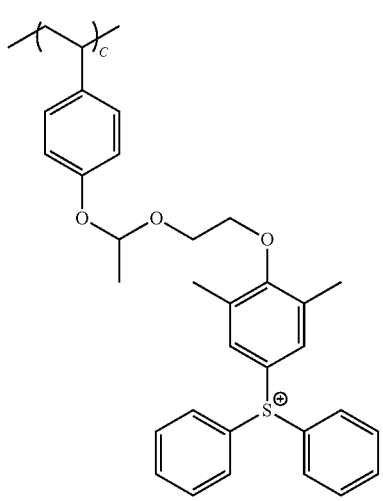
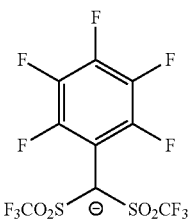
Synthesis Example 46 Polymeric compound Q-3
[A:B:C=74.5:15.5:10.0, Mw=1.55×10⁴, Mw/Mn=1.08]
[Chemical Formula 128]
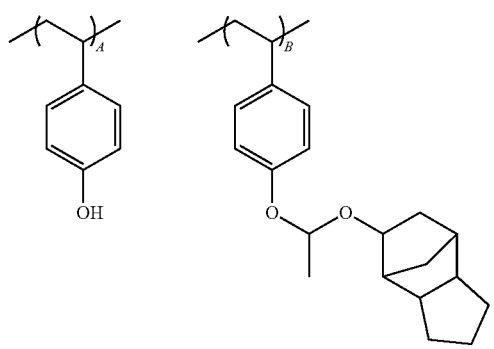
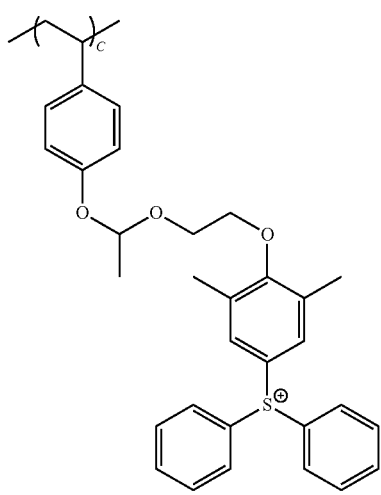
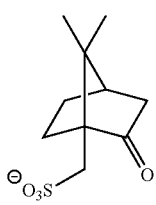
Synthesis Example 47 Polymeric compound R-3
[A:B:C=74.3:14.9:10.8, Mw=1.39×10⁴, Mw/Mn=1.08]

[Chemical Formula 129]
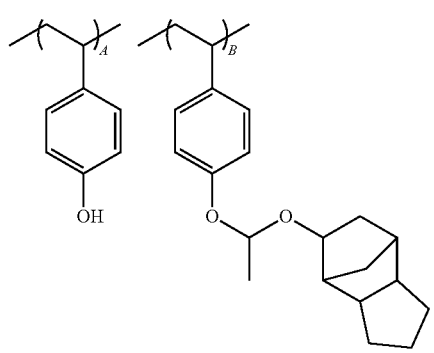
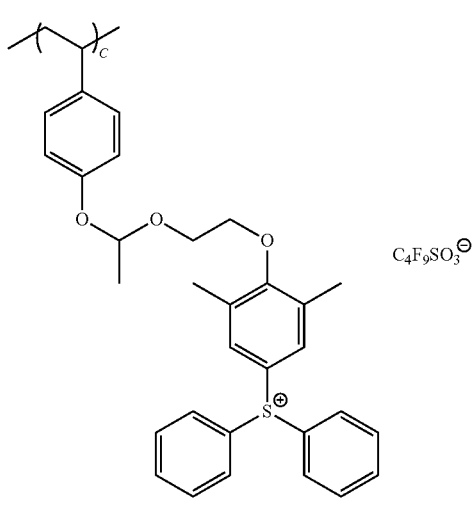
Synthesis Example 48 Polymeric compound X-3
[A:B:C=74.0:15.2; 10.8, Mw=1.44×10$^4$, Mw/Mn=1.08]
[Chemical Formula 130]
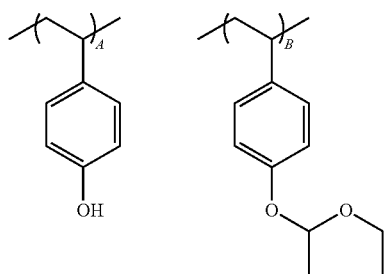
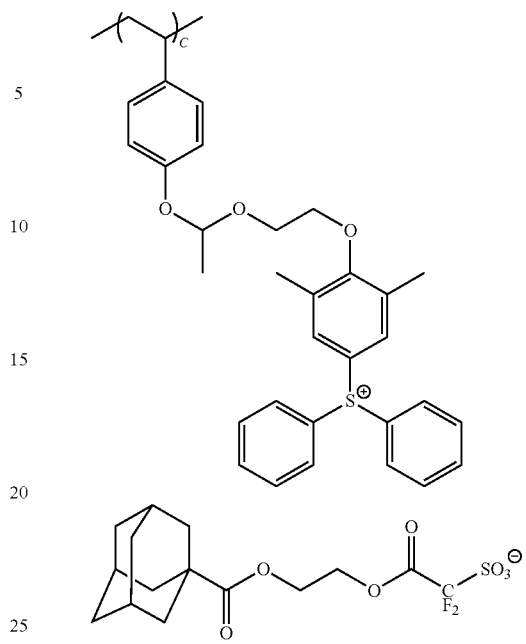
Synthesis Example 49 Polymeric compound X-4
[A:B:C=74.4:15.2:10.4, Mw=1.38×10$^4$, Mw/Mn=1.08]
[Chemical Formula 131]
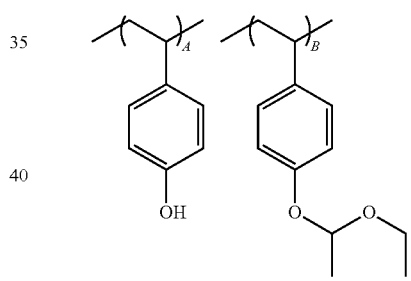
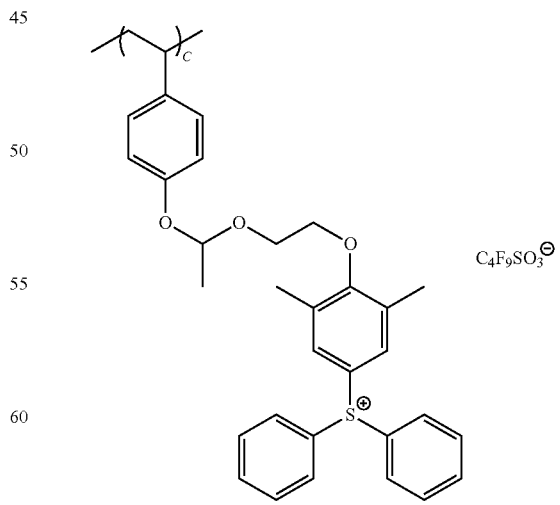
Synthesis Example 50 Polymeric compound X-5
[A:B:C=74.7:15.0:10.3, Mw=1.31×10$^4$, Mw/Mn=1.08]

Examples 1 to 4

Comparative Examples 1 to 3

Production of Resist Composition

The components shown in Table 7 were mixed together and dissolved to obtain positive resist compositions.

TABLE 7

| | Component (A) | Component (D) | Component (E) | Component (S) | |
|---|---|---|---|---|---|
| Ex. 1 | (A)-1 [100] | (D)-1 [1.46] | (E)-1 [0.57] | (S)-1 [3000] | (S)-2 [2000] |
| Ex. 2 | (A)-2 [100] | ↑ | ↑ | ↑ | ↑ |
| Ex. 3 | (A)-3 [100] | ↑ | ↑ | ↑ | ↑ |
| Ex. 4 | (A)-4 [100] | ↑ | ↑ | ↑ | ↑ |
| Comp. Ex. 1 | (A)-5 [100] | ↑ | ↑ | ↑ | ↑ |
| Comp. Ex. 2 | (A)-6 [100] | ↑ | ↑ | ↑ | ↑ |
| Comp. Ex. 3 | (A)-7 [100] | ↑ | ↑ | ↑ | ↑ |

In Table 7, the values in brackets [ ] indicate the amount (in terms of parts by weight) of the component added. Further, the reference characters in Table 7 indicate the following, and "↑" indicates that the component is the same as that in Example 1.

(A)-1: the aforementioned polymeric compound B-3
(A)-2: the aforementioned polymeric compound E-3
(A)-3: the aforementioned polymeric compound G-3
(A)-4: the aforementioned polymeric compound H-3
(A)-5: the aforementioned polymeric compound X-3
(A)-6: the aforementioned polymeric compound X-4
(A)-7: the aforementioned polymeric compound X-5
(D)-1: tri-n-octylamine
(E)-1: salicylic acid
(S)-1: PGMEA
(S)-2: PGME

[Formation of Resist Pattern, Resolution, LWR, Exposure Latitude]

Using a spinner, each positive resist composition of the above examples was applied to an 8-inch silicon wafer that had been treated with hexamethyldisilazane (HMDS) at 90° C. for 36 seconds, and the solution was then subjected to a PAD treatment at 100° C. for 60 seconds, thereby forming a resist film (film thickness: 50 nm).

Subsequently, the resist film was subjected to drawing (exposure) using an electron beam lithography apparatus HL-800D (VSB) (manufactured by Hitachi, Ltd.), followed by PEB treatment at 100° C. for 60 seconds. Then, development was conducted with a 2.38 wt % aqueous TMAH solution (product name: NMD-3; manufactured by Tokyo Ohka Kogyo Co., Ltd.), followed by rinsing with pure water for 15 seconds and post bake treatment (PDB) at 100° C. for 60 seconds, thereby forming a line and space pattern (LS pattern).

The optimum exposure dose ($\mu C/cm^2$; sensitivity) when a line pattern, size of 100 nm can be obtained using a mask size of 100 nm was determined. The results are shown in Table 8.

[Evaluation of Resolution]

The critical resolution for the above Eop was determined using a scanning electron microscope S-9220 (manufactured by Hitachi, Ltd.). When an LS pattern of 55 nm could be resolved, the resolution was evaluated as "A", and when an LS pattern of 55 nm could not be resolved, the resolution was evaluated as "B". The results are shown in Table 8.

[Evaluation of Line Width Roughness (LWR)]

With respect to each LS pattern formed with the above Eop, the line width at 7 points in the lengthwise direction of the line were measured using a measuring scanning electron microscope (SEM) (product name: S-9380, manufactured by Hitachi, Ltd.; acceleration voltage: 300V), and from the results, the value of 3 times the standard deviation (s) (i.e., 3s) was calculated as a yardstick of LWR (nm). The smaller this 3s value is, the lower the level of roughness of the line width, indicating that a pattern with a uniform width was obtained. The results are shown in Table 8.

[Evaluation of Thickness Loss]

Each 100 nm LS pattern formed with the above Eop was observed using a scanning electron microscope, and the thickness loss was evaluated with the following criteria. The results are shown in Table 8. "Residual film ratio" is the value of {(film thickness of unexposed portion after exposure and development)/(film thickness as measured after formation of resist film)}×100.

(Criteria)
A: residual film ratio of 90% or more (45 nm or more)
B: residual film ratio of less than 90%

[Evaluation of Exposure Latitude (EL)]

With respect to each LS pattern formed with the above Eop, the exposure latitude for achieving 100 nm±5% was determined using a measuring scanning electron microscope (product name: S-9380, manufactured by Hitachi, Ltd.; acceleration voltage: 300V). The results are shown in Table 8.

TABLE 8

| | Eop ($\mu C/cm^2$) | Resolution | LWR | Residual film ratio | Exposure latitude 100 nm ± 5% (%) |
|---|---|---|---|---|---|
| Ex. 1 | 35.3 | A | 9.2 | A | 7.6 |
| Ex. 2 | 45.8 | A | 11.4 | A | 8.8 |
| Ex. 3 | 45.4 | A | 10.8 | A | 7.0 |
| Ex. 4 | 41.1 | A | 10.2 | A | 8.1 |
| Comp. Ex. 1 | 31.2 | B | 12.1 | A | 5.9 |
| Comp. Ex. 2 | 26.7 | B | 12.2 | B | 6.7 |
| Comp. Ex. 3 | 24.9 | B | 12.8 | B | 5.2 |

From the results shown above, it was confirmed that the resist compositions of Examples 1 to 4 according to the present invention exhibited excellent lithography properties as compared to the resist compositions of Comparative Examples 1 to 3.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising a base component (A') which exhibits increased solubility in an alkali developing solution under action of acid and generates acid upon exposure, the base component (A') comprising a polymeric compound (A1') comprised of a structural unit (a5-1) represented by general formula (a5-1) shown below, a structural unit (a0-1) represented by general formula (a0-1) shown below and a structural unit (a0-2) that generates acid upon exposure, the structural unit (a0-2) containing a group represented by general formula (a0-2') shown below:

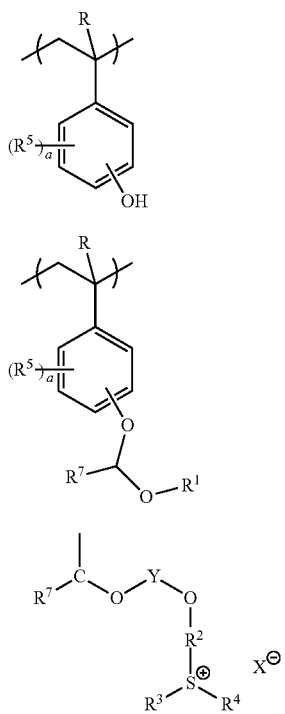

wherein each R independently represents a hydrogen atom, an alkyl group of 1 to 5 carbon atoms or a halogenated alkyl group of 1 to 5 carbon atoms; $R^1$ represents a hydrocarbon group of at least 10 carbon atoms; $R^2$ represents an arylene group which may have a substituent; each of $R^3$ and $R^4$ independently represents an organic group, wherein $R^3$ and $R^4$ may be mutually bonded to form a ring with the sulfur atom; $R^5$ represents a substituent; a represents an integer of 0 to 4; each $R^7$ independently represents a hydrogen atom or an alkyl group of 1 to 5 carbon atoms; Y represents a divalent linking group; and $X^-$ represents an anion moiety represented by any one of general formulas (1) to (5) shown below,

  (1)

  (2)

  (3)

  (4)

  (5)

wherein each $X^0$ independently represents a hydrocarbon group of 3 to 30 carbon atoms which may have a substituent; $Q^1$ represents a divalent linking group containing a carbonyl group; each p independently represents an integer of 1 to 3; $Q^2$ represents a single bond or an alkylene group; $X^{10}$ represents a hydrocarbon group of 1 to 30 carbon atoms which may have a substituent; $Q^3$ represents a single bond or a divalent linking group; $Y^{10}$ represents —C(=O)— or —SO$_2$—; $Y^{11}$ represents an alkyl group of 1 to 10 carbon atoms which may have a substituent or a fluorinated alkyl group of 1 to 10 carbon atoms which may have a substituent; $A^-$ represents a carboanion; $Y^{12}$ represents a cyclic alkyl group of 4 to 20 carbon atoms which may have an oxygen atom (=O) as a substituent; and q represents 0 or 1.

2. The positive resist composition according to claim 1, wherein the structural unit (a0-2) is represented by general formula (a0-2) shown below:

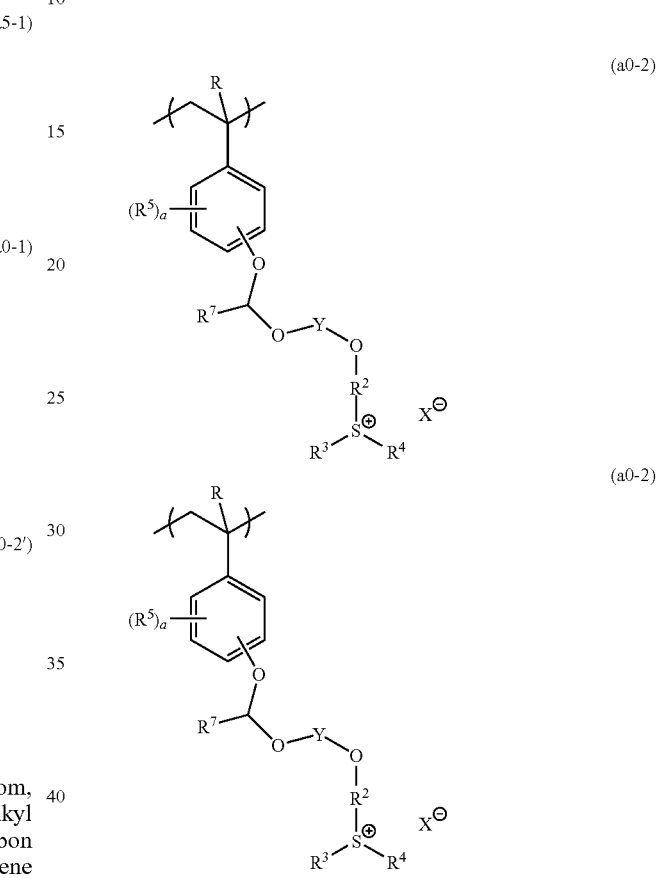

wherein R represents a hydrogen atom, an alkyl group of 1 to 5 carbon atoms or a halogenated alkyl group of 1 to 5 carbon atoms; $R^2$ represents an arylene group which may have a substituent; each of $R^3$ and $R^4$ independently represents an organic group, wherein $R^3$ and $R^4$ may be mutually bonded to form a ring with the sulfur atom; $R^5$ represents a substituent; a represents an integer of 0 to 4; each $R^7$ independently represents a hydrogen atom or an alkyl group of 1 to 5 carbon atoms; Y represents a divalent linking group; and $X^-$ represents an anion moiety represented by any one of the aforementioned general formulas (1) to (5).

3. The positive resist composition according to claim 1, which further comprises a nitrogen-containing organic compound (D).

4. A method of forming a resist pattern comprising:
applying a positive resist composition of claim 1 to a substrate to form a resist film,
conducting exposure of the resist film, and
alkali developing the resist film to form a resist pattern.

5. A polymeric compound comprising a structural unit (a5-1) represented by general formula (a5-1) shown below, a structural unit (a0-1) represented by general formula (a0-1) shown below and a structural unit (a0-2) that generates acid upon exposure, the structural unit (a0-2) containing a group represented by general formula (a0-2') shown below:

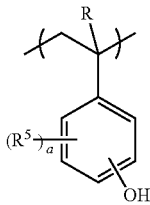
(a5-1)

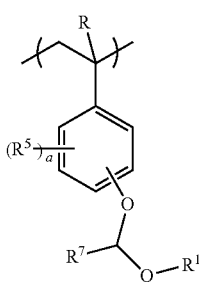
(a0-1)

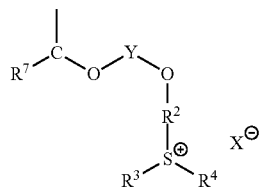
(a0-2')

wherein each R independently represents a hydrogen atom, an alkyl group of 1 to 5 carbon atoms or a halogenated alkyl group of 1 to 5 carbon atoms; $R^1$ represents a hydrocarbon group of at least 10 carbon atoms; $R^2$ represents an arylene group which may have a substituent; each of $R^3$ and $R^4$ independently represents an organic group, wherein $R^3$ and $R^4$ may be mutually bonded to form a ring with the sulfur atom; $R^5$ represents a substituent; a represents an integer of 0 to 4; each $R^7$ independently represents a hydrogen atom or an alkyl group of 1 to 5 carbon atoms; Y represents a divalent linking group; and $X^-$ represents an anion moiety represented by any one of general formulas (1) to (5) shown below,

 (1)

 (2)

 (3)

$A^\ominus$ (4)

 (5)

wherein each $X^0$ independently represents a hydrocarbon group of 3 to 30 carbon atoms which may have a substituent; $Q^1$ represents a divalent linking group containing a carbonyl group; each p independently represents an integer of 1 to 3; $Q^2$ represents a single bond or an alkylene group; $X^{10}$ represents a hydrocarbon group of 1 to 30 carbon atoms which may have a substituent; $Q^3$ represents a single bond or a divalent linking group; $Y^{10}$ represents —C(=O)— or —SO$_2$—; $Y^{11}$ represents an alkyl group of 1 to 10 carbon atoms which may have a substituent or a fluorinated alkyl group of 1 to 10 carbon atoms which may have a substituent; $A^-$ represents a carboanion; $Y^{12}$ represents a cyclic alkyl group of 4 to 20 carbon atoms which may have an oxygen atom (=O) as a substituent; and q represents 0 or 1.

6. The polymeric compound according to claim 5, wherein the structural unit (a0-2) is represented by general formula (a0-2) shown below:

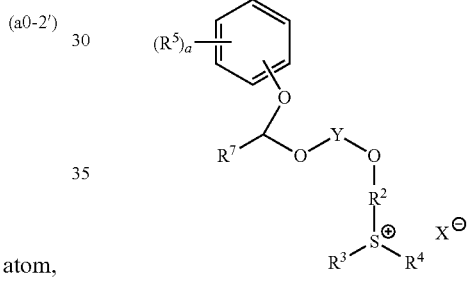
(a0-2)

wherein R represents a hydrogen atom, an alkyl group of 1 to 5 carbon atoms or a halogenated alkyl group of 1 to 5 carbon atoms; $R^2$ represents an arylene group which may have a substituent; each of $R^3$ and $R^4$ independently represents an organic group, wherein $R^3$ and $R^4$ may be mutually bonded to form a ring with the sulfur atom; $R^5$ represents a substituent; a represents an integer of 0 to 4; each $R^7$ independently represents a hydrogen atom or an alkyl group of 1 to 5 carbon atoms; Y represents a divalent linking group; and $X^-$ represents an anion moiety represented by any one of the aforementioned general formulas (1) to (5).

* * * * *

UNITED STATES PATENT AND TRADEMARK OFFICE
CERTIFICATE OF CORRECTION

PATENT NO. : 8,298,748 B2
APPLICATION NO. : 12/781540
DATED : October 30, 2012
INVENTOR(S) : Takehiro Seshimo et al.

It is certified that error appears in the above-identified patent and that said Letters Patent is hereby corrected as shown below:

On the Title Page (Item 57) Abstract, Line 19 (Approx.), After "$A^{\ominus}$" insert --(4)--.

In the Specifications:

At Column 1, Line 31, Change "held" to --field--.

At Column 1, Line 36, Change "and" to --and i-line--.

At Column 1, Line 67, Change "Kg" to --KrF--.

At Column 2, Line 19, Change "(rneth)acrylate ester" to --(meth)acrylate ester--.

At Column 3, Line 3, Change "BUY" to --EUV--.

At Column 4, Line 19 (Approx.),

Change "$X^0\text{-}Q^2\text{-}O\text{-}(CF_2)\text{-}SO_3^{\ominus}$"

to --$X^0\text{-}Q^2\text{-}O\text{-}(CF_2)_p\text{-}SO_3^{\ominus}$--.

At Column 7, Line 5, Change "used" to --used.--.

At Column 8, Line 2, Change "$R^S$" to --$R^5$--.

At Column 11, Line 19, Change "$R^b$" to --$R^B$--.

At Column 11, Line 26 (Approx.), Change "mmol" to --mol--.

Signed and Sealed this
Sixth Day of August, 2013

Teresa Stanek Rea
*Acting Director of the United States Patent and Trademark Office*

CERTIFICATE OF CORRECTION (continued)
U.S. Pat. No. 8,298,748 B2

At Column 11, Line 28 (Approx.), Change "mmol" to --mol--.

At Column 13, Line 23, Before "—NR$^{04}$—" delete "—NH—,".

At Column 19, Line 65, After "—C(=O)—O—," insert -- —C(=O)—,.

At Column 22, Line 31 (Approx.), Change "(CH$_{12}$" to --(CH$_2$--.

At Column 23, Line 16 (Approx.), Change "pyrrazole," to --pyrazole,--.

At Column 24, Line 48, Change "(—O—C(=O)—O—)," to --(—O—C(=O)—O—);--.

At Column 25, Line 65, Change "preferable" to --preferable.--.

At Column 28, Line 1 (Approx.), Change "—COOK"" to -- —COOR"--.

At Column 28, Line 27-32 (Approx.),

Change "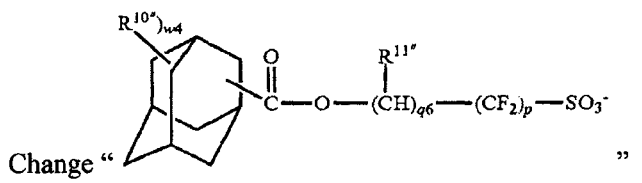"

to --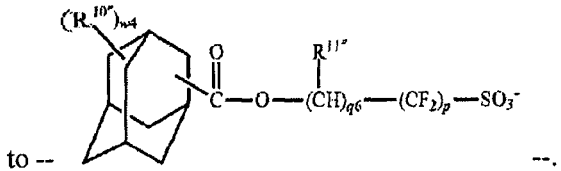--.

At Column 28, Line 36, Change "R$^{11'''}$" to --R$^{10''}$--.

At Column 30, Line 57, Change "Q$^{2'}$" to --Q$^3$--.

At Column 31, Line 10-11, Change "—C(CH₃)(CH₂CH₂CH₂)—," to --—C(CH₃)(CH₂CH₂CH₃)—,--.

At Column 31, Line 30, Before "—CH₂CF₂—," insert --—CHF—,--.

At Column 32, Lines 58-61 (Approx.),

Change "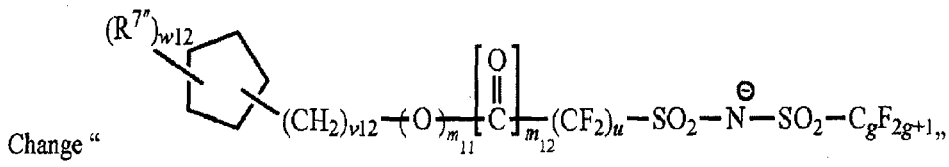

to --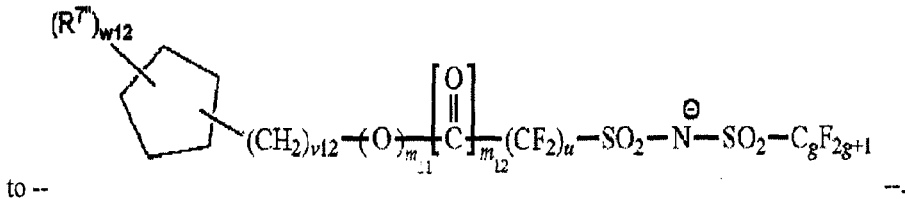--.

At Column 51, Line 62 (Approx.), Change "sultanate" to --sulfonate--.

At Column 52, Lines 65-67, Below "by", delete "R⁷ include the same . . . a methyl group is preferable." and insert the same on Col. 52, Line 64 as a continuation of the same Paragraph.

At Column 53, Line 36, Change "Tex" to --In--.

At Column 54, Line 51 (Approx.), Change "below" to --below.--.

At Column 56, Line 59, Change "tent-butyl" to --tert-butyl--.

At Column 56, Line 63, Change "R¹⁶," to --R¹⁶,--.

CERTIFICATE OF CORRECTION (continued)
U.S. Pat. No. 8,298,748 B2

At Column 57, Line 44 (Approx.), Change "below" to --below.--.

At Column 58, Line 37 (Approx.), Change "used" to --used.--.

At Column 62, Line 4 (Approx.), Change "Yin" to --Y in--.

At Column 69, Line 21 (Approx.), Change "(a1-1-8)" to --(a1-2-8)--.

At Column 82, Lines 3-20 (Approx.),

Change "
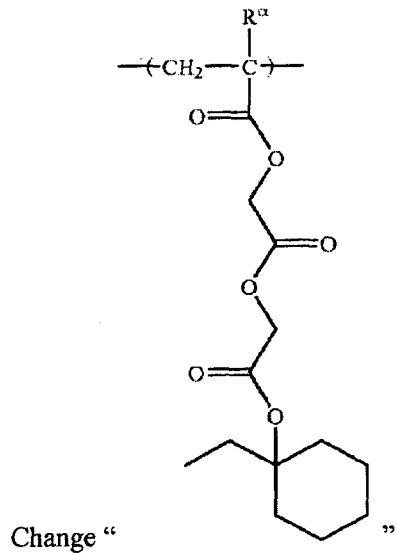
"

to --
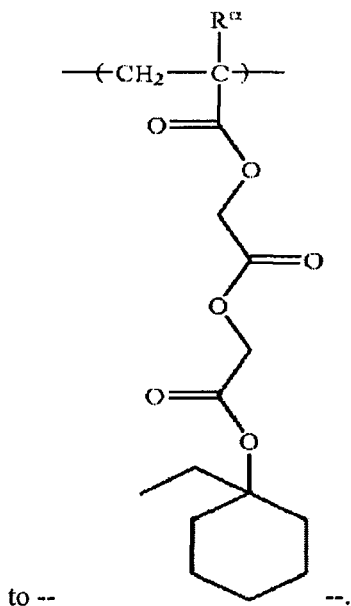
--.

At Column 82, Line 43 (Approx.),

CERTIFICATE OF CORRECTION (continued)
U.S. Pat. No. 8,298,748 B2

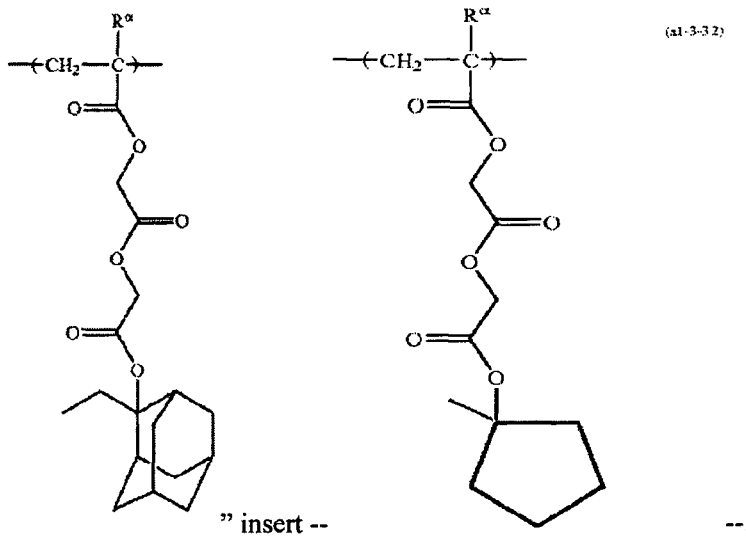

Below " [structure] " insert -- [structure] --.

At Column 91, Line 42 (Approx.), Change "β-propiolatone," to --β-propiolactone--.

At Column 92, Line 67, Change "tent-butyl" to --tert-butyl--.

At Column 93, Line 4, Change "group" to --group.--.

At Column 93, Line 5, Change "X⁻" to --R'--.

At Column 94, Line 12 (Approx.), Change "(a1-2-1-4)" to --(a2-1-4)--.

At Column 94, Line 22 (Approx.), Change "(a1-2-1-5)" to --(a2-1-5)--.

At Column 94, Line 32 (Approx.), Change "(a1-2-1-6)" to --(a2-1-6)--.

At Column 106, Line 66, Change "l" to --I--.

CERTIFICATE OF CORRECTION (continued)
U.S. Pat. No. 8,298,748 B2

At Column 107, Line 13, Change "I is" to --I is--.

At Column 107, Line 20, Change "In" to --in--.

At Column 109, Line 40, Change "other" to --other.--.

At Column 109, Line 55, Change "weight" to --weight.--.

At Column 110, Line 30-31 (Approx.), Change "poly(bis-sulfonyl)diazomethaues;" to --poly(bis-sulfonyl)diazomethanes;--.

At Column 110, Line 55, Change "$R^{5'''}$" to --$R^{5''}$--.

At Column 110, Line 64, Before "are" insert --$R^{3''}$--.

At Column 113, Line 16-26 (Approx.),

Change " 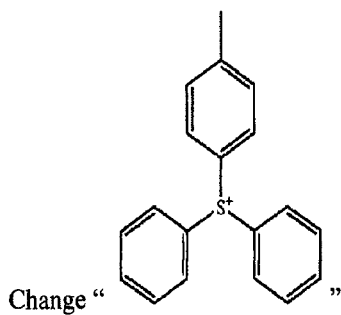 "

to -- 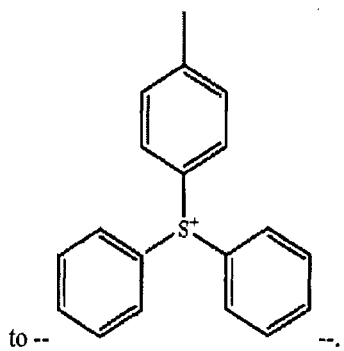 --.

At Column 116, Line 27, Change "trifluoromethanesulforate," to --trifluoromethanesulfonate,--.

At Column 116, Line 28, Change "nonathorobutanesulfonate;" to --nonafluorobutanesulfonate;--.

At Column 116, Line 54, Change "1-phenyltetzahydrothiopyranium" to --1-phenyltetrahydrothiopyranium--.

At Column 117, Line 43, Before "and Z''" insert --Y"--.

At Column 120, Line 4, Change "sultanate" to --sulfonate--.

At Column 120, Line 36, Change "1." to --1--.

At Column 120, Line 51, Change "an," to --an--.

At Column 121, Line 20 (Approx.), Change "chlorobenzenesulfonyloxylmino)" to --chlorobenzenesulfonyloxyimino)--.

At Column 121, Line 32 (Approx.), Change "[(dodecylbenzenesulfonyloxyhimino)" to --[(dodecylbenzenesulfonyloxyimino)--.

CERTIFICATE OF CORRECTION (continued)
U.S. Pat. No. 8,298,748 B2

At Column 121, Line 50 (Approx.), Change "butylsulfonyloxylmino)" to --butylsulfonyloxyimino)--.

At Column 121, Line 63 (Approx.), Change "20041074242A2" to --2004/074242A2--.

At Column 123, Line 47, Change "tris {2" to --tris{2--.

At Column 123, Line 49, Change "tris {2-(1" to --tris{2-(1--.

At Column 123, Line 49, Change "tris {2" to --tris{2--.

At Column 125, Line 14, Change "ha" to --in--.

At Column 125, Line 19, Change "FGMEA:PGME" to --PGMEA:PGME--.

At Column 125, Line 49, Change "BUY" to --EUV--.

At Column 126, Line 18, Change "fanning" to --forming--.

At Column 127, Line 9 (Approx.), Change "at" to --as--.

At Column 127, Line 30 (Approx.), Change "perfluroalkyl" to --perfluoroalkyl--.

At Column 127, Line 58 (Approx.), Change "(a 5-1)" to --(a5-1)--.

At Column 128, Line 2 (Approx.), Change "(a 0-1)" to --(a0-1)--.

At Column 128, Line 13 (Approx.), Change "(a 0-2')" to --(a0-2')--.

At Column 128, Line 22 (Approx.) Change "each," to --each--.

At Column 128, Line 56, Change "Y" to --$Y^{12}$--.

At Column 129, Line 13 (Approx.), Change "(1-1-04)" to --(1-1-0-1)--.

CERTIFICATE OF CORRECTION (continued)
U.S. Pat. No. 8,298,748 B2

At Column 130, Line 66, Change "(DHAP)," to --(DMAP),--.

At Column 131, Line 3, After "tetrabutylammonium" insert --ion.--.

At Column 131, Line 13 (Approx.), Change "each," to --each--.

At Column 132, Line 32 (Approx.), Change "fouuula" to --formula--.

At Column 133, Line 15, (Approx.), Before "are" delete "if".

At Column 133, Line 25, Change "(1-1-04)" to --(1-1-0-1)--.

At Column 134, Line 10 (Approx.), Before "p and" insert --$Q^{3'}$,--.

At Column 135, Line 20, Before "—NH—" insert -----C(=O)—NH—,"--.

At Column 135, Line 21, Change "am" to --an--.

At Column 135, Line 67, Change "10," to --10.--.

At Column 136, Line 19, Change "alkyl" to --allyl--.

At Column 137, Line 53, Change "(1-2-04121)." to --(1-2-0-1121).--.

At Column 137, Line 60, Change "an," to --an--.

At Column 138, Line 19, Change "can," to --can--.

At Column 138, Line 27, After "such as" insert --an--.

At Column 141, Line 31, Change "chloroform," to --chloroform--.

At Column 142, Line 19, Change "e'''" to --$R^{10}$'''--.

CERTIFICATE OF CORRECTION (continued)
U.S. Pat. No. 8,298,748 B2

At Column 144, Line 2, Change "can," to --can--.

At Column 144, Line 18 (Approx.), Change "can," to --can--.

At Column 145, Line 5, Change "(3-04)." to --(3-0-1).--.

At Column 145, Line 48, Change "tent-butylmethylether" to --tert-butylmethylether--.

At Column 147, Lines 61-67 After "(5-0-1).", delete "After the reaction, the compound (5-0) within the ... may be used in combination." and insert the same on Col. 147, Line 62 as a new Paragraph.

At Column 148, Line 44, Change "in the" to --In the--.

At Column 149, Line 6 (Approx.), Change "1HVinyl)," to --1H, Vinyl),--.

At Column 153, Line 40-44 (Approx.),

Change " 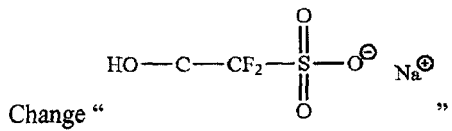 "

to -- 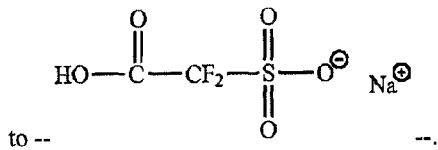 --.

At Column 155, Line 3, Change "H$^e$)," to --H$^e$),--.

At Column 157, Line 22 (Approx.), Change "3.08 (m," to --3.08 (q,--.

At Column 158, Line 61 (Approx.), Change "H$^e$)," to --H$^e$),--.

At Column 160, Lines 39-40 (Approx.), Change "sultanate." to --sulfonate.--.

At Column 160, Line 64 (Approx.), Change "(0-1)" to --(O-1)--.

At Column 173, Line 6 (Approx.), Change "polyp-hydroxystyrene)" to --poly(p-hydroxystyrene)--.

At Column 173, Line 21 (Approx.), Change "aquesou" to --aqueous--.

At Column 173, Line 31 (Approx.), Change "(m peak, ArH)," to --(br peak, ArH),--.

At Column 174, Line 51 (Approx.), Change "(1-3)" to --(R-3)--.

At Column 174, Line 59 (Approx.), Change "(m," to --(in--.

At Column 174, Line 66 (Approx.), Change "below" to --below.--.

At Column 182, Line 29 (Approx.), Change "74, 4" to --74.4--.

At Column 183, Lines 2-7 (Approx.),

Change " 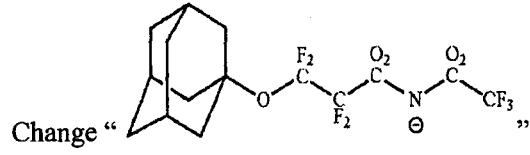 "

to -- 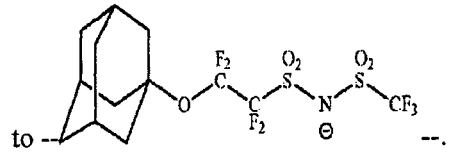 --.

At Column 187, Line 49 (Approx.), Change "15.2; 10.8," to --15.2:10.8,--.

At Column 189, Line 7, Change "shown," to --shown--.

At Column 189, Line 54, Change "PEB" to --PDB--.

At Column 189, Line 59 (Approx.), Change "fanning" to --forming--.

CERTIFICATE OF CORRECTION (continued)
U.S. Pat. No. 8,298,748 B2

In the Claims:

At Column 191, Line 54 (Approx.), In Claim 1, change "$X^\ominus-Q^2-O\text{-}(CF_2)\text{-}SO_3^\ominus$"

to --$X^\ominus-Q^2-O\text{-}(CF_2)_p\text{-}SO_3^\ominus$ --.

At Column 192, Lines 28-43 (Approx.),

In Claim 2, below " 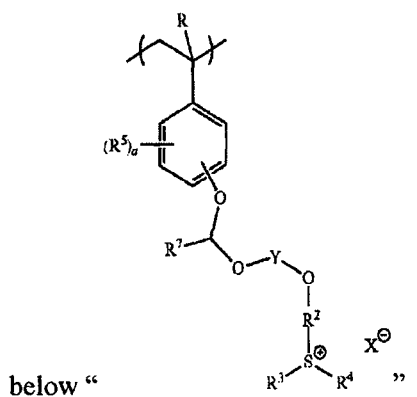 "

delete " 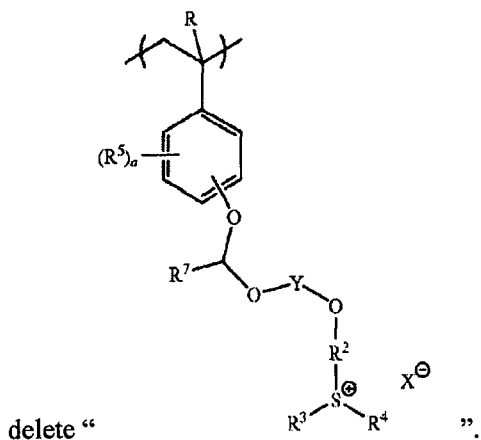 ".